US010962579B2

(12) United States Patent
Homma et al.

(10) Patent No.: US 10,962,579 B2
(45) Date of Patent: Mar. 30, 2021

(54) WIRELESS POWER TRANSMISSION DEVICE AND POWER TRANSMISSION SYSTEM TO AERIAL MOVING BODY

(71) Applicant: Mitsubishi Electric Corporation, Chiyoda-ku (JP)

(72) Inventors: Yukihiro Homma, Chiyoda-ku (JP); Maho Sato, Chiyoda-ku (JP); Manabu Sawa, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/938,076

(22) Filed: Jul. 24, 2020

(65) Prior Publication Data
US 2020/0355734 A1 Nov. 12, 2020

Related U.S. Application Data

(62) Division of application No. 16/615,181, filed as application No. PCT/JP2018/015092 on Apr. 10, 2018, now Pat. No. 10,782,333.

(30) Foreign Application Priority Data

May 29, 2017 (JP) .................................. 2017-105269

(51) Int. Cl.
*G01R 29/10* (2006.01)
*B64C 39/02* (2006.01)
(Continued)

(52) U.S. Cl.
CPC .............. *G01R 29/10* (2013.01); *B64C 13/20* (2013.01); *B64C 39/024* (2013.01); *B64F 3/02* (2013.01);
(Continued)

(58) Field of Classification Search
CPC .......... G01R 29/10; H02J 50/20; H02J 50/23; B64C 13/20; B64C 39/024;
(Continued)

(56) References Cited

U.S. PATENT DOCUMENTS

2008/0265087 A1 10/2008 Quinn et al.
2009/0167605 A1 7/2009 Haskell
(Continued)

FOREIGN PATENT DOCUMENTS

DE 102011015917 A1 10/2012
JP 2-151104 A 6/1990
(Continued)

OTHER PUBLICATIONS

Makino, K., et al., "Development and Demonstration of the High-Precision Beam Steering Controller for Microwave Power Transmission, which takes account of applying to SSPS (Space Solar Power Systems)", Institute of Electronics, Information and Communication Engineers, IEICE Technical Report, SANE 2015-22, Jun. 2015, pp. 37-42 (with English abstract).

(Continued)

*Primary Examiner* — Robert L Deberadinis
(74) *Attorney, Agent, or Firm* — Oblon, McClelland, Maier & Neustadt, L.L.P.

(57) ABSTRACT

A wireless power transmission device includes: a power transmission antenna; a radiation direction determiner; an orientation direction changer; and a transmission signal generator. The power transmission antenna is a phased array antenna including: a plurality of element antennas to radiate radio waves; and a plurality of element modules, each of the plurality of element modules including a phase shifter to change a phase of a transmission signal and an amplifier to amplify the transmission signal from the power transmission antenna. A phase offset value for the phase shifter included (Continued)

in each of the plurality of element modules is calculated by performing a REV (rotating element electric field vector) method using an aerial moving body hovering over the power transmission antenna and mounting a measurement antenna to receive a radio wave and a radio wave measurer to measure received radio wave data including an amplitude of the radio wave received by the measurement antenna.

21 Claims, 52 Drawing Sheets

(51) Int. Cl.
| | |
|---|---|
| *H01Q 3/26* | (2006.01) |
| *H02J 50/23* | (2016.01) |
| *B64C 13/20* | (2006.01) |
| *H01Q 23/00* | (2006.01) |
| *H02J 50/20* | (2016.01) |
| *G01S 13/32* | (2006.01) |
| *B64F 3/02* | (2006.01) |

(52) U.S. Cl.
CPC .............. *G01S 13/32* (2013.01); *H01Q 3/267* (2013.01); *H01Q 23/00* (2013.01); *H02J 50/20* (2016.02); *H02J 50/23* (2016.02); *B64C 2201/066* (2013.01)

(58) Field of Classification Search
CPC ...... B64C 2201/066; B64F 3/02; G01S 13/32; H01Q 3/267; H01Q 23/00
See application file for complete search history.

(56) References Cited

U.S. PATENT DOCUMENTS

| | | | |
|---|---|---|---|
| 2013/0285603 | A1 | 10/2013 | Zeinstra et al. |
| 2015/0280495 | A1 | 10/2015 | Homma et al. |
| 2017/0081043 | A1 | 3/2017 | Jones |
| 2017/0244270 | A1 | 8/2017 | Waters |
| 2017/0329351 | A1 | 11/2017 | Park |
| 2018/0074155 | A1 | 3/2018 | Onomura |
| 2018/0229859 | A1 | 8/2018 | Evans |

FOREIGN PATENT DOCUMENTS

| | | | |
|---|---|---|---|
| JP | 5-302947 | A | 11/1993 |
| JP | 7-321536 | A | 12/1995 |
| JP | 8-37743 | A | 2/1996 |
| JP | 8-130840 | A | 5/1996 |
| JP | 2001-201526 | A | 7/2001 |
| JP | 2007-18211 | A | 1/2007 |
| JP | 2007-22382 | A | 2/2007 |
| JP | 2008-211868 | A | 9/2008 |
| JP | 2008-259392 | A | 10/2008 |
| JP | 2009-33954 | A | 2/2009 |
| JP | 2009-540646 | A | 11/2009 |
| JP | 2011-142708 | A | 7/2011 |
| JP | 2011-182144 | A | 9/2011 |
| JP | 2013-534401 | A | 9/2013 |
| JP | 2015-5906 | A | 1/2015 |
| JP | 2016-127678 | A | 7/2016 |
| JP | 2017-69799 | A | 4/2017 |
| WO | WO 2014/054276 | A1 | 4/2014 |

OTHER PUBLICATIONS

International Search Report dated Jul. 10, 2018 in PCT/JP2018/015092, citing documents AG through AO therein, 10 pages.

Japanese Office Action dated Jan. 29, 2019 in Japanese Patent Application No. 2018-555789 (with unedited computer generated English translation), citing documents AG though AP therein, 8 pages.

Japanese Office Action dated Dec. 18, 2018 in Japanese Patent Application No. 2018-204187 (with unedited computer generated English translation), citing documents AJ, AP, AQ, and AR therein, 6 pages.

Japanese Office Action dated Apr. 16, 2019 in Japanese Patent Application No. 2018-204187 (with unedited computer generated English translation), citing documents AJ, AP through AU and BO therein, 10 pages.

Japanese Office Action dated Jan. 29, 2019 in Japanese Patent Application No. 2018-557437 (with unedited computer generated English translation), citing documents AG through AP therein, 8 pages.

Japanese Office Action dated Jun. 11, 2019 in Japanese Patent Application No. 2018-209637 (with unedited computer generated English translation), citing documents AJ, AT, AU, BO and BP therein, 7 pages.

Office Action dated Jun. 16, 2020, in corresponding Korean Patent Application No. 10-2019-7034333 (with English translation), 10 pages.

Japanese Office Action dated Sep. 17, 2019 in Japanese Patent Application No. 2018-209637 (with unedited computer generated English translation), citing documents AJ, AT, AU, BO and BP therein, 7 pages.

Extended European Search Report dated May 18, 2020, in corresponding European Patent Application No. 18809914.7, citing document AO and AY therein, 8 pages.

Extended European Search Report dated May 18, 2020, in corresponding European Patent Application No. 18809345.4, citing document AO and AY therein, 7 pages.

Report ITU-R SM.2056: Airborne verification of antenna patterns of broadcasting stations Report ITU-R SM.2056, Jul. 26, 2006, pp. 1-32, XP002679803.

International Search Report dated Jul. 10, 2018 in PCT/JP2018/014265, 4 pages.

Office Action dated Oct. 7, 2020, in co-pending U.S. Appl. No. 16/615,307.

European Search Report dated Dec. 17, 2020 in corresponding European application No. 20194783.5.

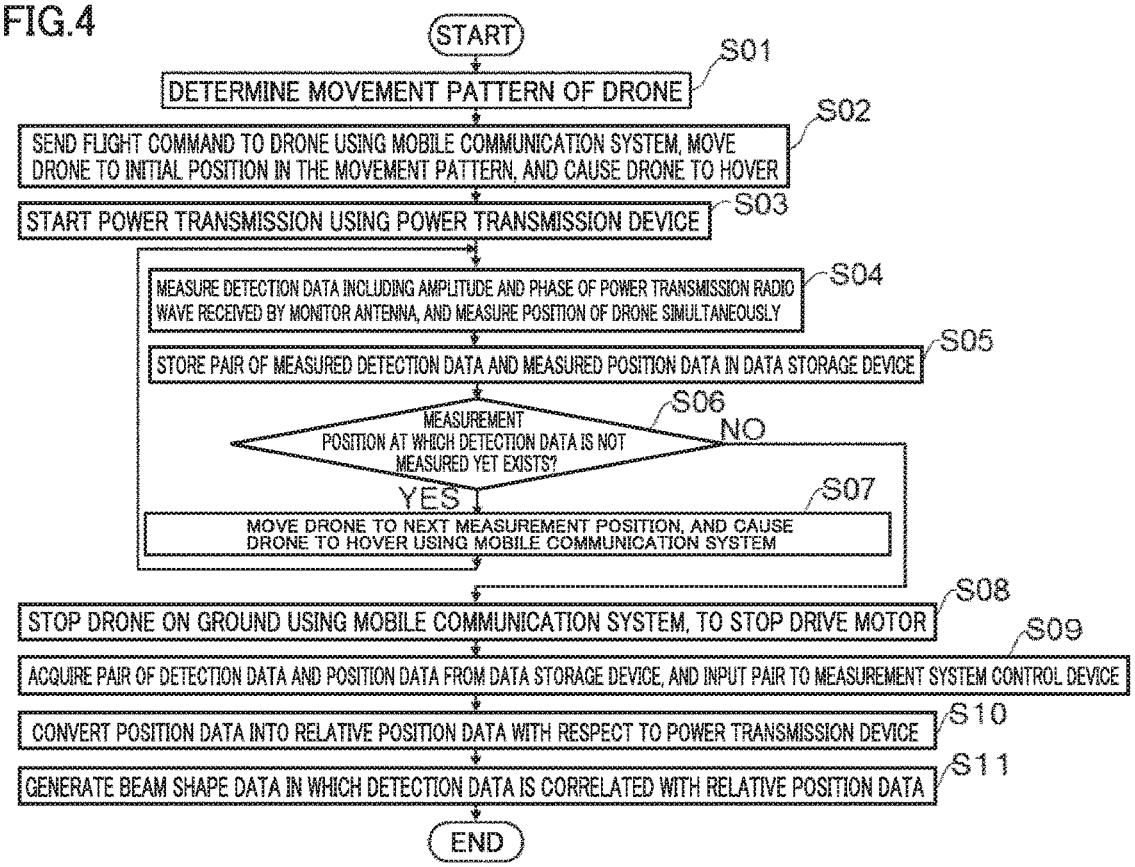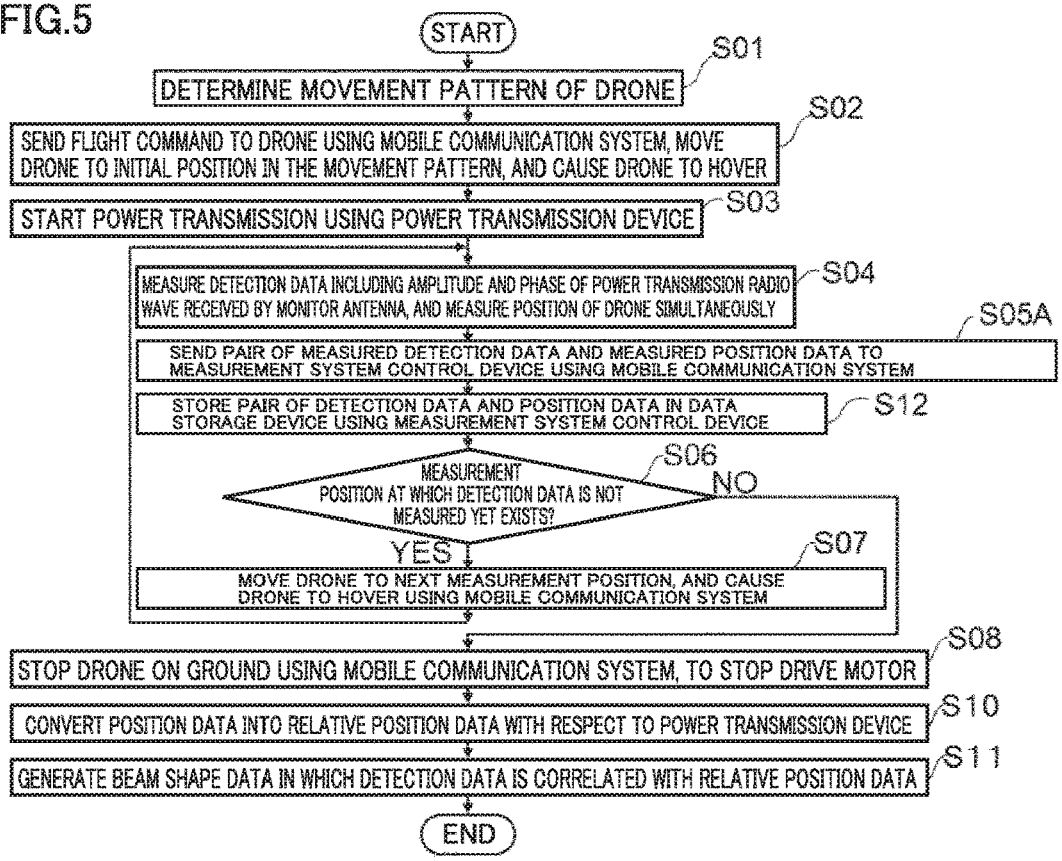

FIG.41

WIRELESS POWER TRANSMISSION DEVICE AND POWER TRANSMISSION SYSTEM TO AERIAL MOVING BODY

CROSS REFERENCE

This application is a divisional Application of U.S. application Ser. No. 16/615,181, filed Nov. 20, 2019, which is a National Stage application of PCT/JP2018/015092, filed Apr. 10, 2018, and claims priority to PCT/JP2018/014265, filed Apr. 3, 2018, and Japanese Priority Application No. 2017-105269 filed May 29, 2017. The entire contents of the above-identified applications are incorporated herein by reference.

TECHNICAL FIELD

The present disclosure relates to a wireless power transmission device that transmits wirelessly power by the radio wave, and a power transmission system to an aerial moving body.

BACKGROUND ART

A system in which a direction of a transmitted microwave beam for the power transmission is controlled by controlling the microwaves radiated from a plurality of element antennas has been developed (see Non Patent Literature 1). The system is developed for the purpose of the remote power transmission using the radio wave in a frequency band such as a microwave. In the system, an amplitude mono-pulse method and a rotating element electric field vector (REV) method are adopted for beam control. High-efficient wireless power transmission using microwaves is provided by adopting the amplitude mono-pulse method and the REV method. A pilot signal guiding a transmission direction of a power transmission microwave is transmitted from a power receiving side, each power transmission panel detects an arrival direction of the pilot signal using the amplitude mono-pulse method, and the microwave is radiated in the arrival direction of the pilot signal. An optical path length corresponding to a level difference between the power transmission panels is detected and corrected by the REV method. A monitor antenna is attached to a XY scanner movable in two-dimension, and an area where the radio wave is radiated is scanned with the XY scanner, thereby measuring a beam direction or a radiation pattern of the microwave with which the power is transmitted.

A technique of leading a moving body to which the power is fed in a direction in which electromagnetic field energy is increased and guiding the moving body to a feeding position where wireless feeding is performed has been proposed as a feeding system for feeding the moving body in an underwater environment (see PATENT LITERATURE 1). PATENT LITERATURE 1 proposes that an antenna for the power transmission is used also for communication. In FIG. 11 of PATENT LITERATURE 1, a communication function 150 exists in a transmission antenna 11-1. In FIG. 12, a communication function 250 exists in a reception antenna 21-1. However, a specific configuration in which the antenna for the power transmission is used also for the communication is not described in PATENT LITERATURE 1.

CITATION LIST

Patent Literature

PATENT LITERATURE 1: Japanese Patent Laid-Open No. 2016-127678

Non Patent Literature

NON PATENT LITERATURE 1: Katsumi Makino et al., "Development and Demonstration of the High-Precision Beam Steering Controller for Microwave Power Transmission, which takes account of applying to SSPS (Space solar power systems)", IEICE Technical Report, SANE 2015-22, pp. 37-42, June 2015.

SUMMARY OF INVENTION

Technical Problem

In an environment where the radio wave is reflected, there is an influence of multipath. For this reason, it is difficult to measure an antenna radiation pattern with high accuracy. In the case of measuring the antenna radiation pattern with high accuracy, the radio wave is measured in an environment of an anechoic chamber where the radio wave is hardly reflected. However, even in the environment of the anechoic chamber, the measurement is affected by multipath reduced to be very little. For this reason, sometimes the measurement cannot be performed with required accuracy. In a wireless power transmission device that transmits the power to the aerial moving body, the radio wave cannot be radiated with high accuracy in the direction in which the aerial moving body exists, and efficiency of the wireless power transmission is degraded.

In order to solve the above problems, an object of the present disclosure is to obtain a wireless power transmission device that controls the radio wave radiated from the antenna that transmits the power to the aerial moving body with higher accuracy than the conventional technique, and a power transmission system to the aerial moving body.

Solution to Problem

According to an aspect of the present disclosure, a wireless power transmission device includes: a power transmission antenna to transmit power by radiating a radio wave and being capable of changing an orientation direction; a radiation direction determiner to determine a radiation direction, the radiation direction being a direction in which an aerial moving body exists, the aerial moving body being a target to transmit the power; an orientation direction changer to direct the orientation direction of the power transmission antenna toward the radiation direction; and a transmission signal generator to generate a transmission signal transmitted as the radio wave from the power transmission antenna.

The power transmission antenna is a phased array antenna including: a plurality of element antennas to radiate the radio waves; and a plurality of element modules, each of the plurality of element modules including a phase shifter to change a phase of the transmission signal and an amplifier to amplify the transmission signal. The orientation direction changer controls a phase shift amount of the phase shifter. A phase offset value for the phase shifter included in each of the plurality of element modules is calculated by performing a REV (rotating element electric field vector) method using the aerial moving body hovering over the power transmission antenna and mounting a measurement antenna to receive the radio wave and a radio wave measurer to measure received radio wave data including an amplitude of the radio wave received by the measurement antenna.

According to another aspect of the present disclosure, a power transmission system to an aerial moving body includes: the wireless power transmission device; a power transmission control device to control the wireless power transmission device; a ground time device installed on the ground and to output time data; an aerial moving body; and a REV method analyzer.

The wireless power transmission device includes: a power transmission antenna to transmit power by radiating a radio wave and being capable of changing an orientation direction; a radiation direction determiner to determine a radiation direction, the radiation direction being a direction in which an aerial moving body exists, the aerial moving body being a target to transmit the power; an orientation direction changer to direct the orientation direction of the power transmission antenna toward the radiation direction; and a transmission signal generator to generate a transmission signal transmitted as the radio wave from the power transmission antenna. The power transmission antenna is a phased array antenna including: a plurality of element antennas to radiate the radio wave; and a plurality of element modules provided in each predetermined number of the element antennas, each of the plurality of element modules including a phase shifter to change the phase of the transmission signal and an amplifier to amplify the transmission signal. The orientation direction changer controls a phase shift amount of the phase shifter.

The aerial moving body mounts a measurement antenna, a radio wave measurer, a mobile time device, a received radio wave data time adder, and a mobile communicator. The measurement antenna receive the radio wave radiated by the wireless power transmission device. The radio wave measurer measures received radio wave data including electric field strength that is an amplitude of the radio wave received by the measurement antenna. The mobile time device outputs time data synchronized with the ground time device. The received radio wave data time adder adds, to the received radio wave data, the time data outputted from the mobile time device at a point of time when the received radio wave data is measured, and generates time-added received radio wave data. The mobile communicator communicates with the power transmission control device.

The REV method analyzer obtains an element electric field phase in each of the plurality of element modules based on a REV scenario and REV method performing time radio wave data, the element electric field phase being a phase of an element electric field vector generated at a position of the measurement antenna by the radio wave radiated by the element antenna being supplied with the transmission signal outputted from one element module, the REV method scenario defining a phase operation pattern in which a phase shift amount of at least one operation phase shifter that is a part of the phase shifters is changed repeatedly with at least a part of the element antennas radiating the radio wave to perform a REV (rotating element electric field vector) method for obtaining the element electric field phase, the REV method performing time radio wave data being the time-added received radio wave data measured by the radio wave measurer while performing the REV method scenario.

The power transmission control device includes a power transmission control communicator to communicate with the mobile communicator and a REV method performing circuitry to control the wireless power transmission device based on the REV method scenario.

The orientation direction changer directs the orientation direction of the power transmission antenna toward the radiation direction, under a condition in which each of the plurality of element modules has a phase reference matched based on the element electric field phase of each of the plurality of element modules.

Advantageous Effects of Invention

In the wireless power transmission device of the present disclosure, the radio wave can be radiated in the direction in which the aerial moving body exists with higher accuracy than the conventional technique, and the efficiency of the wireless power transmission can be improved more than the conventional technique.

In the power transmission system to the aerial moving body of the present disclosure, the REV method can be performed in a situation where the power is transmitted actually to the aerial moving body, and the radio wave can be radiated in the direction in which the aerial moving body exists with higher accuracy than the conventional technique, and the efficiency of the wireless power transmission can be improved more than the conventional technique.

BRIEF DESCRIPTION OF DRAWINGS

FIG. 4 is a flowchart illustrating a procedure for measuring a radiation pattern of a radio wave in the radio wave measurement system using the aerial moving body of the first embodiment.

FIG. 5 is a flowchart illustrating another procedure for measuring the radiation pattern of the radio wave in the radio wave measurement system using the aerial moving body of the first embodiment.

FIG. 41 is a configuration diagram illustrating a radio wave measurement system using an aerial moving body according to a fifteenth embodiment of the present disclosure and a power transmission system to the aerial moving body by a wireless power transmission device of the fifteenth embodiment.

DESCRIPTION OF EMBODIMENTS

First Embodiment

Figure 1:
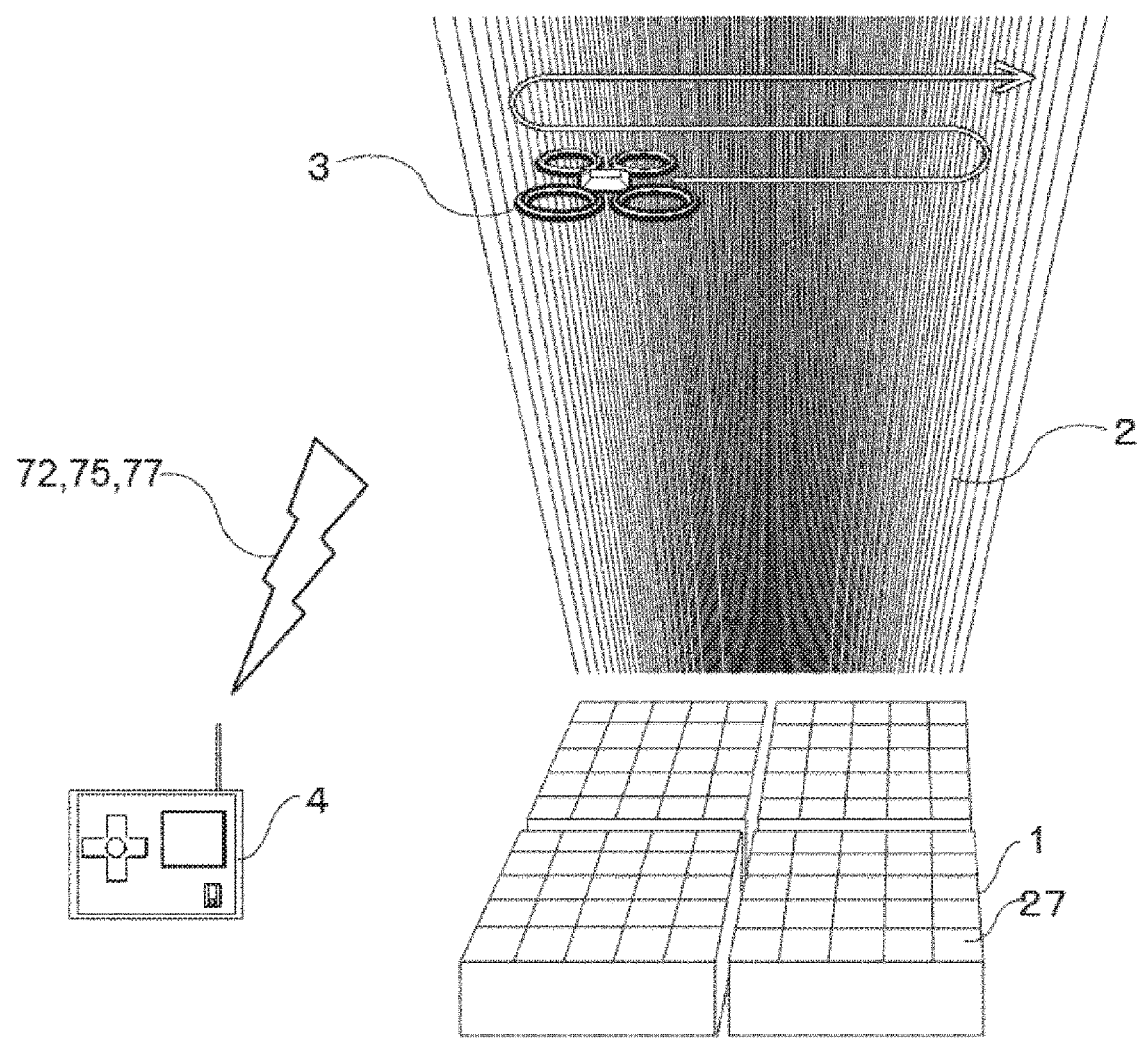
FIG. 1 is a conceptual view illustrating a radio wave measurement system using an aerial moving body according to a first embodiment of the present disclosure.
Figure 2:
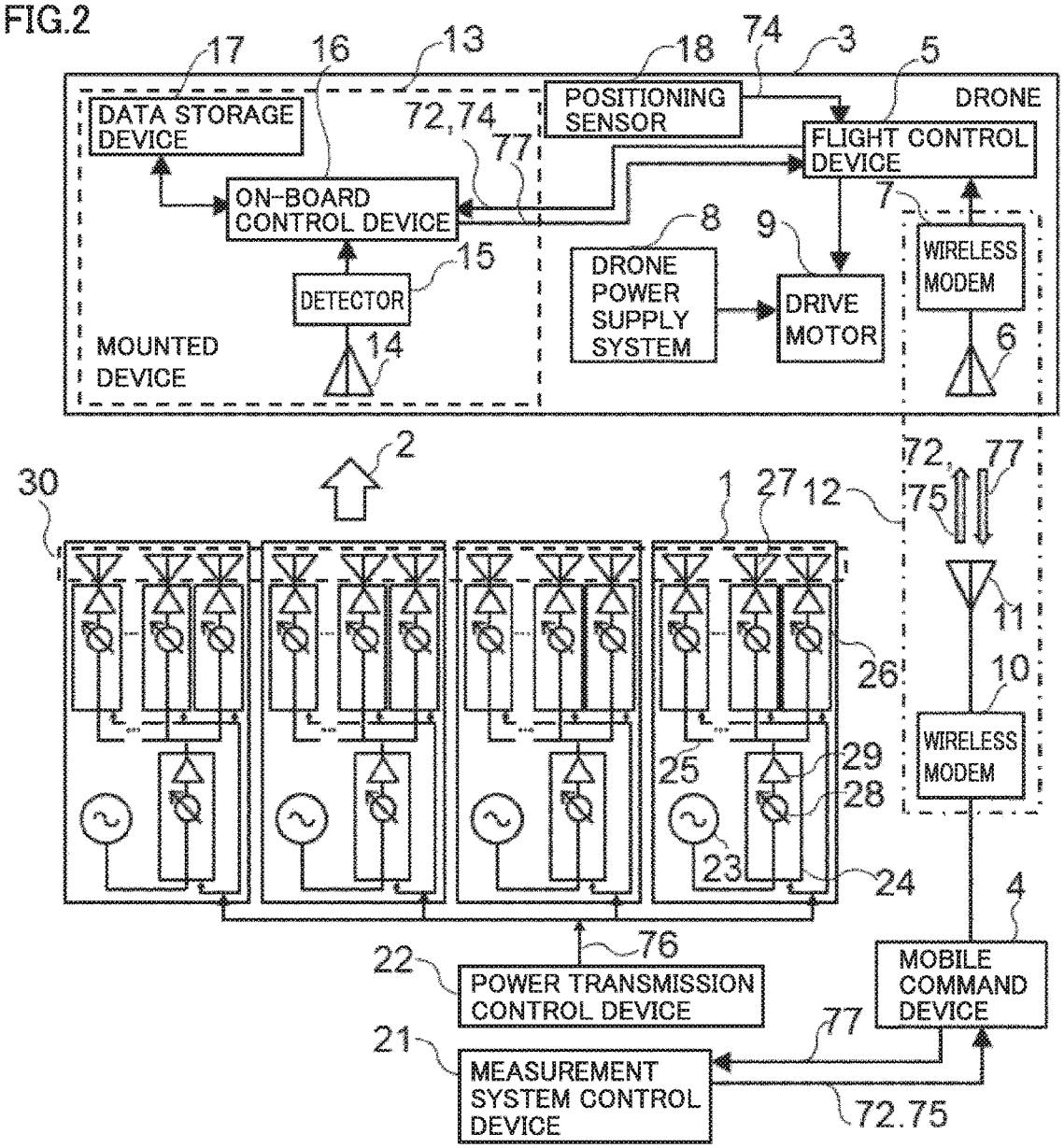
FIG. 2 is a block diagram illustrating the radio wave measurement system using the aerial moving body of the first embodiment.

With reference to FIGS. 1 and 2, a configuration of a radio wave measurement system according to a first embodiment is described. FIG. 1 is a conceptual view illustrating the radio wave measurement system using an aerial moving body according to the first embodiment of the present disclosure. FIG. 2 is a block diagram illustrating the radio wave measurement system using the aerial moving body of the first embodiment. The radio wave measurement system using the aerial moving body measures the radio wave radiated from a wireless power transmission device in a place, such as outdoors, which has a good radio wave environment.

A plurality of (in the example of FIG. 1, four) power transmission devices 1 radiate power transmission radio waves 2 outdoor in a sky direction. Power transmission device 1 is a wireless power transmission device including a power transmission antenna that transmits power by the radiated radio wave. Two-dimensional or three-dimensional strength distribution (referred to as a radiation pattern, a radio wave shape, or a beam shape) of an electric field and a magnetic field by power transmission radio wave 2 formed in a space above power transmission device 1 is measured using a drone 3. As used herein, the drone is a generic term of an unmanned aircraft that can fly (move in air) by remote control or automatic control. Drone 3 is controlled by a person or a computer through a mobile command device 4.

Drone 3 includes a flight control device 5, an on-board communication antenna 6, a wireless modem 7, and a drone power supply system 8. Flight control device 5 controls a mechanism of drone 3 in order to cause drone 3 to move or hover in air. On-board communication antenna 6 transmits and receives the radio wave for the purpose of communication. Wireless modem 7 performs communication using on-board communication antenna 6. Drone power supply system 8 manages the power to be used by drone 3 for the flight, the communication, and the measurement of the beam shape of the radio wave. A drive motor 9 being a power source is illustrated in the drawings as a representative of the mechanism that causes drone 3 to move or hover in the air. Mobile command device 4 includes a wireless modem 10 and a communication antenna 11 to communicate with drone 3. Drone 3 and mobile command device 4 usually include these devices. Wireless modem 10 and communication antenna 11 of mobile command device 4 and on-board communication antenna 6 and wireless modem 7 of drone 3 constitute a mobile communication system 12. Drone 3 is controlled by mobile communication system 12.

Drone 3 further includes a mounted device 13 that measures beam shape data 71 representing a beam shape formed by power transmission radio wave 2. Mounted device 13 includes a monitor antenna 14, a detector 15, an on-board control device 16, and a data storage device 17. Monitor antenna 14 receives power transmission radio wave 2. Monitor antenna 14 is a measurement antenna that receives the radio wave radiated by power transmission device 1. Detector 15 detects the radio wave received by monitor antenna 14, and measures a phase and an amplitude of the radio wave. On-board control device 16 controls detector 15 to manage measured detection data 73. Data storage device 17 is a storage device that stores detection data 73 and the like. The drone is mounted with the instrument and the device that are included in the mounted device and a functional unit that represents processing performed by the on-board control device.

A measurement command 72 for measuring detection data 73 with detector 15 is sent from mobile command device 4 to on-board control device 16 through mobile communication system 12 and flight control device 5. On-board control device 16 controls detector 15 according to an instruction indicated with measurement command 72.

Detection data 73 includes at least one or both of the amplitude and the phase of power transmission radio wave 2. Detection data 73 is received radio wave data including the amplitude and the phase of power transmission radio wave 2 received by monitor antenna 14. Detector 15 is a radio wave measurer that measures the received radio wave data.

On-board control device 16 and flight control device 5 are connected to each other in a wired or near-field wireless communication manner, and can send and receive the data and the command bidirectionally. Drone 3 includes a positioning sensor 18, such as a GPS (Global Positioning System) receiver. The positioning sensor 18 measures a position of drone 3. Position data 74 measured by positioning sensor 18 is sent to on-board control device 16 through flight control device 5. Measurement data 77 is stored in data storage device 17 as detection data 73. Measurement data 77 includes positioned detection data 70 paired with position data 74 representing the position of drone 3 at a point of time when detection data 73 is measured, namely, at time the radio wave is received. Position data 74 is measurement point data that is the position of drone 3 at a point of time detection data 73 is measured. Positioned detection data 70 is also referred to as radio wave measurement data. Measurement data 77 stored in data storage device 17 is inputted to a measurement system control device 21 after drone 3 is landed.

Measurement data 77 may be sent to measurement system control device 21 through mobile communication system 12, FIG. 2 also illustrates a flow of the data, such as measurement data 77. The data is sent to measurement system control device 21 through mobile communication system 12.

Mobile command device 4 sends measurement command 72 and a flight command 75 toward drone 3 through mobile communication system 12. Measurement command 72 is a command controlling mounted device 13. Flight command 75 is a command controlling the flight of drone 3. As used herein, the command is a command instructing how the instrument operates. The instrument or its control device that receives the command generates a control signal from the command, and controls the instrument with the control signal.

Figure 3:
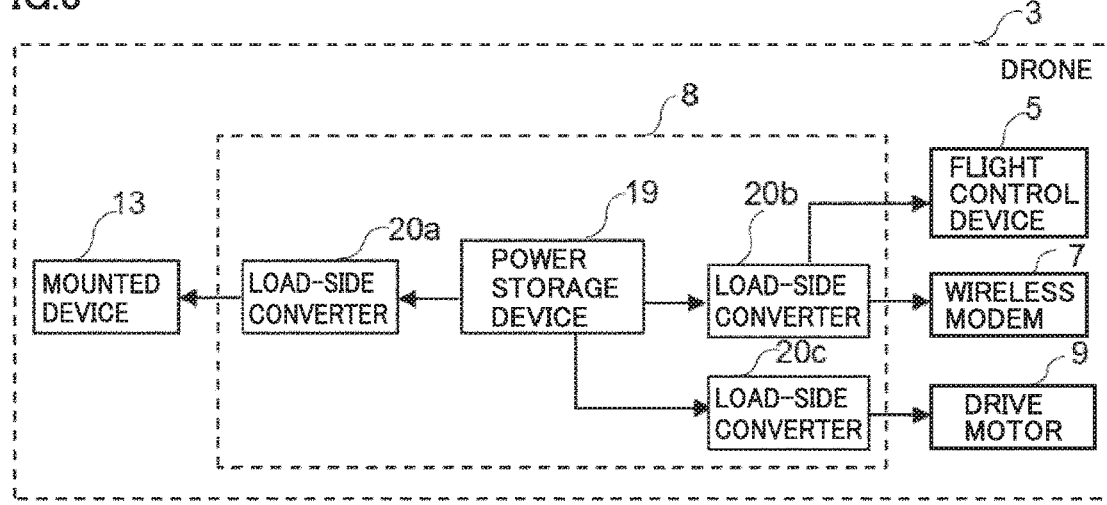
FIG. 3 is a block diagram illustrating a configuration of a power supply system of the aerial moving body constituting the radio wave measurement system of the first embodiment.

With reference to FIG. 3, the configuration of drone power supply system S is described. FIG. 3 is a block diagram illustrating a configuration of a power supply system of the aerial moving body constituting the radio wave measurement system of the first embodiment. Drone power supply system S includes a power storage device 19 and load-side converters 20a, 20b, 20c. Power storage device 19 stores DC power supplied from the outside. Load-side converters 20a, 20b, 20c are a DC-DC converter that converts the DC power stored in power storage device 19 into DC power having voltage required by load equipment, and supplies the DC power having converted voltage to the load equipment. As used herein, the load equipment means mounted device 13, flight control device 5, wireless modem 7, drive motor 9, and the like. Load-side converter 20a supplies the converted DC power to mounted device 13. Load-side converter 20b supplies the converted DC power to flight control device 5 and wireless modem 7. Load-side converter 20c supplies the power to drive motor 9. When the instrument included in mounted device 13 requires a plurality of power supply voltages, a plurality of load-side converters are provided in each voltage. When flight control device 5 and wireless modem 7 require different power supply voltages, different load-side converters supply the power to flight control device 5 and wireless modem 7. For example, when mounted device 13 and wireless modem 7 are used at the same power supply voltage, the same load-side converter may supply the power to mounted device 13 and wireless modem 7. A plurality of drive motors 9 and a plurality of load-side converters 20c may be provided in order to reduce a probability that drone 3 cannot fly.

The radio wave measurement system that measures power transmission radio wave 2 radiated by power transmission device 1 includes drone 3 on which mounted device 13 is mounted, mobile command device 4 that controls drone 3, and measurement system control device 21 that controls the radio wave measurement instrument included in mounted device 13.

Power transmission device 1 includes a transmission signal generator 23, one first-stage module 24, a distribution circuit 25, a plurality of second-stage modules 26, and an element antenna 27 provided in each second-stage module 26. Power transmission control device 22 sends a power transmission control signal 76 to power transmission device 1. Power transmission control signal 76 controls whether power transmission device 1 transmits the power, what kind of the beam shape and which one of the directions the power is transmitted, and the like. Transmission signal generator 23 generates a transmission signal of a determined frequency to be radiated as the radio wave by each element antenna 27. The transmission signal outputted from transmission signal generator 23 is inputted to first-stage module 24. The transmission signal in which amplification and the phase are adjusted by first-stage module 24 is distributed by distribution circuit 25, and inputted to second-stage module 26. The transmission signal in which the amplification and the phase are adjusted by second-stage module 26 is radiated from element antenna 27 into space as power transmission radio wave 2. The transmission signal generator 23, the first-stage module 24, and the second-stage module 26 are controlled using power transmission control signal 76. The first-stage module 24 or the second-stage module 26 is referred to as an element module.

The first-stage module 24 and the second-stage module 26 have the same configuration. Each of the first-stage module 24 and the second-stage module 26 includes a phase shifter 28 and an amplifier 29. Phase shifter 28 changes the phase of the transmission signal by a command value. Phase shifter 28 changes the phase discretely with a pitch width of phase rotation determined by a number of bits determining resolution of the phase. For example, for a 5-bit phase shifter, the phase is rotated with the pitch width of $360°/2^5=11.25°$, Phase shifter 28 may change the phase continuously. Phase shifter 28 of first-stage module 24 can change the phases of the plurality of element antennas 27 included in power transmission device 1 uniformly. Amplifier 29 amplifies the transmission signal.

In one power transmission device 1, element antennas 27 are arranged into a matrix form. Four power transmission devices 1 are arranged into the matrix form so as to be adjacent to each other. Thus, all element antennas 27 are arranged in the matrix form.

One power transmission device 1 is a phased array antenna including the plurality of element antennas 27 that can control the phase of the radiated radio wave. A set of four power transmission devices 1 can be considered as one phased array, antenna 30. In the radio wave measurement system of the first embodiment, the beam shape of the radio wave radiated by phased array antenna 30 is measured. That is, phased array antenna 30 is a measurement target antenna whose beam shape is to be measured. One power transmission device 1 can be considered as a power transmitter, and an assembly of a plurality of power transmission devices 1 can be considered as a power transmission device. Power transmission device 1 corresponds to one group when the plurality of element antennas 27 are divided into a plurality of groups.

The operation is described. FIG. 4 is a flowchart illustrating a procedure for measuring a radiation pattern of the radio wave in the radio wave measurement system using the aerial moving body of the first embodiment. In step SOI, a movement pattern of drone 3 is determined. It is assumed that the movement pattern is a pattern in which two-dimensional scan is performed on a cut surface perpendicular to the direction in which power transmission radio wave 2 is radiated. The radio wave is measured three-dimensionally by setting the cut surfaces at a plurality of positions having different distances from power transmission device 1.

In step S02, mobile communication system 12 sends flight command 75 to drone 3, and drone 3 is moved to an initial position in the movement pattern and caused to hover. In step S03, power transmission device 1 starts the power transmission. Steps S02 and S03 may be exchanged.

In step S04, detection data 73 including the amplitude and the phase of power transmission radio wave 2 received by monitor antenna 14 is measured according to measurement command 72 sent by mobile communication system 12. At the same time, positioning sensor 18 measures the position of drone 3. In step S05, positioned detection data 70 that is the pair of measured detection data 73 and measured position data 74 is stored in data storage device 17. In step S06, whether or not the measurement position at which detection data 73 is not measured yet exists is checked. When the measurement position at which detection data 73 is not measured yet exists (YES in S06), flight command 75 is sent to drone 3 by mobile communication system 12 to cause drone 3 to move and hover to the next measurement position in step S07. The processing returns to step S04.

When the measurement position at which detection data 73 is not measured yet does not exist (NO in S06), drone 3 is landed on the ground. Specifically, in step S08, flight command 75 is sent to drone 3 by mobile communication system 12, drone 3 is stopped on the ground, and drive motor 9 is stopped. In step S09, positioned detection data 70 is acquired from data storage device 17, and inputted to measurement system control device 21. Measurement system control device 21 converts position data 74 into relative position data 78 with respect to power transmission device 1 in step S10. In step S11, beam shape data 71 in which detection data 73 is correlated with relative position data 78 is generated. The operation of drone 3 in the flowchart of FIG. 4 is performed using the power stored in power storage device 19. The ground includes not only the ground but also structures, such as a building and a tower, installed on the ground.

Drone 3 scans the cut surface two-dimensionally, so that the two-dimensional radiation pattern (beam shape) of power transmission radio wave 2 can be measured accurately. Drone 3 measures power transmission radio wave 2 while changing a height in the vertical direction. This allows the measurement of the three-dimensional radiation pattern of power transmission radio wave 2.

Position data 74 converted into the relative position with respect to power transmission device 1 is referred to as relative position data 78. Relative position data 78 is radio wave source relative position data representing position data 74 as the position relative to power transmission device 1. Beam shape data 71 is the radiated radio wave data including detection data 73 and radio wave source relative position data. Measurement system control device 21 is a radiated radio wave data generator that generates the radiated radio wave data. Measurement system control device 21 may be considered to include the radiated radio wave data generator. When another device is the radiated radio wave data generator, another device may be considered to include the radiated radio wave data generator.

The position of power transmission device 1 in the coordinate system, such as latitude, longitude, and altitude, is measured in advance by positioning sensor 18 and stored to calculate the position of drone 3 relative to power transmission device 1. The relative position data 78 is generated by subtracting the stored position of power transmission device 1 from position data 74 of drone 3. A positioning sensor may be provided also in power transmission device 1, and the relative position may be calculated by subtracting the measurement value of the positioning sensor.

The position of the power transmission device may be stored in the on-board control device, the data storage device, or another processing device, and the on-board control device or another processing device may convert the position data into relative position data. The on-board control device or another processing device may produce the radiated radio wave data including the detection data and the relative position data. In this case, the on-board control device or another processing device constitutes the radiated radio wave data generator. The case that the on-board control device produces the radiated radio wave data is described as follows. The previously-measured position of power transmission device 1 is stored in storage device of drone 3. The on-board control device converts position data 74 into relative position data 78, and generates beam shape data 71A in which detection data 73 is correlated with relative position data 78. Beam shape data 71A is also positioned detection data 70A in which detection data 73 and the relative position data 78 at the same time are combined. Positioned detection data 70A is also referred to as radio wave measurement data.

In the radio wave measurement system, power transmission radio wave 2 is radiated from power transmission device 1 to the sky. The radio wave measurement system measures beam shape data 71 of power transmission radio wave 2 above power transmission device 1 using drone 3 that is the aerial moving body. Consequently, beam shape data 71 of power transmission radio wave 2 of power transmission device 1 can be measured accurately while an influence of reflection is reduced.

In FIG. 4, detection data 73 is measured while drone 3 is caused to hover. Alternatively, detection data 73 may be measured while drone 3 is moved. Flight command 75 is sent from mobile command device 4 to control how drone 3 is caused to fly or hover. Alternatively, drone 3 may operate according to a program stored in drone 3 to fly or hover autonomously. The program stored in drone 3 is a program to cause drone 3 to fly and hover on a determined flight route.

Measurement data 77 including positioned detection data 70 may be sent to measurement system control device 21 by communication while drone 3 flies. FIG. 5 illustrates a flowchart illustrating a procedure in this case.

With reference to FIG. 5, points different from FIG. 4 are described. In step S05A, measurement data 77 including the positioned detection data 70 is sent from on-board control device 16 to flight control device 5. Measurement data 77 is sent to measurement system control device 21 through mobile communication system 12 and mobile command device 4. In step S12, measurement system control device 21 stores positioned detection data 70 included in measurement data 77 in the non-volatile storage device of measurement system control device 21. Because of the existence of steps S05A and S12, step S09 of acquiring positioned detection data 70 from data storage device 17 of drone 3 is deleted from the flowchart. For this reason, the processing proceeds to step S10 after step S08 is performed.

Moreover, in the procedure shown in FIG. 5, beam shape data 71 of power transmission device 1 can be measured accurately.

Detection data 73 is sent from drone 3 instead of positioned detection data 70, and measurement system control device 21 may combine position data 74 of drone 3 measured from the ground and detection data 73 to generate positioned detection data 70. Drone 3 may send at least detection data 73 to measurement system control device 21.

The radio wave measurement system can measure the beam shape of the radio wave radiated from not only the wireless power transmission device, but also an antenna for another application. The wireless power transmission device may be different from the one illustrated in the description. When the beam shape of the radio wave radiated from another wireless power transmission device or the antenna for another application is measured, the measurement target antenna means the antenna in which the beam shape is measured and the radio wave is radiated in a sky direction from the measurement target antenna. The aerial moving body such as the drone is caused to hover and move above the measurement target antenna that radiates the radio wave. The position of the aerial moving body is measured by a position measurer that is a positioning sensor such as a GPS. The aerial moving body is equipped with a measurement antenna that receives the radio wave and a detector that measures the received radio wave data including the amplitude and the phase of the radio wave received by the measurement antenna. The beam shape data is generated from the received radio wave data and measurement point data that is the position of the aerial moving body at the point of time when the received radio wave data is measured. In the beam shape data, the measurement point data is expressed as the position relative to the measurement target antenna.

Instead of the use of drone 3, a monitor antenna may be fixed at a predetermined position above power transmission device 1. However, because the radio wave is reflected or shielded by a structural member fixing the monitor antenna, there is a possibility of degrading the accuracy of the phase and the amplitude of the measured radio wave.

By performing the radio wave measurement in a place, such as the outdoors, where a radio wave environment is good, the beam shape of the measurement target antenna can be measured without being affected by multipath such as reflection on the ground. The term "not affected" means that the influence is sufficiently small. Moreover, a mobile communication system provided for controlling the drone is used for the purpose of the transmission of various data and commands. For this reason, it is not necessary to add new hardware to the drone for the purpose of the communication required to perform the beam shape measurement or the wireless power transmission. Consequently, a weight of the mounted device can be reduced, and the radio wave can be measured with low power consumption.

Measurement system control device 21, power transmission control device 22, on-board control device 16, and flight control device 5 are implemented by executing a dedicated program on a general-purpose computer or a dedicated computer. The general-purpose computer or the dedicated computer includes a memory and an arithmetic processor, such as a CPU (Central Processing Unit) that executes the program. The memory is a volatile or non-volatile memory and/or a hard disk. The memory stores the program operated by any one of measurement system control device 21, power transmission control device 22, on-board control device 16, and flight control device 5. The memory also stores data in the course of the processing and/or data of a processing result. The memory of on-board control device 16 may be shared with data storage device 17. Measurement system control device 21 and power transmission control device 22 may be constructed with one computer. On-board control device 16 and flight control device 5 may be constructed with one computer.

The above can be applied to other embodiments.

Second Embodiment

Figure 6:
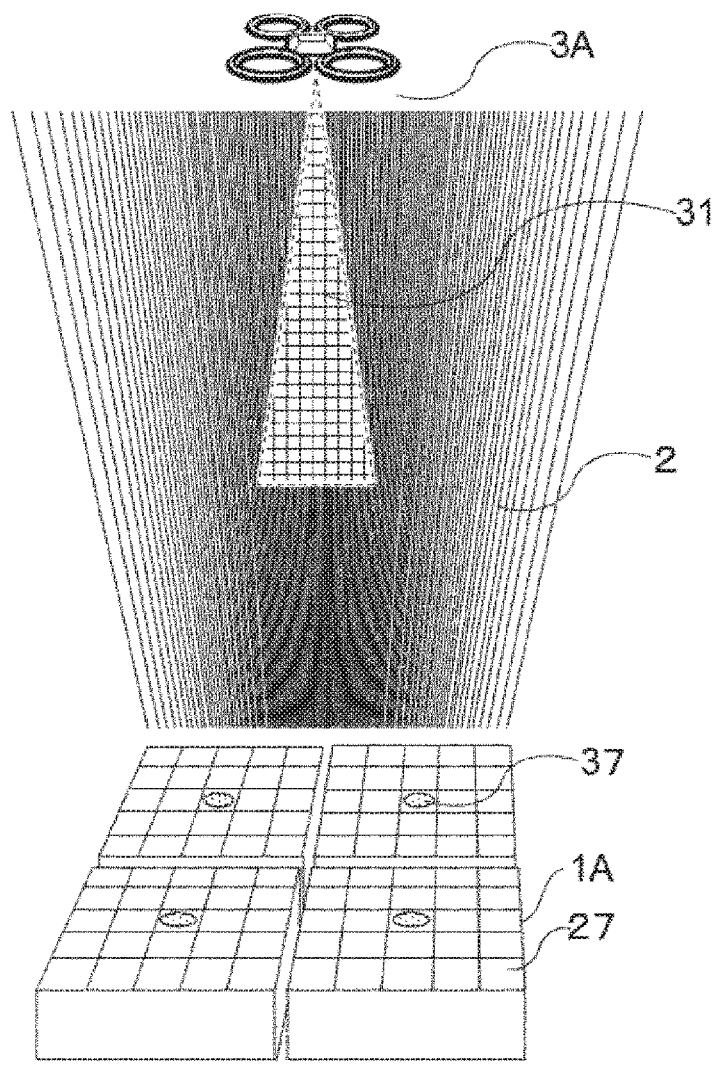
FIG. 6 is a conceptual diagram illustrating a power transmission system to an aerial moving body by a wireless power transmission device according to a second embodiment of the present disclosure.
Figure 7:
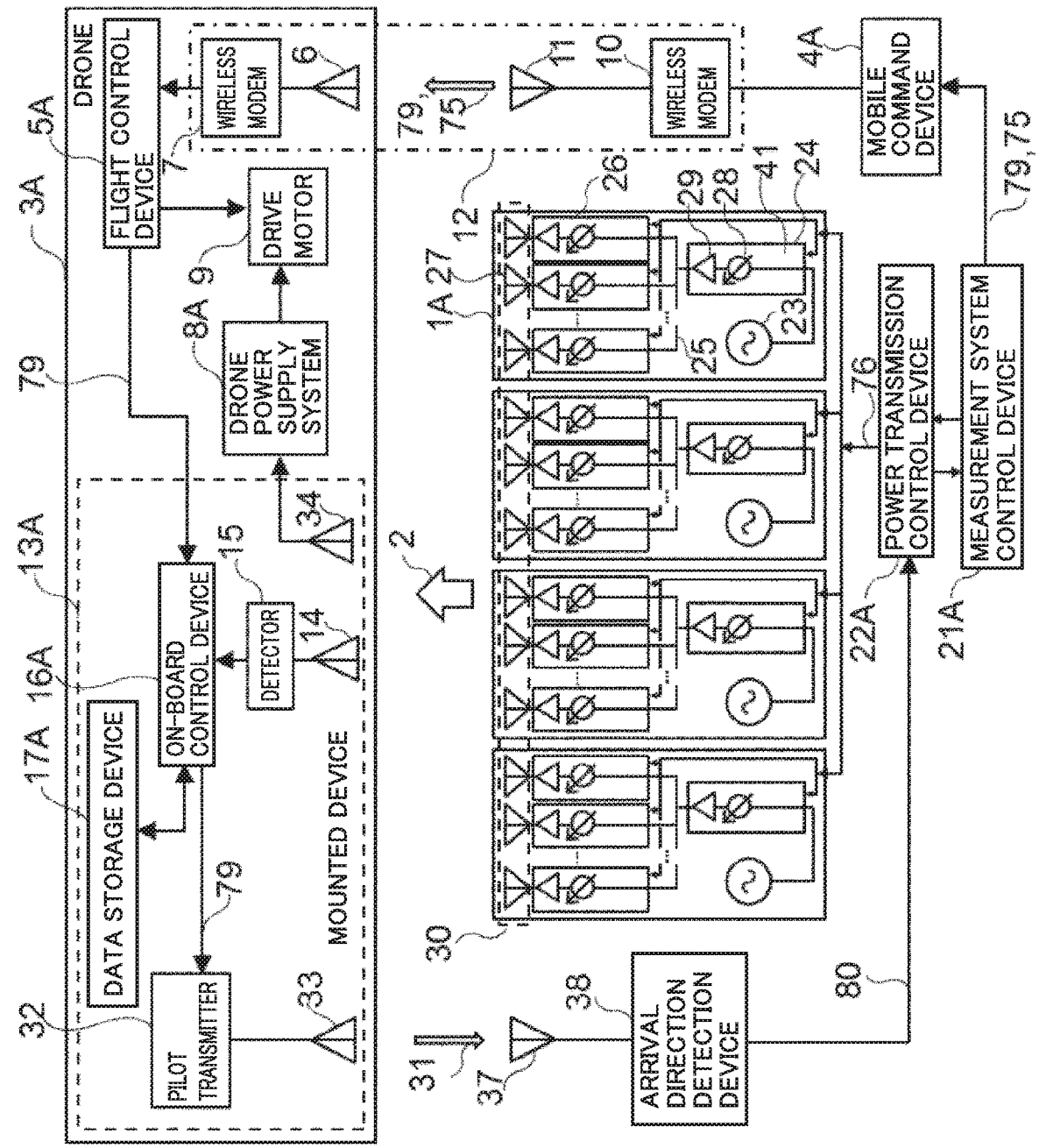
FIG. 7 is a block diagram illustrating the power transmission system to the aerial moving body by the wireless power transmission device of the second embodiment.

With reference to FIGS. 6 and 7, a configuration of a power transmission system to an aerial moving body by a wireless power transmission device according to a second embodiment is described. FIG. 6 is a conceptual diagram illustrating the power transmission system to the aerial moving body by the wireless power transmission device of the second embodiment of the present disclosure, FIG. 7 is a block diagram illustrating the power transmission system to the aerial moving body by the wireless power transmission device of the second embodiment.

In FIGS. 6 and 7, points different from FIGS. 1 and 2 are described. A drone 3A includes a pilot transmitter 32, a pilot transmission antenna 33, one or a plurality of power reception antennas 34 that receives power transmission radio wave 2, and a drone power supply system 8A. Pilot transmitter 32 generates a pilot signal 31 indicating a power transmission direction to a power transmission device 1A. Pilot transmission antenna 33 radiates pilot signal 31 toward power transmission device 1A. Drone power supply system 8A stores and uses the power that is obtained from the radio wave received by power reception antenna 34.

Drone 3A, namely, a flight control device 5A and a mobile command device 4A do not send measurement data 77 to a measurement system control device 21A. In FIG. 7, drone 3A includes monitor antenna 14 and detector 15. Alternatively, drone 3A may not include monitor antenna 14 and detector 15. Unlike data storage device 17 of the first embodiment, a data storage device 17A stores data relating to the pilot transmitter and the like, but does not store data necessary for the radio wave measurement system.

As in the first embodiment, monitor antenna 14 may receive power transmission radio wave 2, and detector 15 may measure the phase or the amplitude of the radio wave. When the radio wave is measured by monitor antenna 14 and detector 15, the power transmission system to the aerial moving body in the second embodiment may be recognized also as the radio wave measurement system. The data storage device and the on-board control device of the drone also have the same configuration as that of the first embodiment when the data storage device and the on-board control device constitute the radio wave measurement system.

Pilot transmitter 32 is controlled by measurement system control device 21A in response to a pilot transmitter control command 79. Pilot transmitter control command 79 is sent from measurement system control device 21A to on-board control device 16A through mobile command device 4 and mobile communication system 12.

In order to send pilot transmitter control command 79, measurement system control device 21A and a power transmission control device 22A can communicate with each other and send and receive data to perform a Rotating Element Electric Field Vector (REV) method before start of the power transmission. Although the reference numeral is not illustrated in FIG. 7, a command to perform the REV method is sent from power transmission control device 22A to on-board control device 16A through measurement system control device 21A. The measured data of the received power is sent from on-board control device 16A to power transmission control device 22A. Power transmission control device 22A and on-board control device 16A may communicate with each other with no use of measurement system control device 21A.

Figure 8:
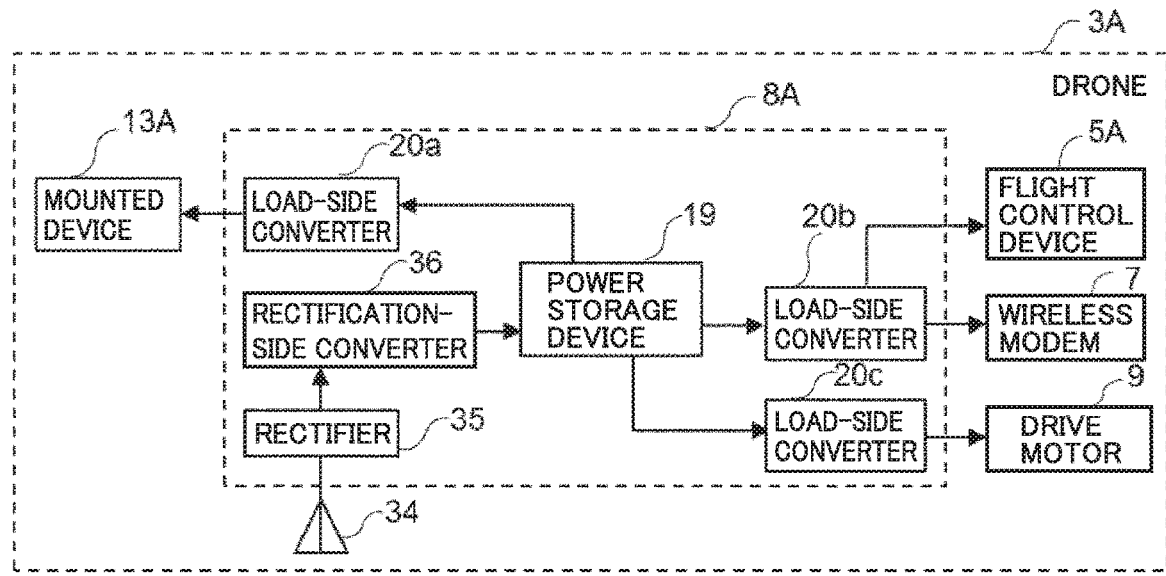
FIG. 8 is a block diagram illustrating a configuration of a power supply system of the aerial moving body that receives power transmitted from the wireless power transmission device of the second embodiment.

With reference to FIG. 8, the configuration of drone power supply system 8A is described. FIG. 8 is a block diagram illustrating the configuration of the power supply system of the aerial moving body that receives the power transmitted from the wireless power transmission device of the second embodiment. As compared to FIG. 3, drone power supply system 8A in FIG. 8 includes a rectifier 35 and a rectification-side converter 36 additionally. Rectifier 35 rectifies the received signal generated from the radio wave received by power reception antenna 34 into a direct current. The rectification-side converter 36 changes the voltage of the DC power rectified by rectifier 35. Power storage device 19 stores the DC power outputted from the rectification-side converter 36.

Power reception antenna 34, rectifier 35, and rectification-side converter 36 are added in drone power supply system 8A of the second embodiment. Consequently, the power received by power reception antenna 34 during the flight can be used in addition to the power stored in power storage device 19 before the start of the flight. For this reason, the time for which drone 3A moves or hovers in the air can be lengthened as compared to drone 3. For example, when drone 3A is used for the radio wave measurement, the time for which the radio wave is measured can further be lengthened. For example, spatial density of the measurement point in beam shape data 71 of power transmission radio wave 2 can be improved by lengthening the time.

The drone may include a plurality of power storage devices, and the power received by power reception antenna 34 during the flight may be stored in some of the power storage devices. At least one of the drone and the detector may use the power of the power storage device in which the power received during the flight is stored.

Power transmission device 1A includes a pilot reception antenna 37 that receives pilot signal 31. For example, as illustrated in FIG. 6, pilot reception antenna 37 is disposed in a central portion of element antennas 27 disposed in a matrix form in power transmission device 1A. An arrival direction detection device 38 is added. Arrival direction detection device 38 receives pilot signal 31 received by pilot reception antenna 37 of each of the plurality of power transmission devices 1A, and determines an arrival direction of pilot signal 31 by, for example, a mono-pulse method. The arrival direction is a direction in which pilot signal 31 arrives when viewed from power transmission device 1A. Arrival direction data 80 detected by arrival direction detection device 38 is inputted to power transmission control device 22A. Power transmission control device 22A controls power transmission device 1A such that power transmission radio wave 2 is radiated in the direction toward the arrival direction indicated by arrival direction data 80. That is, the radiation direction in which power transmission radio wave 2 is radiated is a direction obtained by reversing the arrival direction by 180 degrees.

Pilot signal 31 is a direction signal that is emitted by drone 3A in order to inform power transmission device 1A of the arrival direction or an existence direction. The existence direction is a direction in which drone 3A exists when viewed from power transmission device 1A. The existence direction and the arrival direction are opposite to each other. Pilot transmitter 32 and pilot transmission antenna 33 that are mounted on drone 3A are a direction signal transmitter that transmits the direction signal. Pilot reception antenna 37 of power transmission device 1A installed on the ground is a direction signal receiver that receives the direction signal. Pilot transmitter 32, pilot transmission antenna 33, and pilot reception antenna 37 are a direction signal transmission reception system that transmits and receives the direction signal.

In the second embodiment, phased array antenna 30 functions as a power transmission antenna that can change an orientation direction in which the power is transmitted by the radio wave to be radiated. Drone 3A is an aerial moving body for a power transmission target. Arrival direction detection device 38 is a radiation direction determiner that determines the radiation direction that is the direction in which drone 3A exists when viewed from power transmission device 1A. Power transmission control device 22A is an orientation direction changer that directs the orientation direction of phased array antenna 30 toward the radiation direction.

Figure 9:
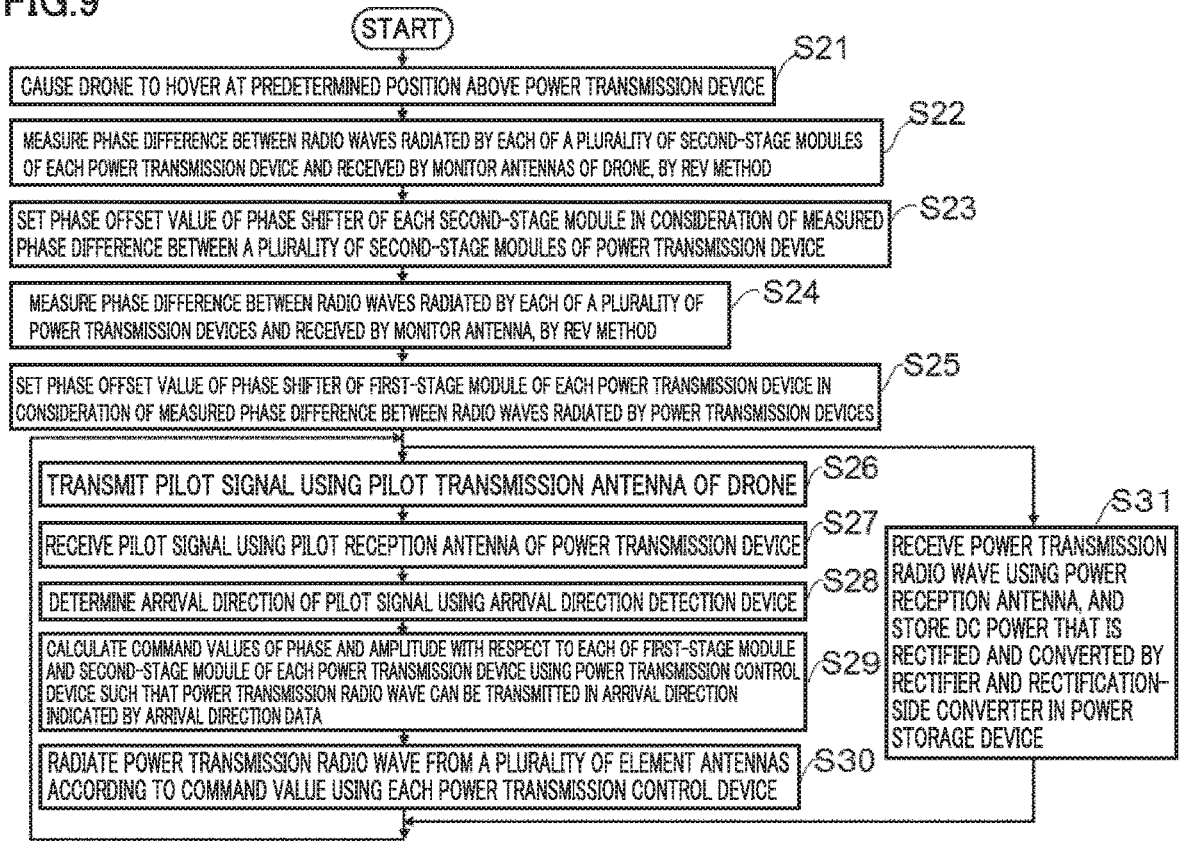
FIG. 9 is a flowchart illustrating a power transmission procedure in the power transmission system to the aerial moving body by the wireless power transmission device of the second embodiment.

The operation is described. FIG. 9 is a flowchart illustrating a power transmission procedure in the power transmission system to the aerial moving body by the wireless power transmission device of the second embodiment. In step S21, drone 3A is caused to hover at a predetermined position above power transmission device 1A.

In step S22, element antenna 27 corresponding to each of the plurality of second-stage modules 26 radiates the radio wave in each power transmission device 1A. The radio wave radiated by element antenna 27 is received by monitor antenna 14 of drone 3A. A phase difference between element electric field vectors generated at the positions of the monitor antennas 14 by the radio waves radiated by element antennas 27 is measured by the REV method. In the REV method, the phase of the radio wave radiated by one of second-stage modules 26 is changed to measure the change in the amplitude (electric field strength) of the electric field vector of the radio wave received by monitor antenna 14. Detection data 73 being the measured electric field strength is sent to power transmission control device 22 through mobile communication system 12 and measurement system control device 21. Power transmission control device 22 calculates the phase difference between the element electric field vector of the radio wave radiated by element antenna 27 corresponding to each second-stage module 26 and the electric field vector of the radio wave in which the radio waves radiated by all element antennas 27 are combined, from the change in the amplitude of the electric field vector sent by received detection data 73. The phase difference between the element electric field vectors generated by element antennas 27 is generated by a difference in path length inside power transmission device 1A, a difference in distance between each element antenna 27 and the monitor antenna 14, and the like.

In step S23, a phase offset value is set to phase shifter 28 included in each second-stage module 26 in consideration of the measured phase difference between multiple second-stage modules 26 included in each power transmission device 1A. The phase offset value is a value that is subtracted from a phase command value supplied externally. Phase shifter 28 changes the phase by an amount obtained by subtracting the phase offset value from the phase command value. Thus, the amount of change in phase of the transmission signal outputted by phase shifter 28 actually is a value obtained by subtracting the phase offset value from the phase command value. When the same phase command value is given to each second-stage module 26, each second-stage module 26 can radiate the radio wave having the same phase by subtracting the phase offset value from the phase command value.

In step S24, the phase difference between the electric field vectors radiated by each of the plurality of power transmission devices 1A and received and generated by the monitor antenna 14 is measured by the REV method while the phase of the first-stage module 24 of each power transmission device 1A is changed. The phase difference between the electric field vectors generated by power transmission devices 1A due to the difference in the path length to first-stage module 24 of each power transmission device 1A or the difference in the distance from each power transmission device 1A to monitor antenna 14 is measured in the REV method. In step S25, the phase offset value of phase shifter 28 included in first-stage module 24 of each power transmission device 1A is set in consideration of the measured phase difference between the radio waves radiated by power transmission devices 1A.

In the pieces of processing in S21 to S25, the phase offset value due to the difference in the path length inside each power transmission device 1A is measured in advance in each first-stage module 24 or second-stage module 26, and the phase command value of each phase shifter 28 is determined in consideration of the previously-measured phase offset value. For this reason, the radio wave radiated from each element antenna 27 can be set to the value in which the phase reference is matched. The pieces of processing in S21 to S25 are performed before power transmission device 1A is used for the first time. When the element module that is first-stage module 24 or second-stage module 26 is replaced, the phase offset value of the replaced element module is obtained.

In step S26, pilot transmission antenna 33 of drone 3A transmits pilot signal 31. In step S27, pilot reception antenna 37 of power transmission device 1A receives pilot signal 31. In step S28, arrival direction detection device 38 determines arrival direction data 80 of pilot signal 31. In step S29, power transmission control device 22A calculates the command values of the phase and amplitude for each of the element modules of power transmission device 1A such that power transmission radio wave 2 can be transmitted while the direction toward which the arrival direction indicated by arrival direction data 80 is set to the radiation direction. Power transmission control signal 76 is the command values of the phase and amplitude for each element module. Element antenna 27 of each second-stage module 26 radiates the radio wave having the adjusted phase. This allows the radio wave radiated in the radiation direction to be strengthened. The beam shape can be made more desirable by adjusting the amplitude of the radio wave radiated by each element antenna 27. Consequently, power transmission device 1A can efficiently transmit the power in the radiation direction.

In step S30, first-stage module 24 and each second-stage module 26 of each power transmission device 1A generate the transmission signals in which the phases and amplitudes are adjusted according to power transmission control signal 76, and radiate the transmission signals from corresponding element antennas 27 as power transmission radio wave 2.

In parallel to steps S26 to S30, in step S31, power transmission radio wave 2 is received by power reception antenna 34 of drone 3A, and the DC power rectified and converted by rectifier 35 and rectification-side converter 36 is stored in power storage device 19.

The pieces of processing in S26 to S30 and S31 are performed periodically in a determined period. After performing steps S30 and S31, the processing returns before S26 and S31. A length of one period is determined such that the difference between the previously-calculated arrival direction and the current arrival direction falls within an acceptable range when drone 3 moves at the assumed maximum movement speed.

Drone 3A transmits pilot signal 31, and power transmission device 1A radiates power transmission radio wave 2 in the direction in which pilot signal 31 arrives, so that power reception antenna 34 of drone 3A can efficiently receive power transmission radio wave 2.

Whether the beam shape formed actually by power transmission radio wave 2 radiated in step S30 of FIG. 9 becomes the assumed beam shape can be verified. For this reason, the beam shape of the radio wave beam that is radiated while the phase command value and the amplitude command value for each element antenna 27 are fixed can be measured using, for example, the radio wave measurement system in FIGS. 1 and 2. In this case, the power transmission system to the aerial moving body by the wireless power transmission device of the second embodiment is also a radio wave measurement system using the aerial moving body.

As a radio wave measurement system, instead of using the drone 3A, the monitor antenna may be fixed at a predetermined position above the power transmission device 1A. However, because the radio wave is reflected or shielded by a structural member fixing the monitor antenna, there is a possibility of degrading the accuracy of the phase and the amplitude of the measured radio wave.

The influence of multipath such as ground reflection is reduced by performing the control of the power transmission radio wave and the wireless power transmission to the aerial moving body using the radio waves at a place having a good radio wave environment such as outdoors. For this reason, the wireless power transmission by the radio wave can be performed with higher accuracy than the conventional technique. Because the transmission of various data and commands uses the mobile communication system provided for controlling the drone, it is not necessary to add new hardware to the drone for the purpose of the communication necessary for performing the wireless power transmission. Consequently, the weight of the mounted device can be reduced, and the wireless power transmission to the drone can be performed with low power consumption.

Instead of the phased array antenna, the power may be transmitted to the aerial moving body using a wireless power transmission device including a power transmission antenna that changes the orientation direction mechanically. The direction in which the aerial moving body exists may be sent to the wireless power transmission device by means other than the pilot signal. Any wireless power transmission device can radiate the radio wave in the direction in which the aerial moving body exists with higher accuracy than the conventional technique and improve the efficiency of the wireless power transmission as long as the wireless power transmission device includes the power transmission antenna that can change the orientation direction in which the power is transmitted by the radiated radio wave, the radiation direction determiner that determines the radiation direction that is the direction in which the aerial moving body of the power transmission target exists, the orientation direction changer that directs the orientation direction of the power transmission antenna in the radiation direction, and a transmission signal generator that generates the transmission signal transmitted as the radio wave from the power transmission antenna. Sometimes arrival direction detection device 38 that is the radiation direction determiner is installed in the position away from power transmission device 1A, and arrival direction detection device 38 is included in the wireless power transmission device.

By performing the REV method using the aerial moving body such as the drone, the REV method can be performed in a situation where the power is transmitted actually to the aerial moving body. For this reason, the REV method can accurately be performed, and the radio wave can accurately be radiated in the direction in which the aerial moving body exists when the power is transmitted to the aerial moving body. That is, the radio wave can be radiated in the direction in which the aerial moving body exists with higher accuracy than the conventional technique, and the efficiency of the wireless power transmission can be improved higher than the conventional technique.

When the wireless power transmission device is not used as the radio wave measurement system, measurement system control device 21A can be omitted. When measurement system control device 21A does not exist, power transmission control device 22A sends and receives the command to perform the REV method and the measured data of the received power through mobile command device 4A and mobile communication system 12. Flows of the command to perform the REV method and the measured data of the received power are not illustrated in FIG. 7.

When the REV method is performed, an antenna fixed to the ground may be used instead of the measurement antenna mounted on the drone. In this case, the drone does not have the function of performing the REV method. The drone may not include the measurement antenna, but the detector connected to the power reception antenna may measure the electric field strength of the radio wave received by the power reception antenna. That is, the power reception antenna may be used as the measurement antenna.

The above can be applied to other embodiments.

Third Embodiment

Figure 10:
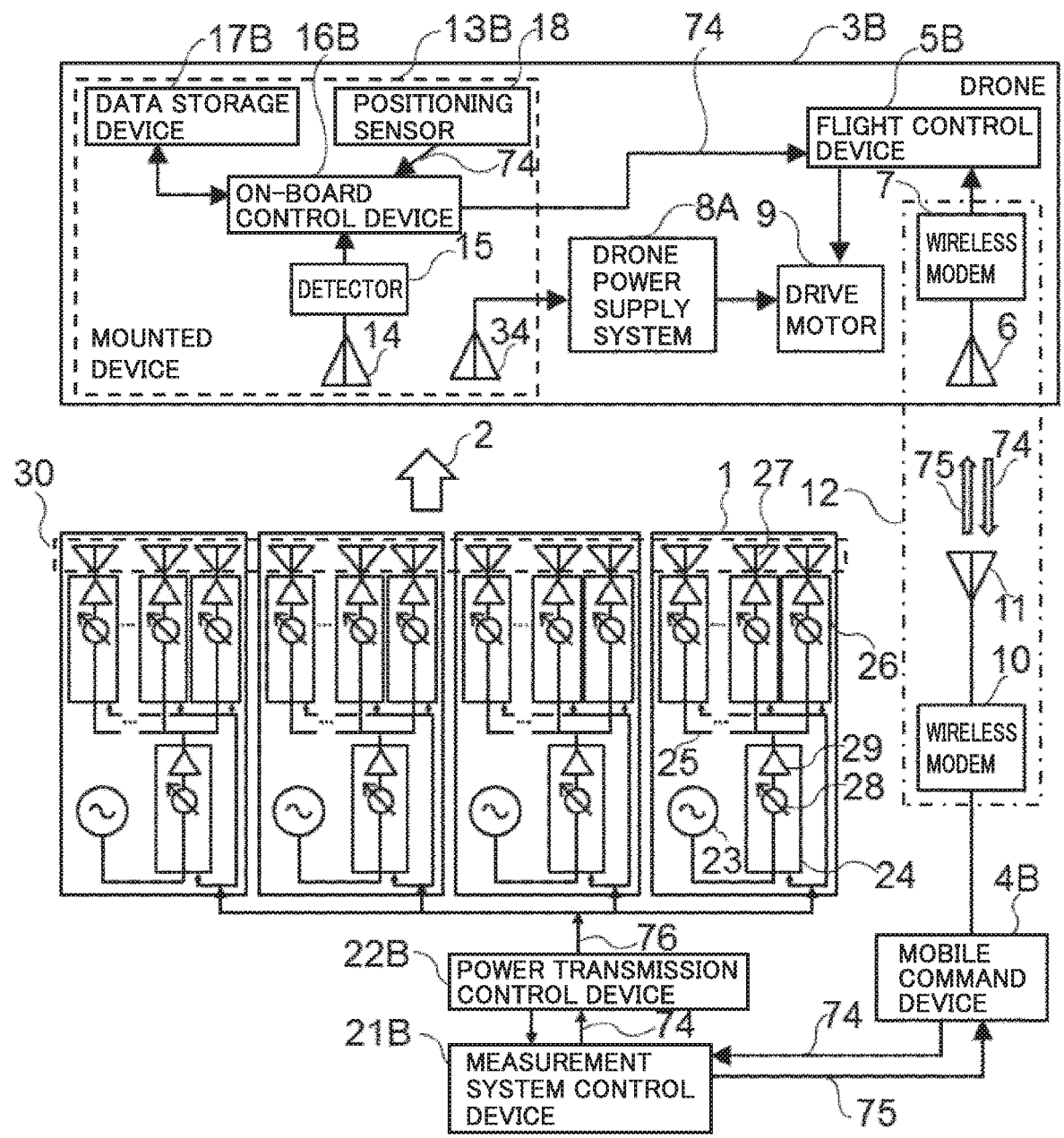
FIG. 10 is a configuration diagram illustrating a power transmission system to an aerial moving body by a wireless power transmission device according to a third embodiment of the present disclosure.

A third embodiment is the case that the second embodiment is changed such that the power transmission device transmits the power toward the aerial moving body by transmitting the position data of the aerial moving body to the power transmission device instead of the pilot signal. With reference to FIG. 10, a configuration of a power transmission system to an aerial moving body by a wireless power transmission device of the third embodiment of the present disclosure is described. FIG. 10 is a configuration diagram illustrating the power transmission system to the aerial moving body by the wireless power transmission device of the third embodiment of the present disclosure.

In FIG. 10, points different from FIG. 7 of the second embodiment are described. Power transmission device 1 is the same as that of the first embodiment. Power transmission device 1 does not include pilot reception antenna 37. Arrival direction detection device 38 does not exist. A drone 3B does not include pilot transmitter 31 and pilot transmission antenna 33. Drone 3B includes positioning sensor 18. Position data 74 measured by positioning sensor 18 is sent to a measurement system control device 21B through an on-board control device 16B, a flight control device 5B, mobile communication system 12, and mobile command device 44. Position data 74 is stored also in data storage device 17B. Positioning sensor 18 may be connected to a flight control device 5B. In this case, position data 74 is sent to power transmission control device 22B though flight control device 5B, mobile communication system 12, a mobile command device 4B, and measurement system control device 21B.

Positioning sensor 18 is a position measurer that measures a mobile position that is the position of drone 3B. Power transmission control device 22B is a radiation direction determiner that determines the direction from position data 74 to the position of drone 3B with respect to power transmission device 1 as the radiation direction. The determined radiation direction is stored as radiation direction data 81. Power transmission control device 22B determines phase and amplitude command values (power transmission control signal 76) for first-stage module 24 and second-stage module 26 such that the power can be transmitted in the radiation direction represented by radiation direction data 81. Power transmission control device 22B controls power transmission device 1 using power transmission control signal 76. A combination of at least a part of the power transmission control device and the power transmission device can be considered also as the wireless power transmission device.

Figure 11:
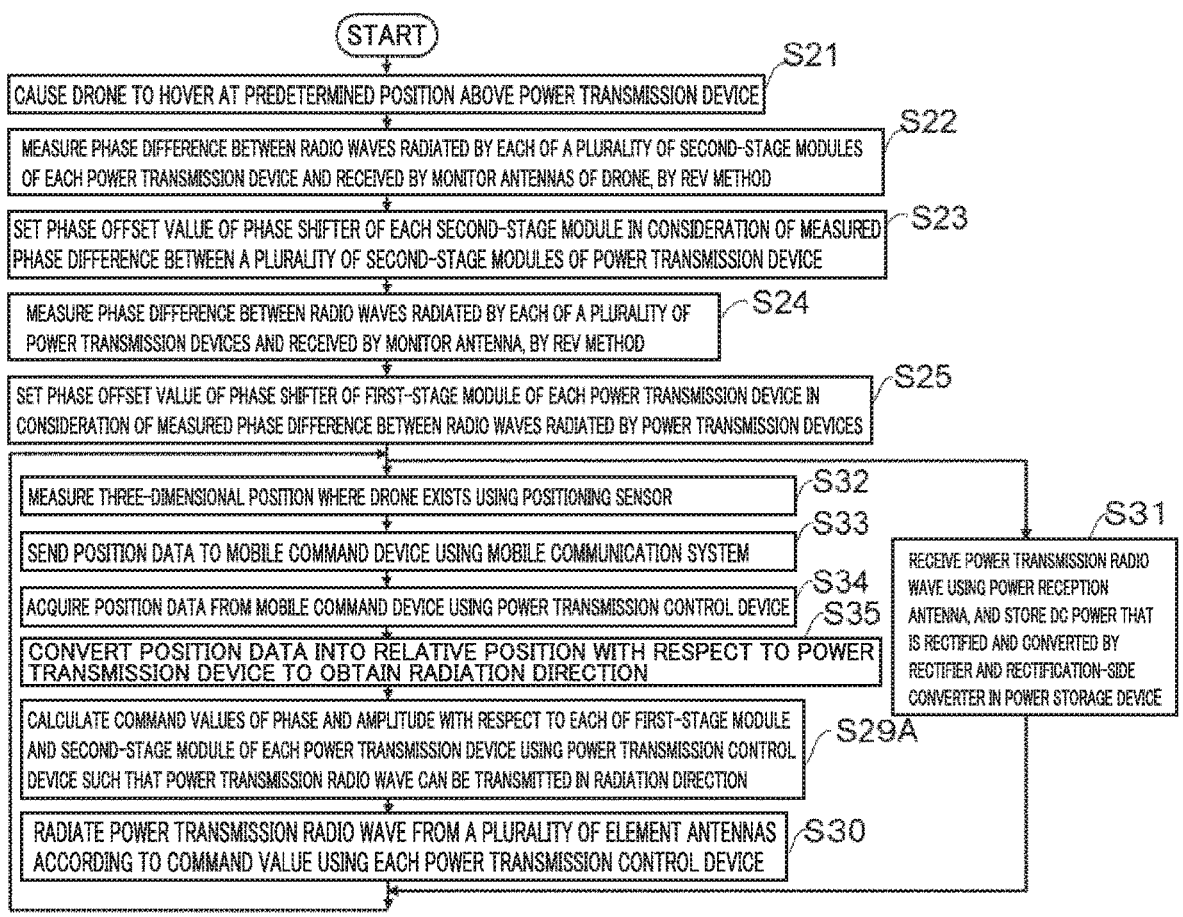
FIG. 11 is a flowchart illustrating a power transmission procedure in the power transmission system to the aerial moving body by the wireless power transmission device of the third embodiment.

The operation is described. FIG. 11 is a flowchart illustrating a power transmission procedure in the power transmission system to the aerial moving body by the wireless power transmission device of the third embodiment. In FIG. 11, points different from FIG. 9 of the second embodiment are described. Steps S26 to S28 are changed to steps S32 to S35. In step S32, positioning sensor 18 measures the three-dimensional position where drone 3B exists. In step S33, measured position data 74 is sent to mobile command device 4B by mobile communication system 12. In step S34, power transmission control device 22B acquires position data 74 from mobile command device 4B through measurement system control device 21B. In step S35, power transmission control device 22B converts position data 74 into a position relative to power transmission device 1, and obtains the radiation direction. In step S29A, power transmission control device 22B calculates power transmission control signal 76 instructing the phase and the amplitude for each of first-stage module 24 and second-stage module 26 of each power transmission device 1A. Power transmission control signal 76 is calculated such that power transmission device 1 can transmit power transmission radio wave 2 toward the radiation direction determined from the position of drone 3B relative to power transmission device 1.

Position data 74 of drone 3B is sent from drone 3B, and power transmission radio wave 2 is radiated in the direction in which drone 3B exists, the direction being obtained from position data 74. Consequently, power reception antenna 34 of drone 3B can receive power transmission radio wave 2 efficiently. In addition to the radiation of power transmission radio wave 2 in the direction in which drone 39 exists, power transmission control signal 76 may be generated such that the beam width of power transmission radio wave 2 is narrowed at the position where drone 3B exists.

The above can be applied to other embodiments.

Fourth Embodiment

Figure 12:
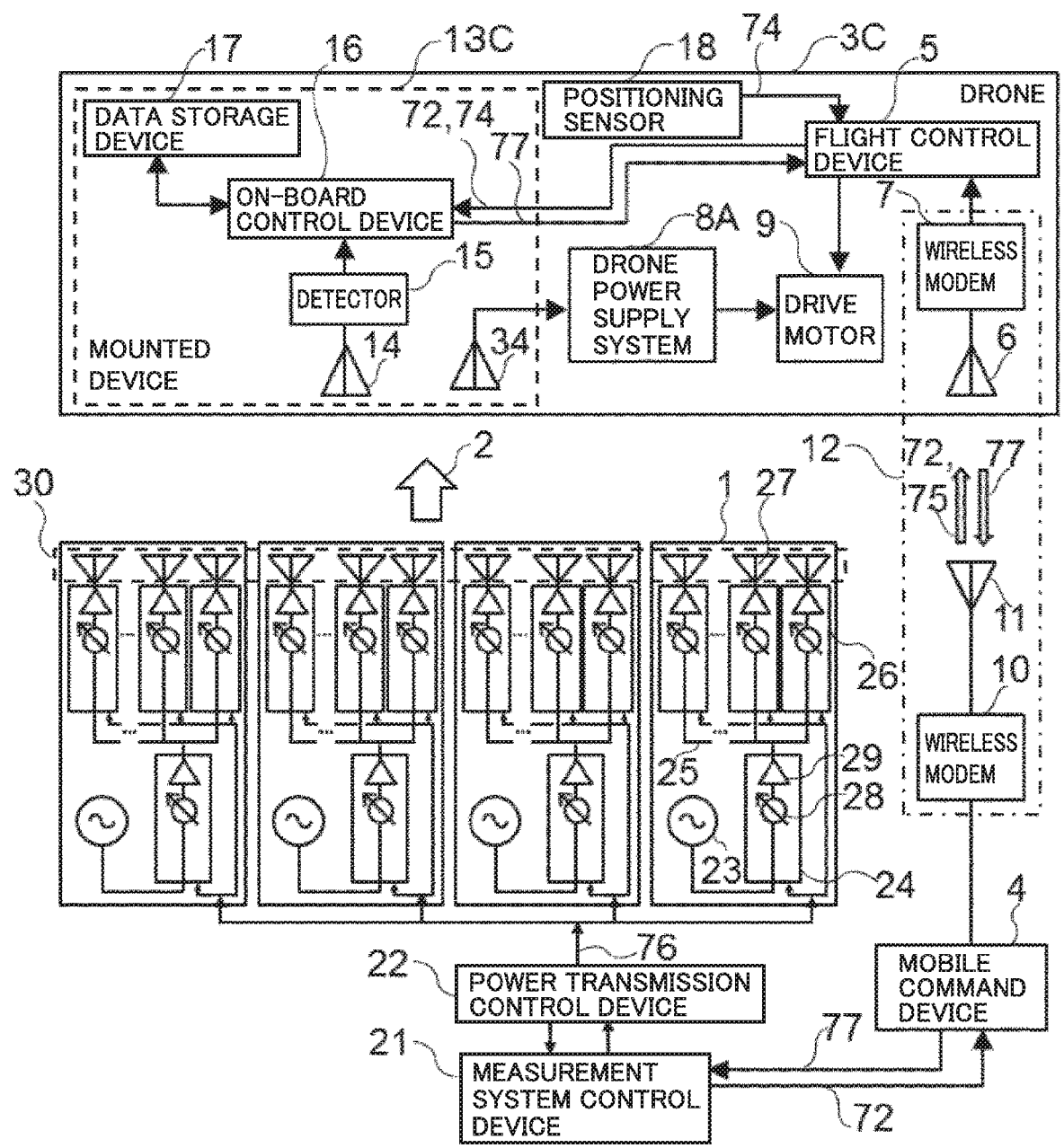
FIG. 12 is a configuration diagram illustrating a radio wave measurement system according to a fourth embodiment of the present disclosure using an aerial moving body and a power transmission system to the aerial moving body by a wireless power transmission device of the fourth embodiment.

A fourth embodiment is the case that the drone that is the aerial moving body measures the beam shape data of the power transmission radio wave radiated by the wireless power transmission device while being supplied the power from the wireless power transmission device. Because the drone receives the supply of the power from the wireless power transmission device, a radio wave measurement system using an aerial moving body of the fourth embodiment is also the power transmission system to the aerial moving body by the wireless power transmission device. With reference to FIG. 12, a configuration of the radio wave measurement system using the aerial moving body of the fourth embodiment of the present disclosure and the power transmission system to the aerial moving body by the wireless power transmission device of the fourth embodiment is described. FIG. 12 is a configuration diagram illustrating the radio wave measurement system using the aerial moving body of the fourth embodiment of the present disclosure and the power transmission system to the aerial moving body by the wireless power transmission device of the fourth embodiment.

In FIG. 12, points different from FIG. 2 of the first embodiment are described. A drone 3C is obtained by changing drone 3 of the first embodiment so as to include power reception antenna 34 and drone power supply system 8A similar to those of the second embodiment. Power transmission device 1 is the same as that of the first embodiment.

Figure 13:
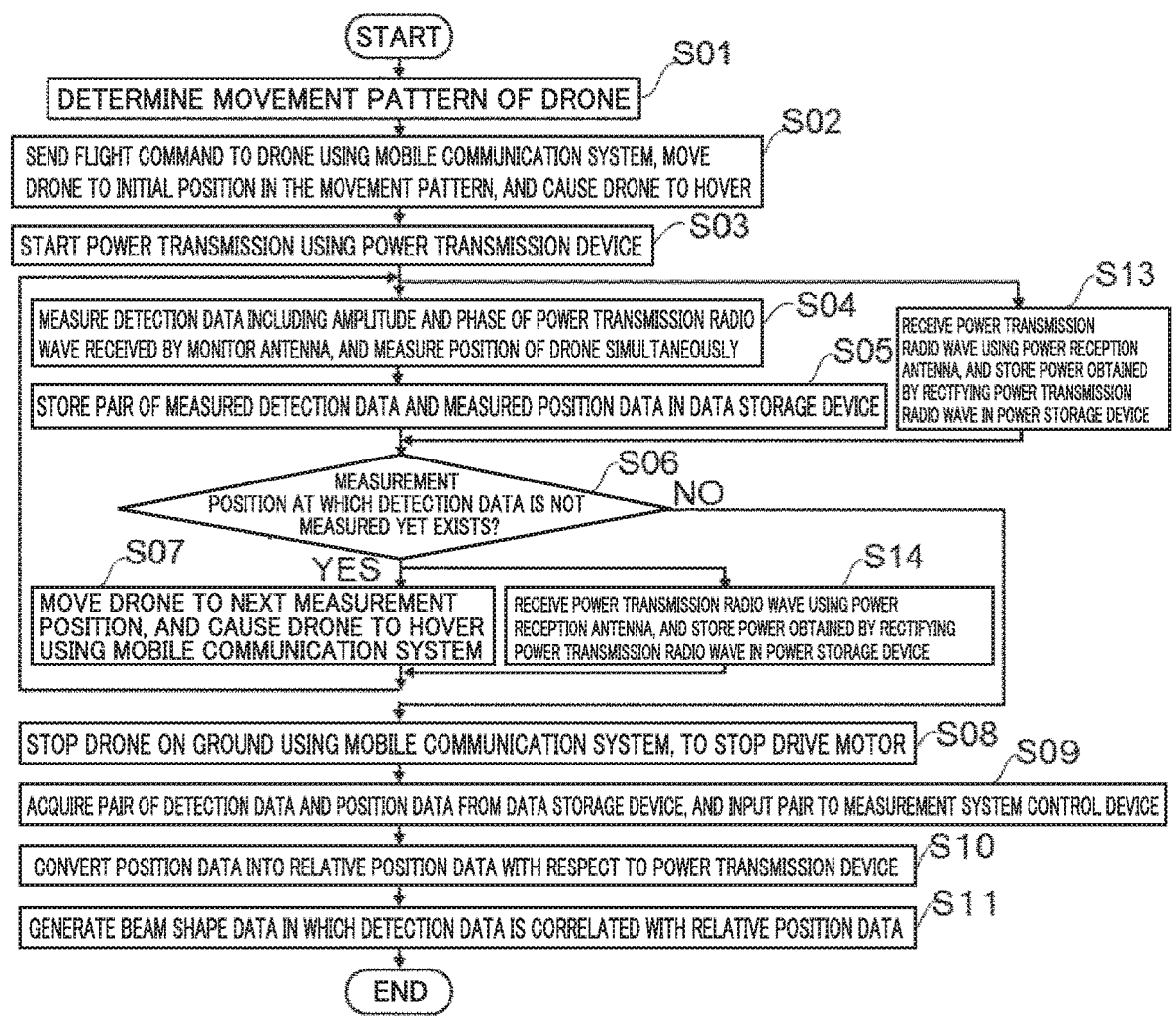
FIG. 13 is a flowchart illustrating a procedure for measuring the radiation pattern of the radio wave in the radio wave measurement system using the aerial moving body of the fourth embodiment and the power transmission system to the aerial moving body by the wireless power transmission device of the fourth embodiment.

The operation is described. FIG. 13 is a flowchart illustrating a procedure for measuring the radiation pattern of the radio wave in the radio wave measurement system using the aerial moving body of the fourth embodiment and the power transmission system to the aerial moving body by the wireless power transmission device of the fourth embodiment. In FIG. 13, points different from FIG. 4 of the first embodiment are described. In parallel to steps S04 to S07, in steps S13 and S14, power transmission radio wave 2 is received by power reception antenna 34, and the power obtained by rectifying received power transmission radio wave 2 using rectifier 35 is stored in power storage device 19. Step S13 operates in parallel to steps S04 and S05. Step S14 operates in parallel to step S07.

Because the beam shape of power transmission device 1 is measured, unlike the second embodiment and the like, power transmission control device 22A does not change the beam direction according to the position where drone 3C exists.

Drone 3C moves or hovers above power transmission device 1 while receiving the supply of the power by power transmission radio wave 2. For this reason, when the time necessary to measure beam shape 71 is longer than the case of the first embodiment, beam shape data 71 of power transmission radio wave 2 can be measured using drone 3C.

Fifth Embodiment

Figure 14:
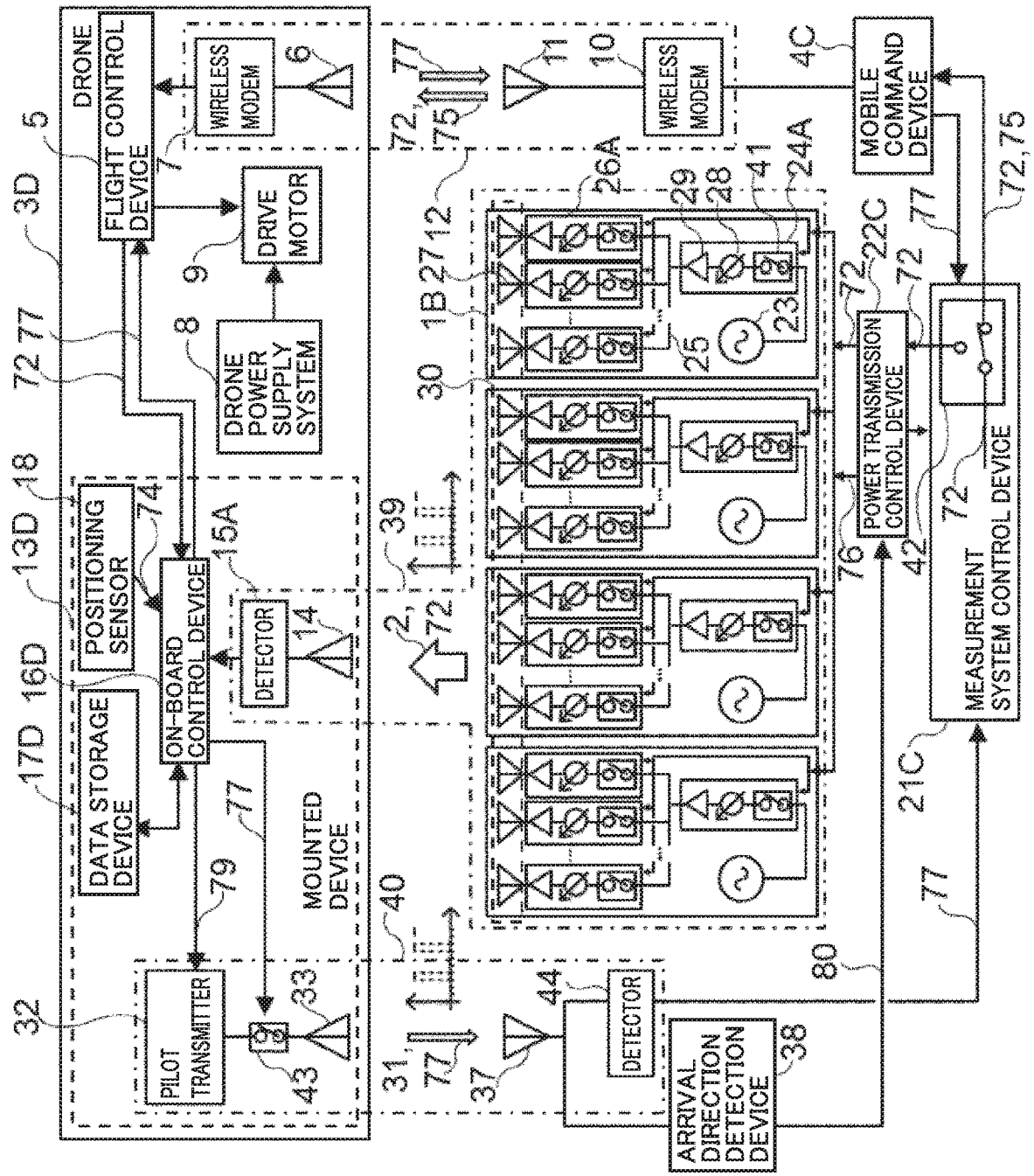
FIG. 14 is a configuration diagram illustrating a radio wave measurement system using an aerial moving body according to a fifth embodiment of the present disclosure.

A fifth embodiment is the case that the first embodiment is changed such that a communication system that communicates a measurement command and detection data for the radio wave measurement between the on-board control device and the measurement system control device is provided in addition to the mobile communication system. With reference to FIG. 14, a configuration of a radio wave measurement system using an aerial moving body according to the fifth embodiment of the present disclosure is described. FIG. 14 is a configuration diagram illustrating the radio wave measurement system using the aerial moving body of the fifth embodiment of the present disclosure. Instead of the first embodiment, the radio wave measurement system of the fourth embodiment or the radio wave measurement system having another configuration and the power transmission system to the aerial moving body may be changed.

A power transmission communication system 39 and a pilot communication system 40 are added in a drone 3D of the fifth embodiment. A measurement system control device 21C sends measurement command 72 to a mounted device 13D mounted on drone 3D, using power transmission communication system 39. Mounted device 13D sends detection data 73 to measurement system control device 21C, using pilot communication system 40. Positioning sensor 18 sends position data 74 to an on-board control device 16D. A data storage device 17D stores data indicating whether or not power transmission communication system 39 and pilot communication system 40 are used.

Power transmission communication system 39 includes a first-stage module 24A, a second-stage module 26A, element antenna 27 of a power transmission device 1B, and monitor antenna 14 and a detector 15A that are mounted on drone 3D. A pulse modulation switch 41 that switches radiation and non-radiation of a power transmission radio wave 2A according to a signal sequence of 0 or 1 representing measurement command 72 is added to first-stage module 24A and second-stage module 26A. That is, measurement command 72 is sent by pulse modulation of power transmission radio wave 2A using detection data 73. Detector 15A demodulates measurement command 72 from the reception or non-reception of received power transmission radio wave 2A. Measurement command 72 may be modulated and demodulated by not the pulse modulation but amplitude modulation or phase modulation such as BPSK (Binary Phase Shift Keying).

Measurement system control device 21C includes a communication system changeover switch 42. Communication system changeover switch 42 switches which one of a mobile command device 4C and a power transmission control device 22C measurement command 72 is sent to. That is, communication system changeover switch 42 switches which one of mobile communication system 12 and power transmission communication system 39 is used. A transmission destination of measurement command 72 may be switched by software.

Pilot communication system 40 includes a pilot transmitter 32, a pilot transmission antenna 33, a pulse modulation switch 43, a pilot reception antenna 37, and a detector 44. Pulse modulation switch 43 is provided between pilot transmitter 32 and pilot transmission antenna 33. Detector 44 detects pilot signal 31 received by pilot reception antenna 37. Pilot transmitter 32, pilot transmission antenna 33, and pulse modulation switch 43 are mounted on drone 3D. Pilot reception antenna 37 and detector 44 are installed on the ground.

Pulse modulation switch 43 switches between the radiation and the non-radiation of pilot signal 31 according to the signal sequence of 0 or 1 representing detection data 73 supplied from on-board control device 16D. That is, detection data 73 is sent by the pulse modulation of pilot signal 31 using detection data 73. Pilot signal 31 received by pilot reception antenna 37 is divided into two, and inputted to arrival direction detection device 38 and detector 44. Detector 44 demodulates detection data 73 from the reception or the non-reception of pilot signal 31. Detection data 73 may be modulated and demodulated by not the pulse modulation but the amplitude modulation or the phase modulation such as BPSK.

Using software, on-board control device 16D switches whether detection data 73 is sent to flight control device 5 or pulse modulation switch 43 is controlled by detection data 73. Consequently, which one of pilot communication system 40 and mobile communication system 12 sends detection data 73 is switched.

Figure 15:
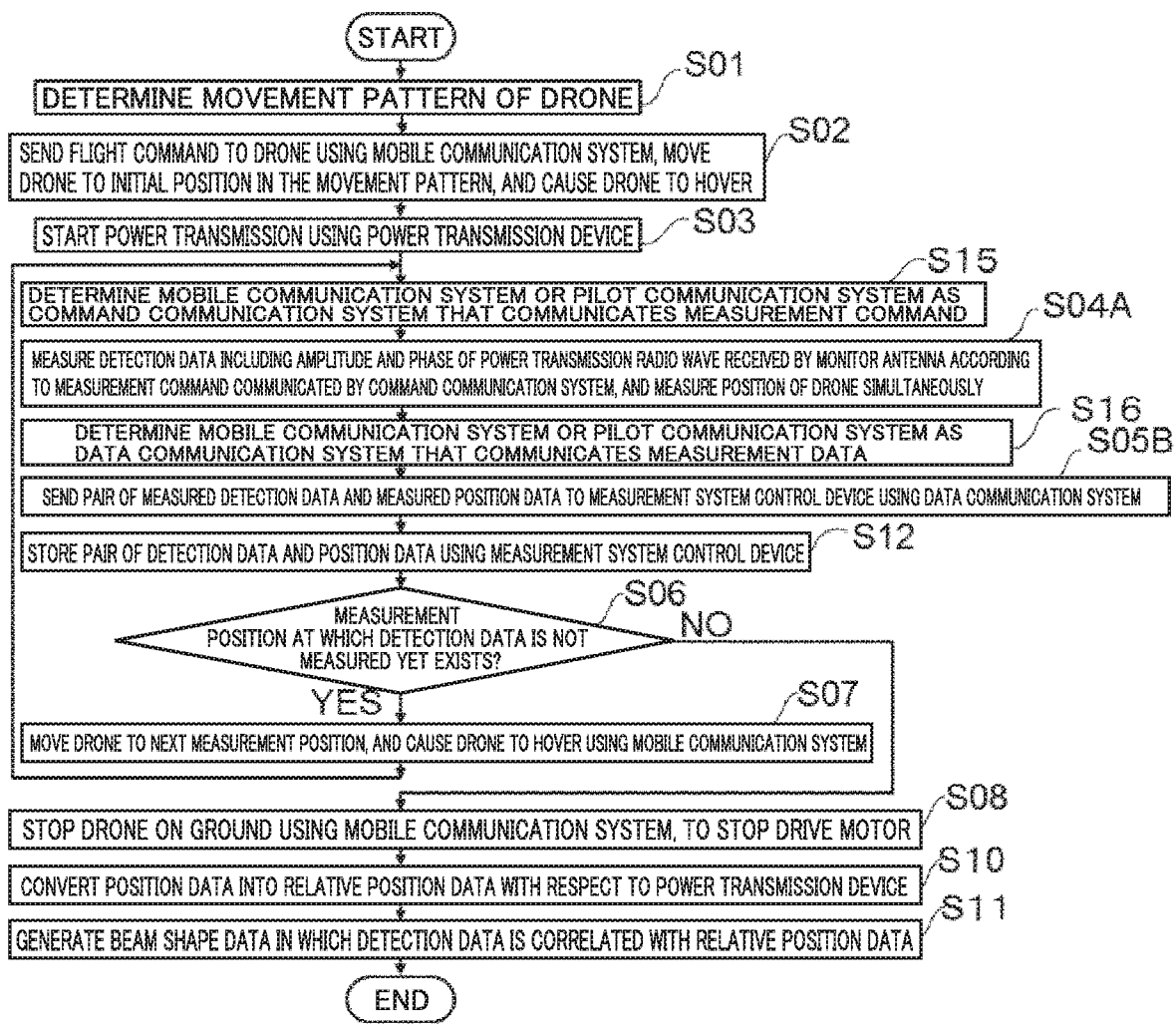
FIG. 15 is a flowchart illustrating a procedure for measuring the radiation pattern of the radio wave in the radio wave measurement system using the aerial moving body of the fifth embodiment.

The operation is described. FIG. 15 is a flowchart illustrating a procedure for measuring the radiation pattern of the radio wave in the radio wave measurement system using the aerial moving body of the fifth embodiment. In FIG. 15, points different from FIG. 5 of the first embodiment are described. At this point, a communication system that communicates measurement command 72 is referred to as a command communication system. A communication system that communicates measurement data 77 is referred to as a data communication system. Step S15 is added between steps S03 and S04A. In step S15, which one of mobile communication system 12 and power transmission communication system 39 is determined as the command communication system. In step S04A, detection data 73 including the amplitude and the phase of power transmission radio wave 2 received by monitor antenna 14 is measured according to measurement command 72 communicated by the command communication system determined in step S15. At the same time, the position of drone 3D is measured. Step S16 is added between steps S04A and S05B. In step S16, which one of mobile communication system 12 and pilot communication system 40 is determined as the data communication system. In step S05B, positioned detection data 70 is sent from on-board control device 16D to measurement system control device 21C through the data communication system determined in step S16.

The command communication system may be determined not every time measurement command 72 is communicated, but every several times. Flight command 75 may be communicated by power transmission communication system 39. Data communication system may be determined not every time measurement data 77 is communicated, but every several times. When communication with mobile communication system 12 is attempted but communication cannot be performed with mobile communication system 12, power transmission communication system 39 may be determined as the command communication system or pilot communication system 40 may be determined as the data communication system.

By providing power transmission communication system 39 and pilot communication system 40, the necessary data can be communicated at a necessary speed when a communication load on mobile communication system 12 is increased to slow the communication. Alternatively, power transmission communication system 39 and pilot communication system 40 can be used when mobile communication system 12 is out of order. Thus, power transmission communication system 39 and pilot communication system 40 contribute to stable operation of the radio wave measurement system greatly. The communication can be performed by the pulse modulation (on and off control of the transmission), the amplitude modulation, and the phase modulation of power transmission radio wave 2 and pilot signal 31 using a simple device. Consequently, the control of the power transmission radio wave and exchange of the data can be performed without adding large hardware and without increasing the load and the power consumption of mobile communication system 12.

Sixth Embodiment

Figure 16:
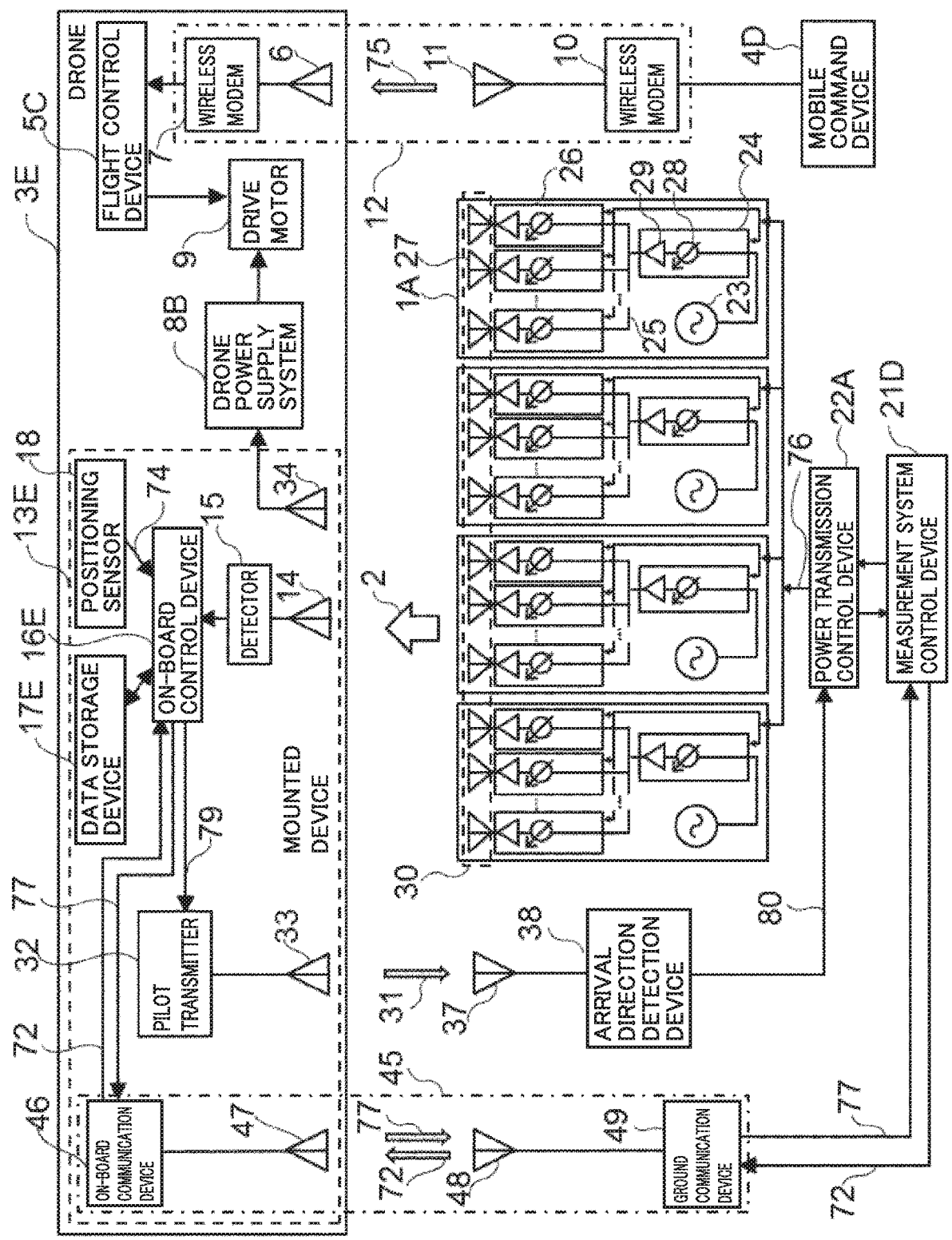
FIG. 16 is a configuration diagram of a radio wave measurement system using an aerial moving body according to a sixth embodiment of the present disclosure and a power transmission system to an aerial moving body by a wireless power transmission device of the sixth embodiment.

A sixth embodiment is the case that the second embodiment that is also the radio wave measurement system is changed such that a measurement communication system that communicates the measurement command and the detection data between the on-board control device and the measurement system control device is provided. In the sixth embodiment, the mobile communication system is not used in order to communicate the measurement command and the detection data between the on-board control device and the measurement system control device. The sixth embodiment is an embodiment of a radio wave measurement system using an aerial moving body and a power transmission system to an aerial moving body by a wireless power transmission device. With reference to FIG. 16, a configuration of the radio wave measurement system using the aerial moving body of the sixth embodiment and the power transmission system to the aerial moving body by the wireless power transmission device of the sixth embodiment is described. FIG. 16 is a configuration diagram illustrating the radio wave measurement system using the aerial moving body of the sixth embodiment and the power transmission system to the aerial moving body by the wireless power transmission device of the sixth embodiment of the present disclosure.

In the configuration of FIG. 16, a measurement communication system 45 is added to the configuration of the second embodiment in FIG. 7. Measurement communication system 45 includes an on-board communication device 46 and an on-board communication antenna 47 that are mounted on a drone 3E and a ground communication antenna 48 and a ground communication device 49 that are installed on the ground. Measurement command 72 from a measurement system control device 21D is sent to drone 3E by measurement communication system 45. Measurement data 77 measured by drone 3E is sent to measurement system control device 21D by measurement communication system 45. Measurement communication system 45 is a communication system different from mobile communication system 12. A data storage device 17E differs from data storage device 17A of the second embodiment in that data storage device 17E also stores data that is necessary for the radio wave measurement system, such as the measurement data 77.

The communication is not allowed between an on-board control device 16E and a flight control device 5C. Only a mounted device 13E is mounted on drone 3E, and no interface with the instrument included in drone 3E exists. Positioning sensor 18 is connected to on-board control device 16E such that position data 74 can be used in the power transmission system.

A mobile command device 4D sends flight command 75 using mobile communication system 12, and controls the flight of drone 3E.

Figure 17:
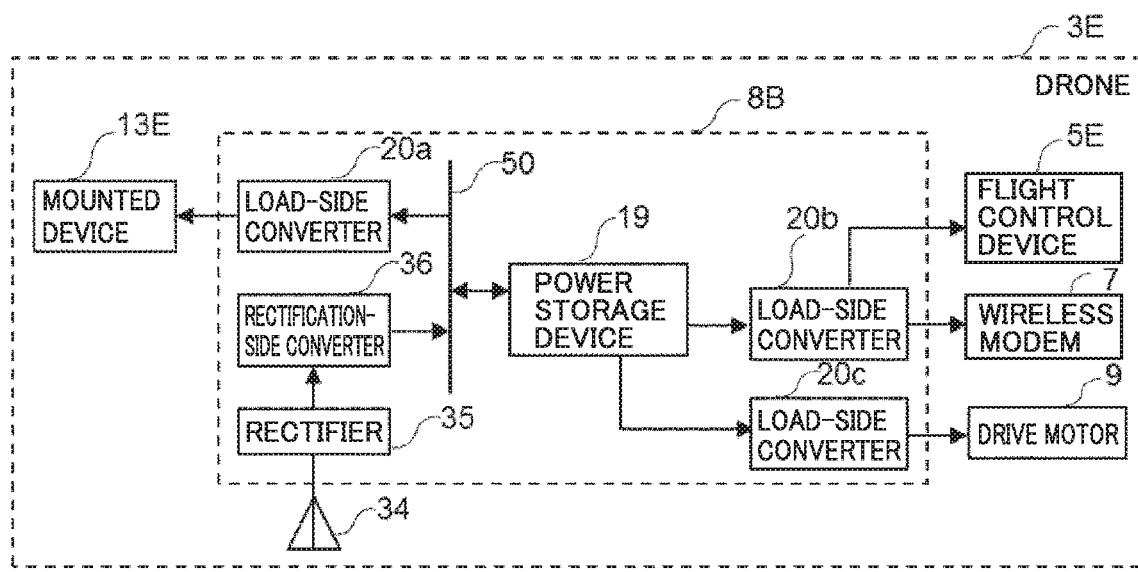
FIG. 17 is a block diagram illustrating a configuration of the radio wave measurement system using the aerial moving body of the sixth embodiment and a power supply system of the aerial moving body that receives power transmitted from the wireless power transmission device of the sixth embodiment.

With reference to FIG. 17, a drone power supply system 8B is described. FIG. 17 is a block diagram illustrating a configuration of the radio wave measurement system using the aerial moving body of the sixth embodiment and the power supply system of the aerial moving body that receives the power transmitted from the wireless power transmission device of the sixth embodiment. The difference between FIGS. 17 and 8 is that a measurement system power supply line 50 is added. Measurement system power supply line 50 is connected to power storage device 19 mounted on drone 3E. Rectification-side converter 36, load-side converter 20b, and load-side converter 20c are connected to power storage device 19 through measurement system power supply line 50. By providing measurement system power supply line 50, the connection point of the power supply system between drone 3E and mounted device 13E can be made only at one place of measurement system power supply line 50. The rectification-side converter may not be provided, and the configuration of the load-side converter may be changed.

The power transmission system to the aerial moving body of the sixth embodiment operates similarly to the second embodiment. The point different from power transmission system of the second embodiment is that the command and data that are used to perform the REV method are communicated using not mobile communication system 12 but measurement communication system 45. The sixth embodiment as the radio wave measurement system operates similarly to the radio wave measurement system of the first embodiment. The sixth embodiment differs from the first embodiment in that measurement communication system 45 is used.

Because transmission and reception of the data between the mounted device and the drone is not necessary, the radio wave measurement system can be constructed without modifying a commercially available drone. The mounted device can be mounted on another drone easily. That the mobile communication system is not used in order to communicate the command for radio wave measurement and the measured data can be applied to other embodiments.

Seventh Embodiment

Figure 18:
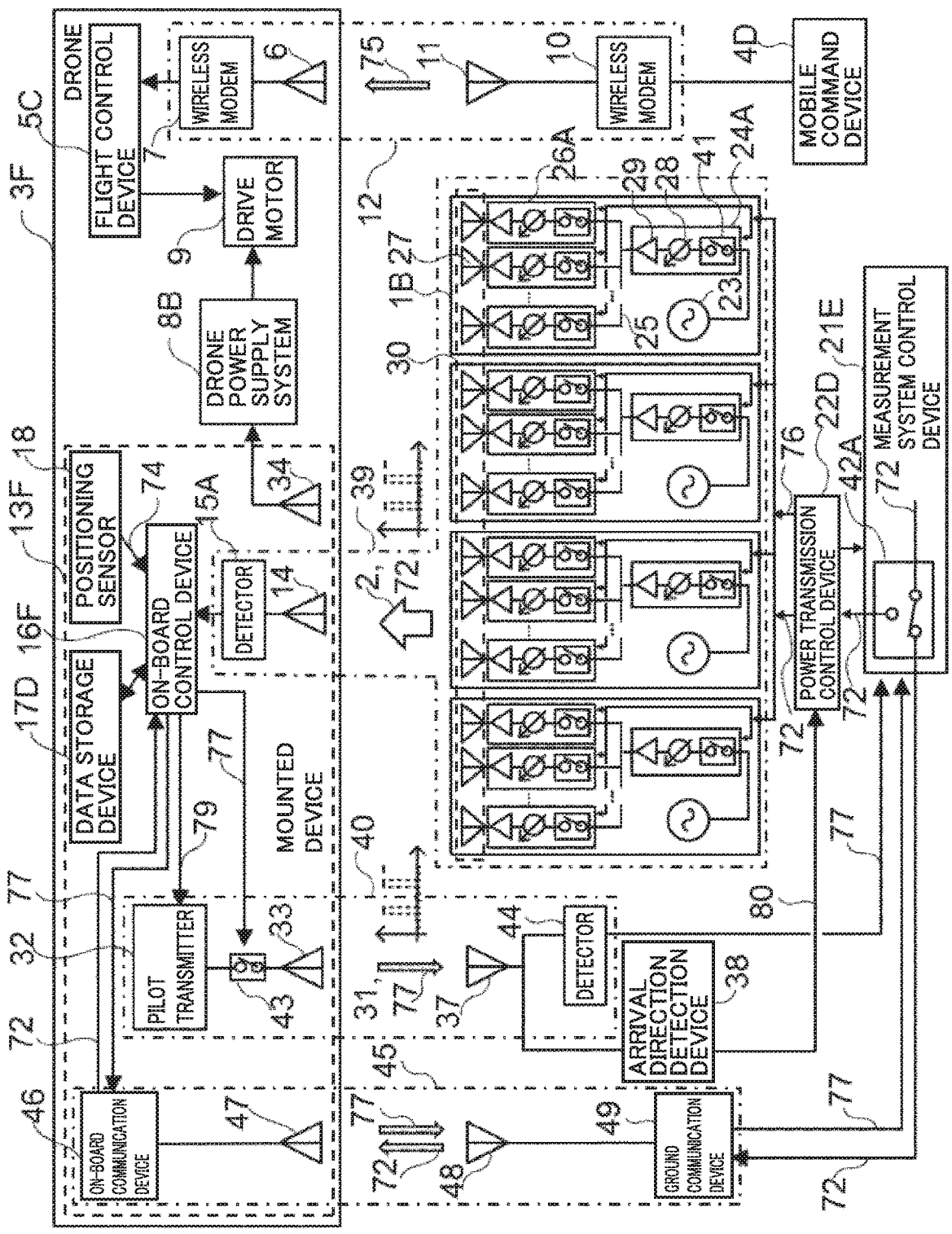
FIG. 18 is a configuration diagram illustrating a radio wave measurement system using an aerial moving body according to a seventh embodiment of the present disclosure and a power transmission system to the aerial moving body by a wireless power transmission device of the seventh embodiment.

A seventh embodiment is the case that the sixth embodiment is changed such that a power transmission communication system and a pilot communication system similar to the fifth embodiment are added. With reference to FIG. 18, a configuration of a radio wave measurement system using an aerial moving body of the seventh embodiment and a power transmission system to an aerial moving body by a wireless power transmission device of the seventh embodiment is described. FIG. 18 is a configuration diagram illustrating the radio wave measurement system using the aerial moving body of the seventh embodiment of the present disclosure and the power transmission system to the aerial moving body by the wireless power transmission device of the seventh embodiment.

The configuration in FIG. 18 is substantially similar to the configuration in FIG. 14 of the fifth embodiment. The configuration in FIG. 18 is different from the configuration in FIG. 14 in the following points. A communication system changeover switch 42A provided in a measurement system control device 21E switches which one of ground communication device 49 and a power transmission control device 22D sends measurement command 72. That is, communication system changeover switch 42A switches which one of measurement communication system 45 and power transmission communication system 39 is used. An on-board control device 16F switches by software whether detection data 73 is sent to on-board communication device 46 or pulse modulation switch 43 is controlled using detection data 73. Consequently, on-board control device 16F switches which one of measurement communication system 45 and pilot communication system 40 sends detection data 73.

The power transmission system to the aerial moving body of the seventh embodiment operates similarly to the second embodiment. The seventh embodiment differs from the second embodiment in that measurement communication system 45 is used instead of mobile communication system 12. The seventh embodiment as the radio wave measurement system operates similarly to the radio wave measurement system of the fifth embodiment. The seventh embodiment differs from the fifth embodiment in that measurement communication system 45 is used.

Because transmission and reception of the data between the mounted device and the drone is not necessary, the radio wave measurement system and/or the power transmission system to the aerial moving body can be constructed without modifying a commercially available drone. Power transmission communication system 39 and pilot communication system 40 can be used when measurement communication system 45 is out of order. Thus, power transmission communication system 39 and pilot communication system 40 contribute to stable operation of the radio wave measurement system and/or the power transmission system greatly.

The mobile communication system may be used for the communication between the on-board control device and the measurement system control device. In this case, because a triple communication system exists between the on-board control device and the measurement system control device, reliability of the communication system is further improved. The same applies to the sixth embodiment.

Eighth Embodiment

Figure 19:
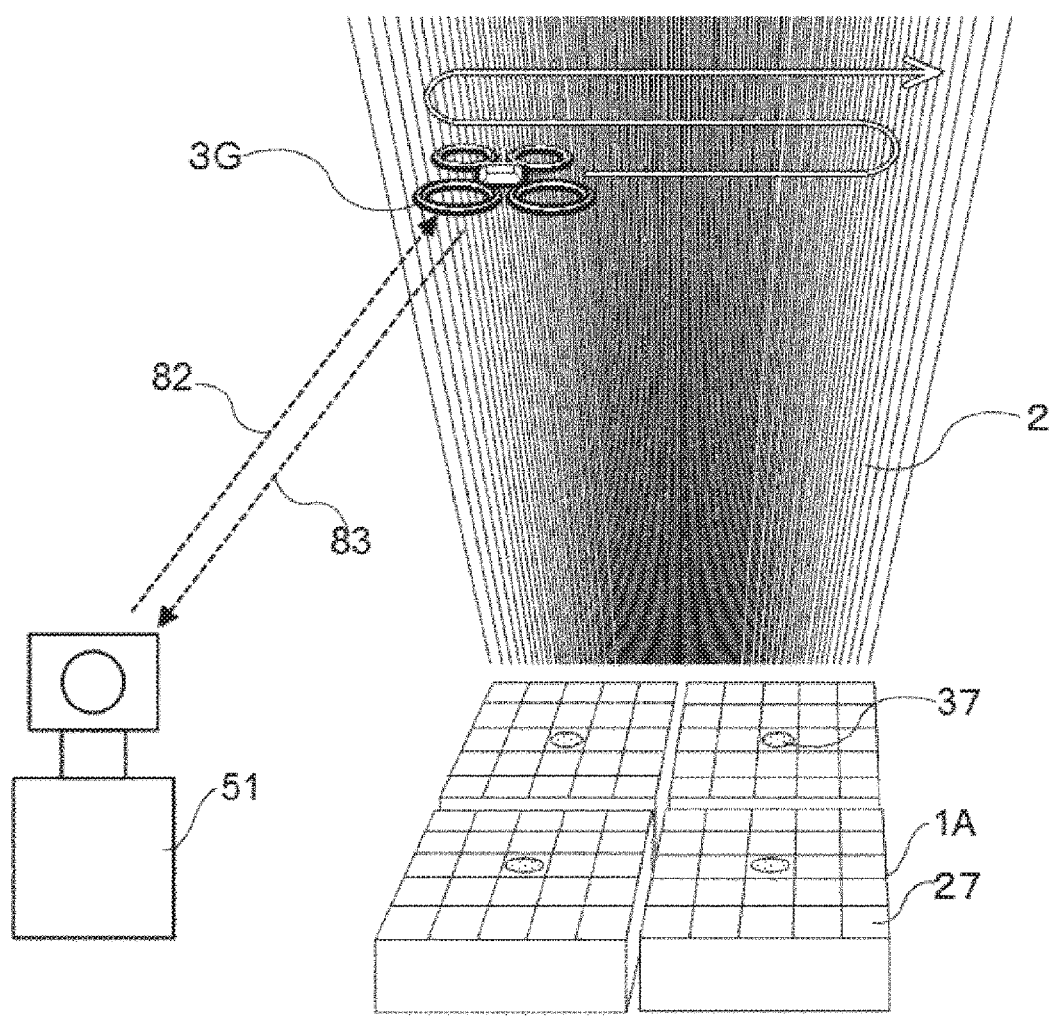
FIG. 19 is a conceptual diagram illustrating a radio wave measurement system using an aerial moving body according to an eighth embodiment of the present disclosure.
Figure 20:
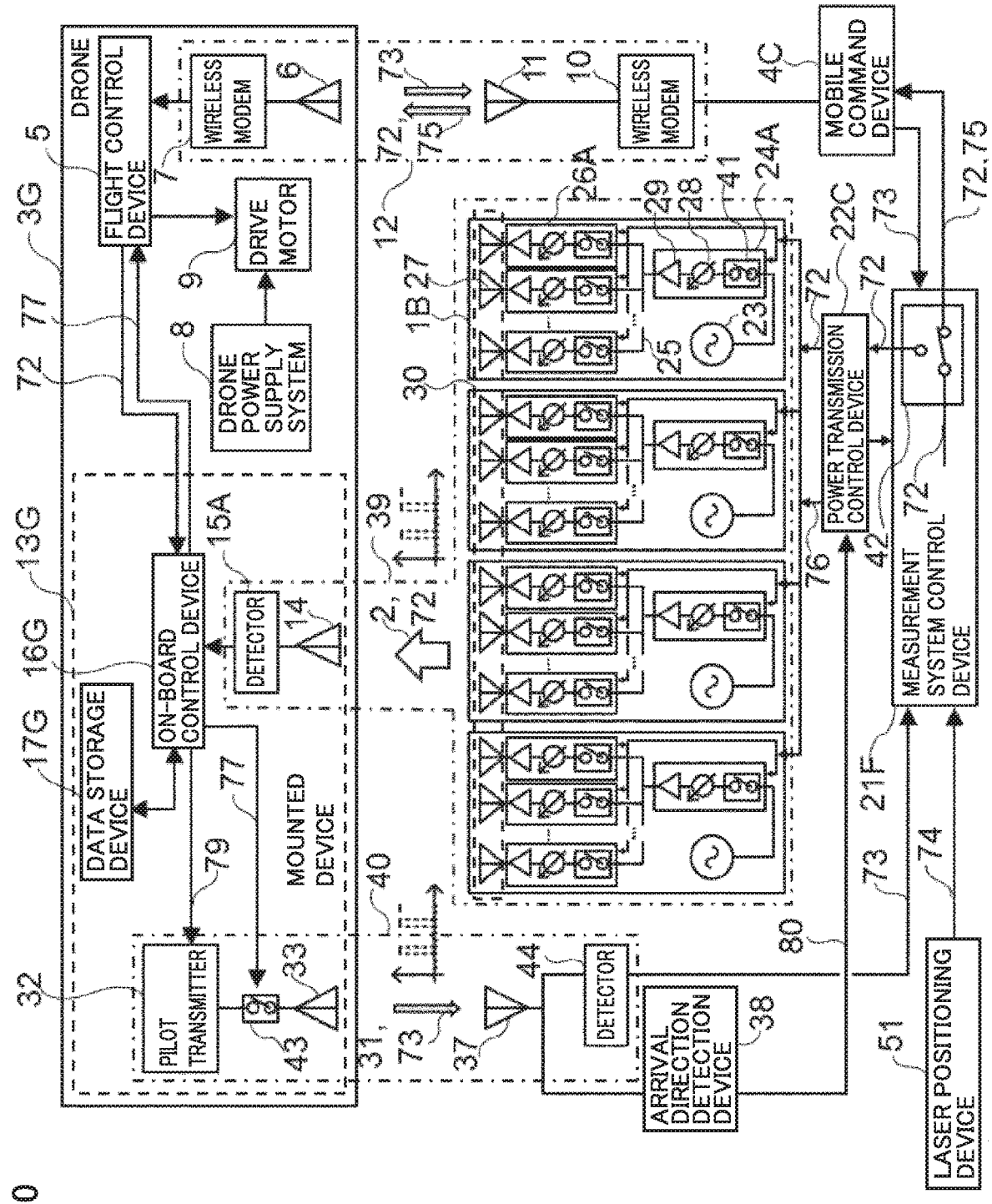
FIG. 20 is a block diagram illustrating the radio wave measurement system using the aerial moving body of the eighth embodiment.

An eighth embodiment is the case that the fifth embodiment is changed such that the position of the aerial moving body is measured by the positioning device installed on the ground. With reference to FIGS. 19 and 20, a configuration of a radio wave measurement system using an aerial moving body according to the eighth embodiment is described. FIG. 19 is a conceptual diagram illustrating the radio wave measurement system using the aerial moving body of the eighth embodiment of the present disclosure. FIG. 20 is a block diagram illustrating the radio wave measurement system using the aerial moving body of the eighth embodiment. Other embodiments can be changed such that the position of the aerial moving body is measured from the ground.

In FIG. 20, points different from FIG. 14 of the fifth embodiment are described. A drone 3G does not include positioning sensor 18. A laser positioning device 51 that measures the position of drone 3G is installed in the vicinity of power transmission device 1B. Position data 74 representing the position of drone 3G and measured by laser positioning device 51 is inputted to a measurement system control device 21F in a fixed period during the radio wave measurement. A data storage device 17G does not store position data 74, and stores the data indicating whether or not power transmission communication system 39 and pilot communication system 40 are used.

Laser positioning device 51 transmits a laser beam 82 in each direction, and receives a reflected laser beam 83 reflected by drone 3G that is the positioning target. The direction in which drone 3G exists is determined from the direction of reflected laser beam 83, and a distance to drone 3G is determined from the time until reflected laser beam 83 is received since laser beam 82 is radiated. The three-dimensional position of drone 3G is determined by converting the measured direction and distance. The radio wave may be used instead of the laser beam in the positioning device that measures the position of drone 3G.

Figure 21:
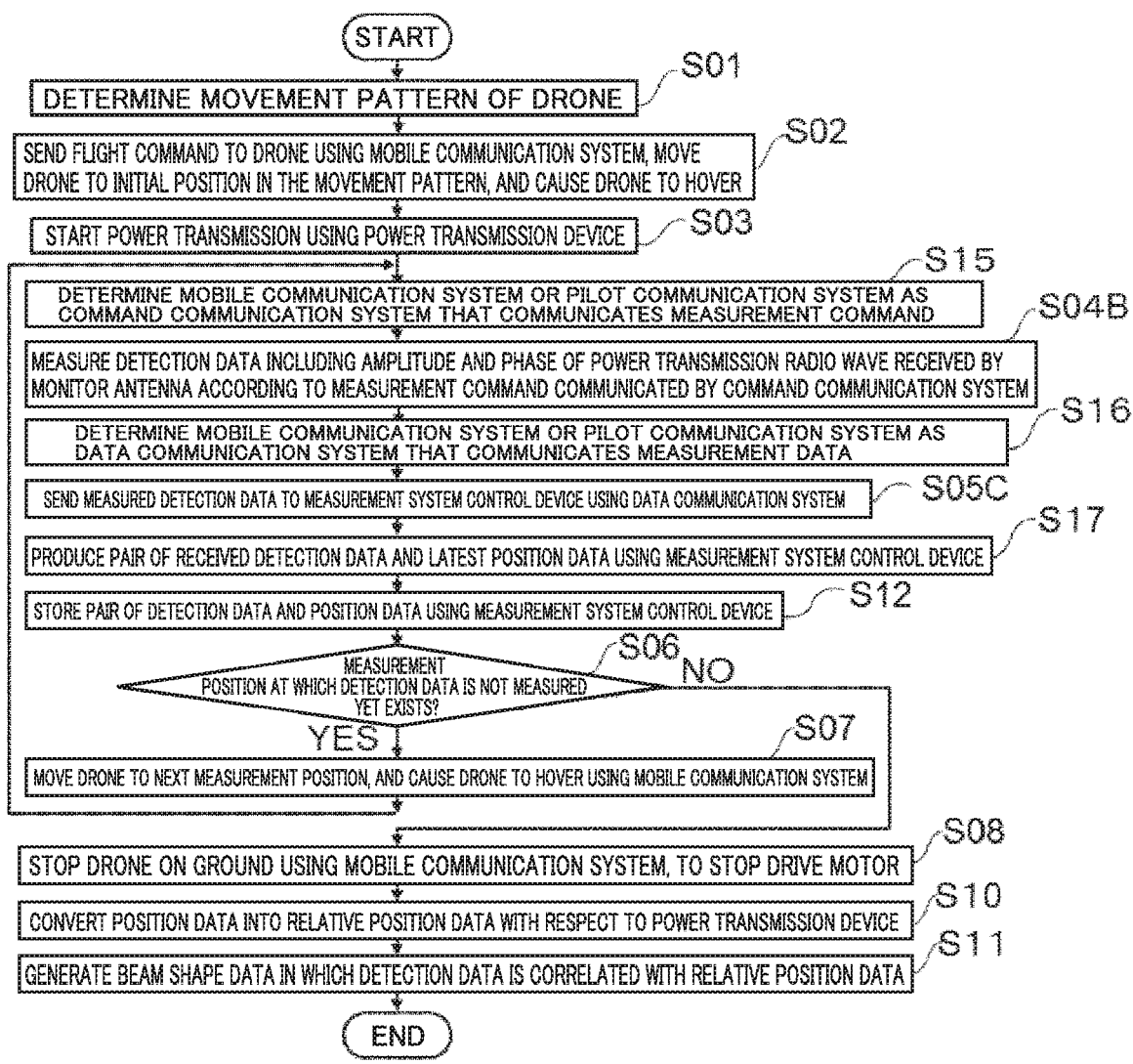
FIG. 21 is a flowchart illustrating a procedure for measuring the radiation pattern of the radio wave in the radio wave measurement system using the aerial moving body of the eighth embodiment.

The operation is described. With reference to FIG. 21, the operation of the radio wave measurement system is described. FIG. 21 is a flowchart illustrating a procedure for measuring the radiation pattern of the radio wave in the radio wave measurement system using the aerial moving body of the eighth embodiment.

In FIG. 21, points different from FIG. 15 of the fifth embodiment are described. In step S04B, drone 3G does not measure position data 74. In step S05C, measurement data 77 including measured detection data 73 is sent from an on-board control device 16G to flight control device 5, and sent to measurement system control device 21F through mobile communication system 12 and mobile command device 4C. In step S17, measurement system control device 21F combines detection data 73 included in received measurement data 77 and latest position data 74 to produce positioned detection data 70.

As in the fifth embodiment, in the radio wave measurement system, transmission radio wave 2 is radiated upward from power transmission device 1, and beam shape data 71 of power transmission radio wave 2 is measured above power transmission device 1 using drone 3G that is the aerial moving body. Consequently, beam shape data 71 of power transmission radio wave 2 of power transmission device 1 can accurately be measured while an influence of reflection is reduced.

Because drone 3G does not include the positioning sensor, drone 3G does not use the power in order to measure the own position. Because position data 74 is not sent from drone 3G, it is not necessary to consume the power required to send position data 74. Thus, drone 3G can fly for a longer time than the case of the fifth embodiment.

Ninth Embodiment

Figure 22:
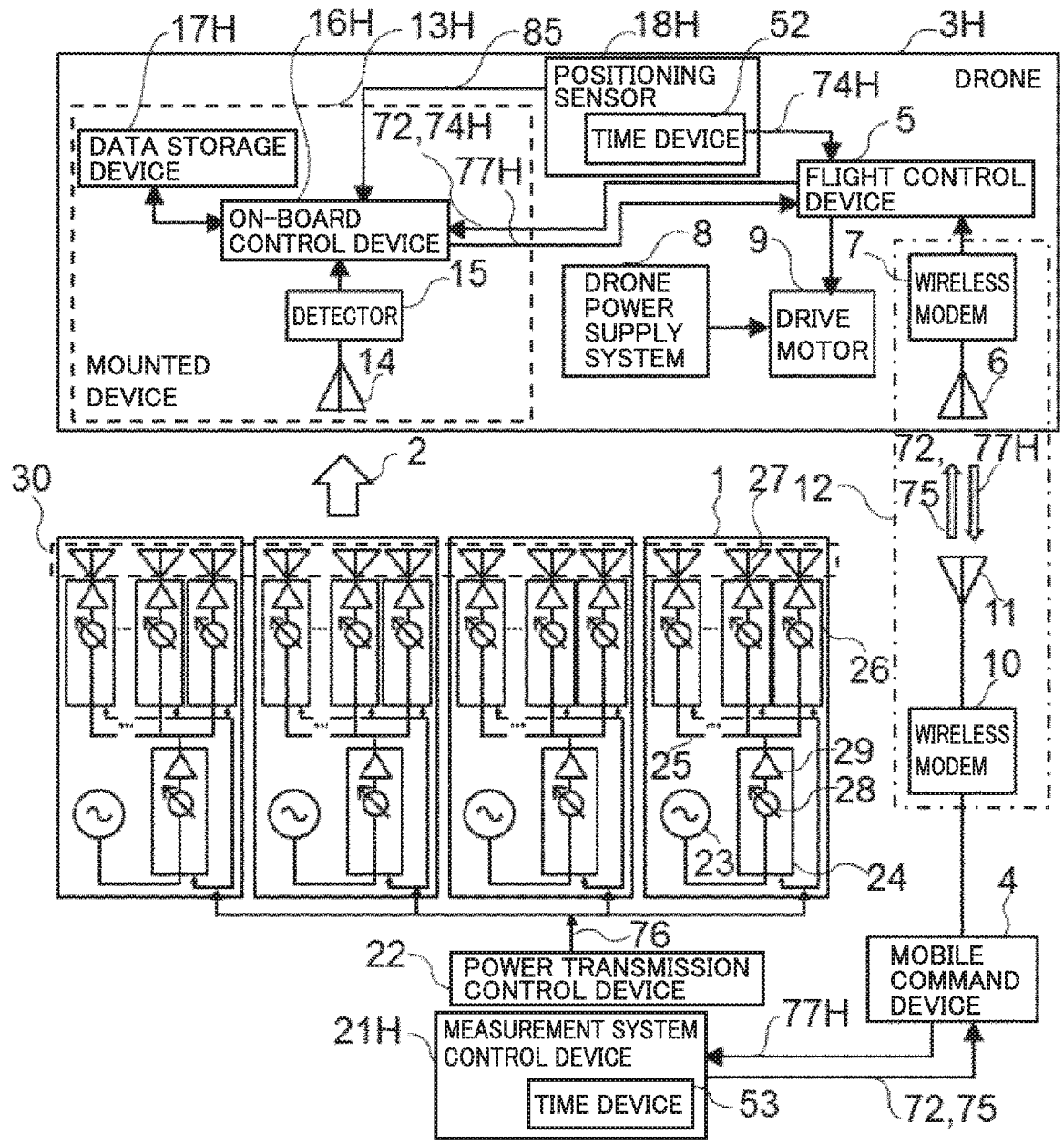
FIG. 22 is a configuration diagram illustrating a radio wave measurement system using an aerial moving body according to a ninth embodiment of the present disclosure.
Figure 23:
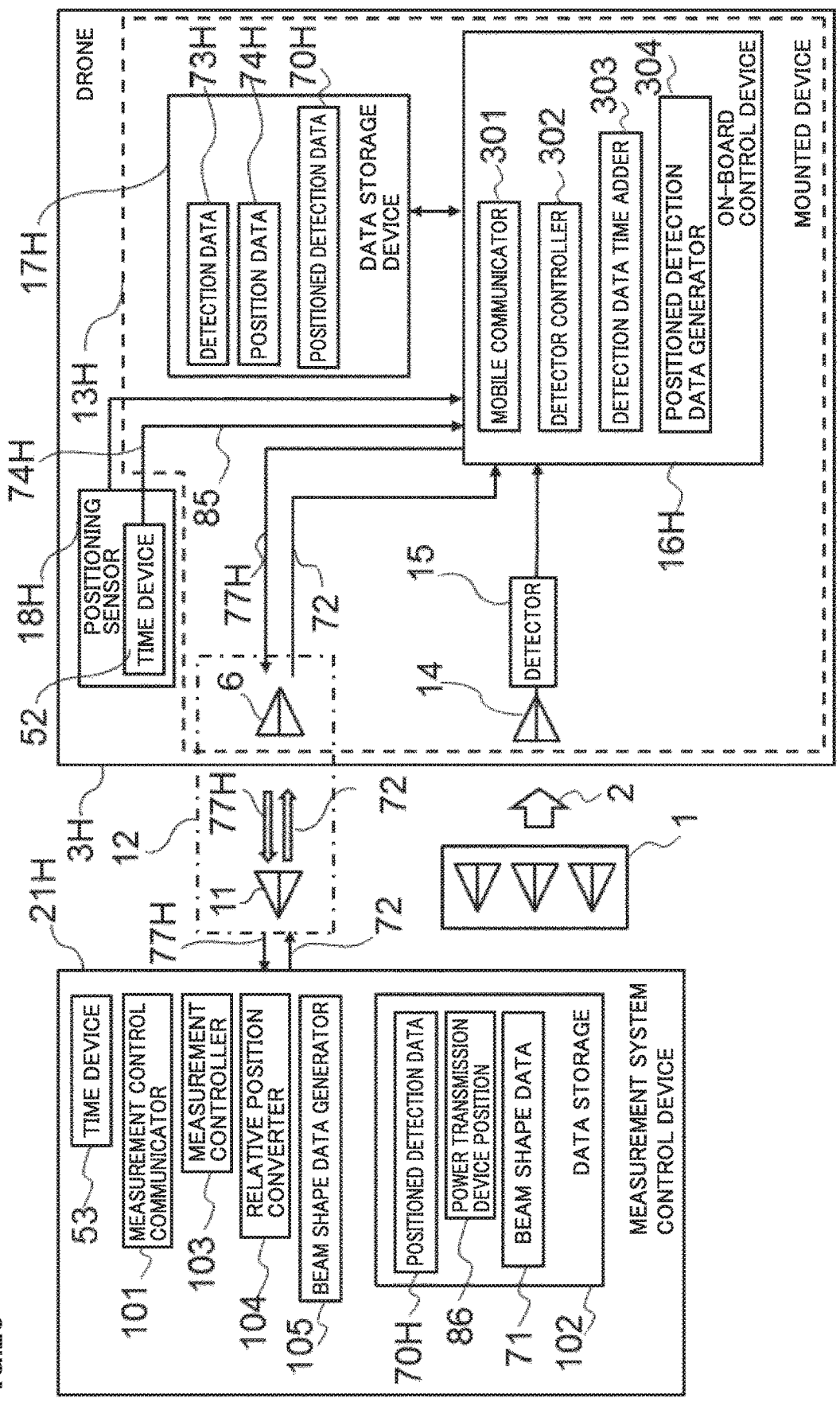
FIG. 23 is a view illustrating an internal configuration of a measurement system control device and an on-board control device in the radio wave measurement system using the aerial moving body of the ninth embodiment.

A ninth embodiment is the case that the first embodiment is changed such that the aerial moving body and the ground-side device are equipped with time devices synchronized with each other. With reference to FIGS. 22 and 23, a configuration of a radio wave measurement system using an aerial moving body according to the ninth embodiment is described. FIG. 22 is a configuration diagram illustrating the radio wave measurement system using the aerial moving body of the ninth embodiment of the present disclosure. FIG. 23 is a view illustrating an internal configuration of the measurement system control device and the on-board control device in the radio wave measurement system using the aerial moving body of the ninth embodiment. In FIG. 23, components having a small relationship with the measurement system control device and the on-board control device are omitted. The same applies to the subsequent drawings illustrating the internal configuration of the on-board control device and the like.

As illustrated in FIG. 22, a mounted device 13H mounted on a drone 3H includes monitor antenna 14, detector 15, an on-board control device 16H, and a data storage device 17H. Drone 3H also includes a time device 52 that generates time synchronized with the ground-side facility. A time management function, a positioning sensor 18H that measures the own position, of a GPS receiver is used as time device 52. In a GPS (Global Positioning System), the GPS receiver receives the radio waves from at least four GPS satellites to measure the own position, and measures an arrival time. For this reason, in the GPS satellite and the GPS receiver, the time is synchronized with required accuracy. It is said that a time error of the GPS receiver is less than or equal to 50 nanoseconds. A measurement system control device 21H also includes a time device 53 that generates the time synchronized with time device 52. Time device 53 also uses the GPS receiver. Time device 52 is a mobile time device mounted on the aerial moving body. Time device 53 is a ground time device that is installed on the ground and that outputs time data synchronized with time device 52.

The GPS receiver that is time device 53 of measurement system control device 21H has the positioning function, but does not operate the positioning function. For this reason, not the GPS receiver but the time device having a function of receiving a GPS signal from a GPS satellite to synchronize the time may be used as time device 53.

A device different from the GPS receiver may be used as time device 52 and time device 53 as long as the device outputs synchronized time data. The positioning system other than the GPS may be a positioning system including a positioning device that measures the own position by receiving the radio waves from a plurality of satellites. A positioning device used in such a positioning system may be used as the positioning device that is used also as the time device. In the ninth embodiment, the times of time device 52 and time device 53 are calibrated by the radio wave from the satellite. The time device mounted on the drone and the time device installed on the ground may be calibrated by a method different from the method using the radio wave from the satellite to achieve the time synchronization.

Power transmission control device 22 and mobile command device 4 may include the time device that generates the synchronized time. It is assumed that the time device included in power transmission control device 22 and mobile command device 4 is similar to time device 53.

Positioning sensor 18H generates position data 74H to which time data managed by time device 52 is added. Position data 74H is time-added measurement point data to which the time data at the point of time when position data 74 is generated is added. Positioning sensor 18H is a measurement point data time adder that generates the time-added measurement point data. Position data 74H is sent to flight control device 5, and further sent to on-board control device 16H. Time data 85 outputted from time device 52 is inputted to on-board control device 16H.

As illustrated in FIG. 23, on-board control device 16H includes a mobile communicator 301, a detector controller 302, a detection data time adder 303, and a positioned detection data generator 304. Mobile communicator 301 receives measurement command 72. Received measurement command 72 is sent to detector controller 302. When the start of the measurement of detection data 73 is instructed by measurement command 72, detector controller 302 controls detector 15 such that detection data 73 is sent to on-board control device 16H.

Detection data time adder 303 included in on-board control device 16H adds time data 85 to detection data 73 outputted from detector 15, and generates detection data 73H. Detector 15 outputs detection data 73 as soon as detection data 73 is measured, and the distance between detector 15 and on-board control device 16H is several tens of centimeter at the longest. For this reason, the time until detection data 73 is received by on-board control device 16H since detection data 73 is measured by detector 15 is a minute value and may not be considered. The time when on-board control device 16H receives detection data 73 is set to the time when the detector 15 measures detection data 73.

Detection data 73H is time-added received radio wave data in which the time data outputted from time device 52 at the point of time detection data 73 is measured to detection data 73 that is the received radio wave data. Detection data time adder 303 is a received radio wave data time adder that generates time-added received radio wave data.

Positioned detection data generator 304 generates positioned detection data 70H by pairing detection data 73H and position data 74H to which identical time data 85 is attached. Positioned detection data 70H is stored in data storage device 17. Positioned detection data 70H may be sent to measurement system control device 21H through mobile communication system 12. The term of identical time data 85 means that the difference between time data 85 is less than or equal to a determined tolerance.

Detection data 73H, position data 74H, and positioned detection data 70H are stored in data storage device 17H.

Measurement system control device 21H includes time device 53, a measurement control communicator 101, a data storage 102, a measurement controller 103, a relative position converter 104, and a beam shape data generator 105. Measurement control communicator 101 sends measurement command 72 to on-board control device 16H. When positioned detection data 70 is sent from drone 3H, measurement control communicator 101 receives measurement data 77H including positioned detection data 70H. A power transmission device position 86, positioned detection data 70H, and beam shape data 71 are stored in data storage 102. Power transmission device position 86 is data representing the position where power transmission device 1 exists. When power transmission device position 86 is subtracted from position data 74 in positioned detection data 70H, relative position data 78 is obtained.

Measurement controller 103 generates measurement command 72 and flight command 75 that are sent to drone 3H. When positioned detection data 70H is measured in response to measurement command 72, beam shape data generator 105 is activated to generate beam shape data 71. Relative position converter 104 subtracts power transmission device position 86 from position data. 74 in positioned detection data 70H to obtain relative position data 78. Beam shape data generator 105 generates beam shape data 71 in which relative position data 78 converted from position data 74 is correlated with detection data 73. Beam shape data generator 105 is a radiated radio wave data generator that generates relative position data 78 and the radiated radio wave data including detection data 73.

Figure 24:
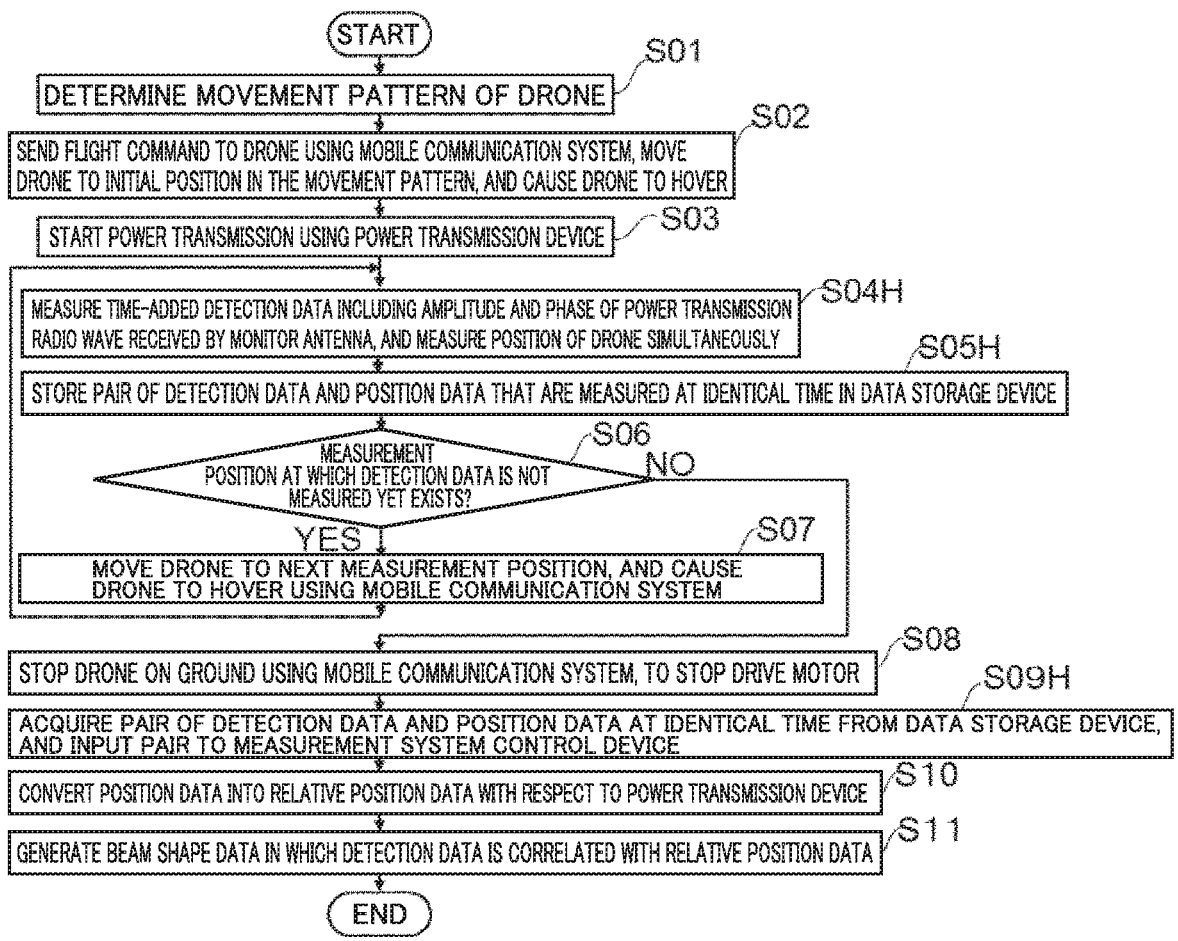
FIG. 24 is a flowchart illustrating a procedure for measuring the radiation pattern of the radio wave in the radio wave measurement system using the aerial moving body of the ninth embodiment.

The operation is described. FIG. 24 is a flowchart illustrating a procedure for measuring the radiation pattern of the radio wave in the radio wave measurement system using the aerial moving body of the ninth embodiment. In FIG. 24, points different from FIG. 4 of the first embodiment are described. In step S04H, detection data time adder 303 of on-board control device 16H generates detection data 73H (including time data 85) by adding time data 85 at the point of time when detection data 73 is inputted to detection data time adder 303, to detection data 73 outputted from detector 15. Position data 74H (including time data 85) measured by positioning sensor 18H is sent to on-board control device 16H.

In step S05H, positioned detection data generator 304 of on-board control device 16H generates positioned detection data 70H by combining position data 74H to which time data 85 identical to detection data 73H is given. Positioned detection data 70H is stored in data storage device 17. Time data 85 outputted from time device 52 is added to both detection data 73H and position data 74H. Consequently, when the times of time device 52 and time device 53 are not synchronized with each other, measurement system control device 21H can generate positioned detection data 70H by combining detection data 73H having identical time data 85 and position data 74H.

In step S09H, positioned detection data 70H is obtained from data storage device 17, and inputted to measurement system control device 21H. Beam shape data generator 105 of measurement system control device 21H generates beam shape data 71 from positioned detection data 70H.

In the radio wave measurement system of the ninth embodiment, positioned detection data 70H is generated based on time data 85, so that positioned detection data 70H and beam shape data 71 can be generated with higher accuracy than the conventional technique.

Figure 25:
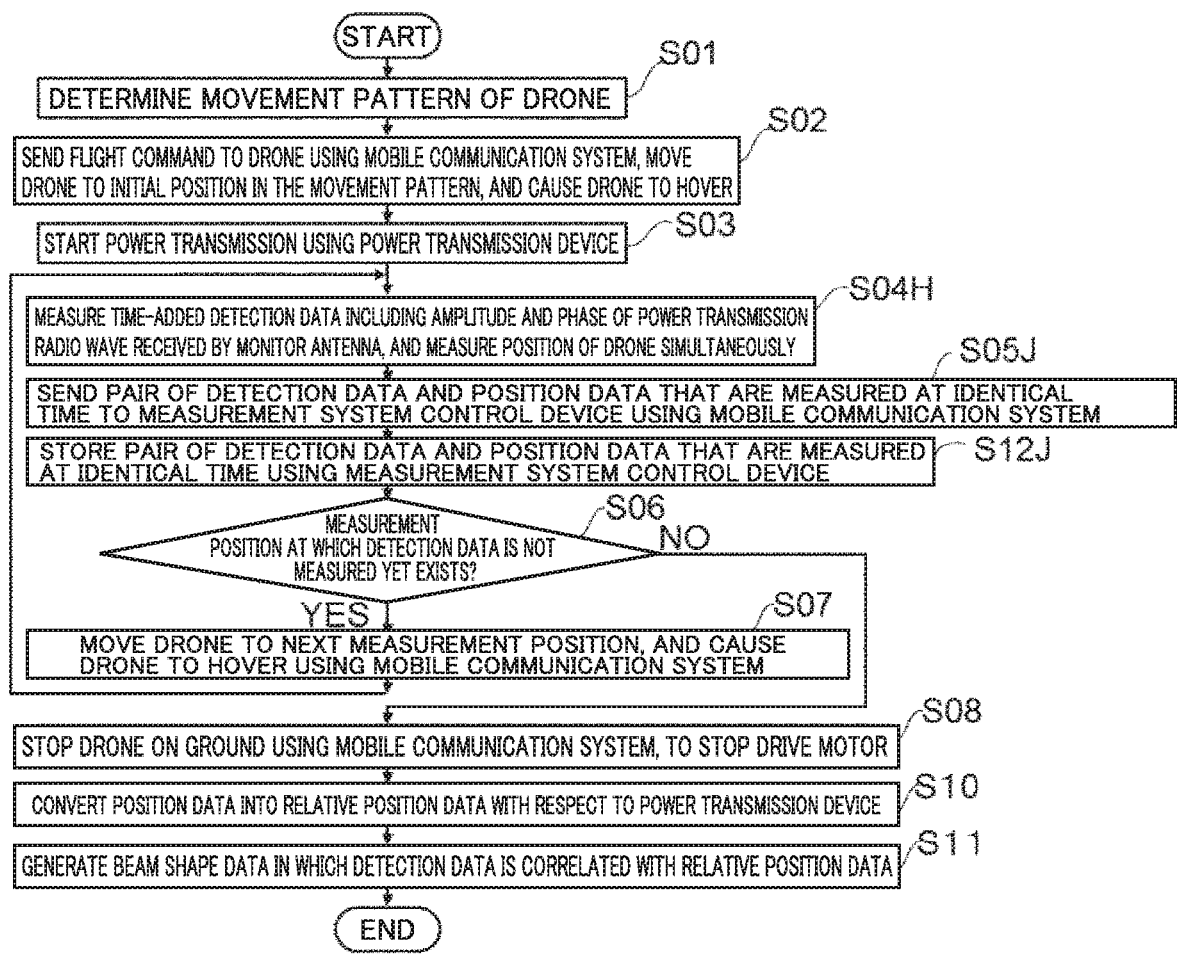
FIG. 25 is a flowchart illustrating another procedure for measuring the radiation pattern of the radio wave in the radio wave measurement system using the aerial moving body of the ninth embodiment.

Positioned detection data 70H can also be sent to measurement system control device 21H while drone 3H flies. With reference to FIG. 25, the operation in that case is described. FIG. 25 is a flowchart illustrating another procedure for measuring the radiation pattern of the radio wave in the radio wave measurement system using the aerial moving body of the ninth embodiment. In FIG. 25, points different from FIG. 5 of the first embodiment are described. Step S04H is similar to that in FIG. 24. In step S05J, mobile communicator 301 of on-board control device 16H sends generated positioned detection data 70H to measurement system control device 21H. In step S12J, measurement system control device 21H stores received positioned detection data 70H in data storage 102.

In the processing of FIG. 25, positioned detection data 70H and beam shape data 71 can be generated with higher accuracy than the conventional technique.

The ninth embodiment has the effect similar to that of the first embodiment. The detection data and the position data are combined using the synchronized time data, so that the beam shape can be measured more accurately.

Tenth Embodiment

Figure 26:
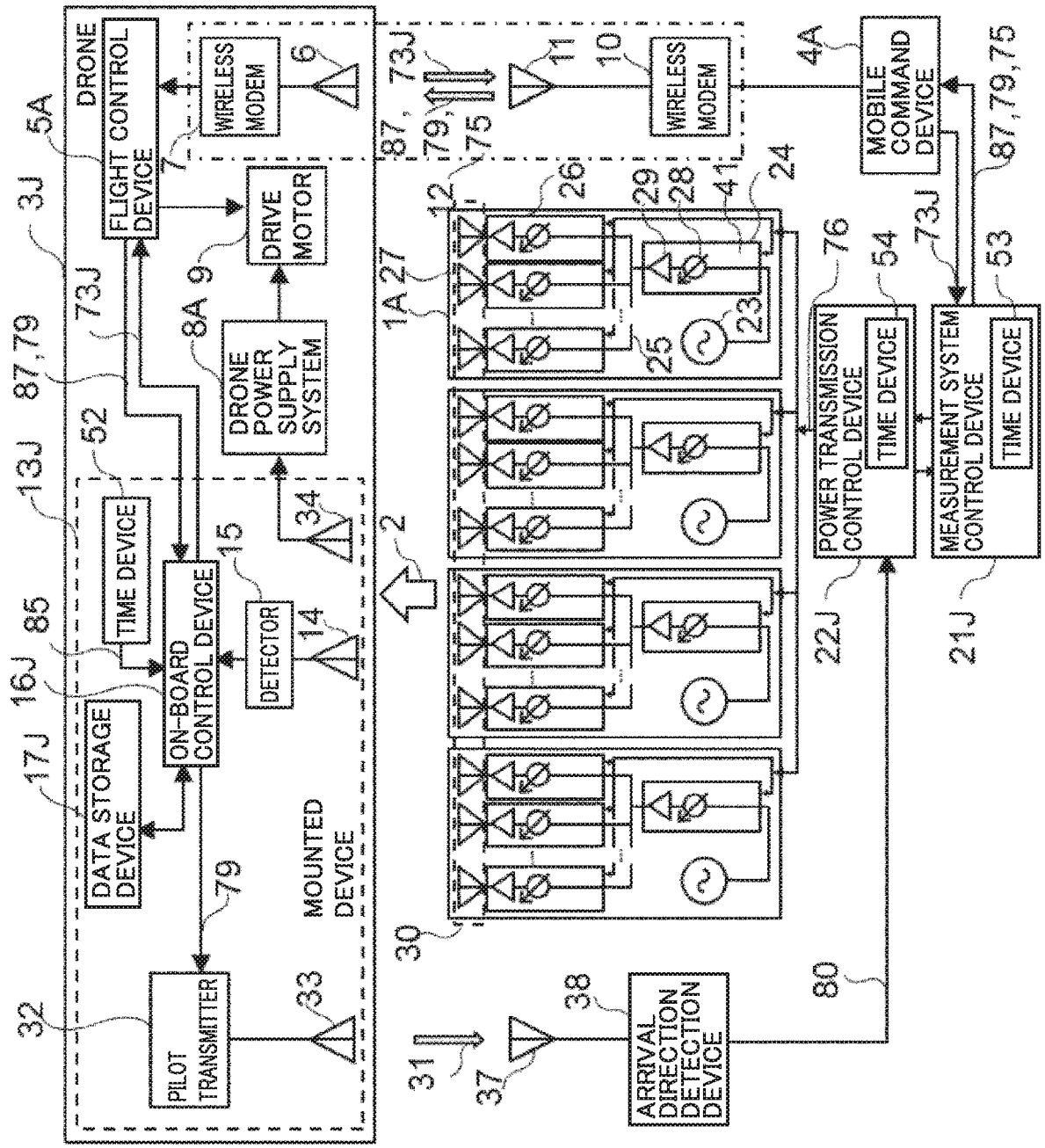
FIG. 26 is a configuration diagram illustrating a power transmission system to an aerial moving body by a wireless power transmission device according to a tenth embodiment of the present disclosure.
Figure 27:
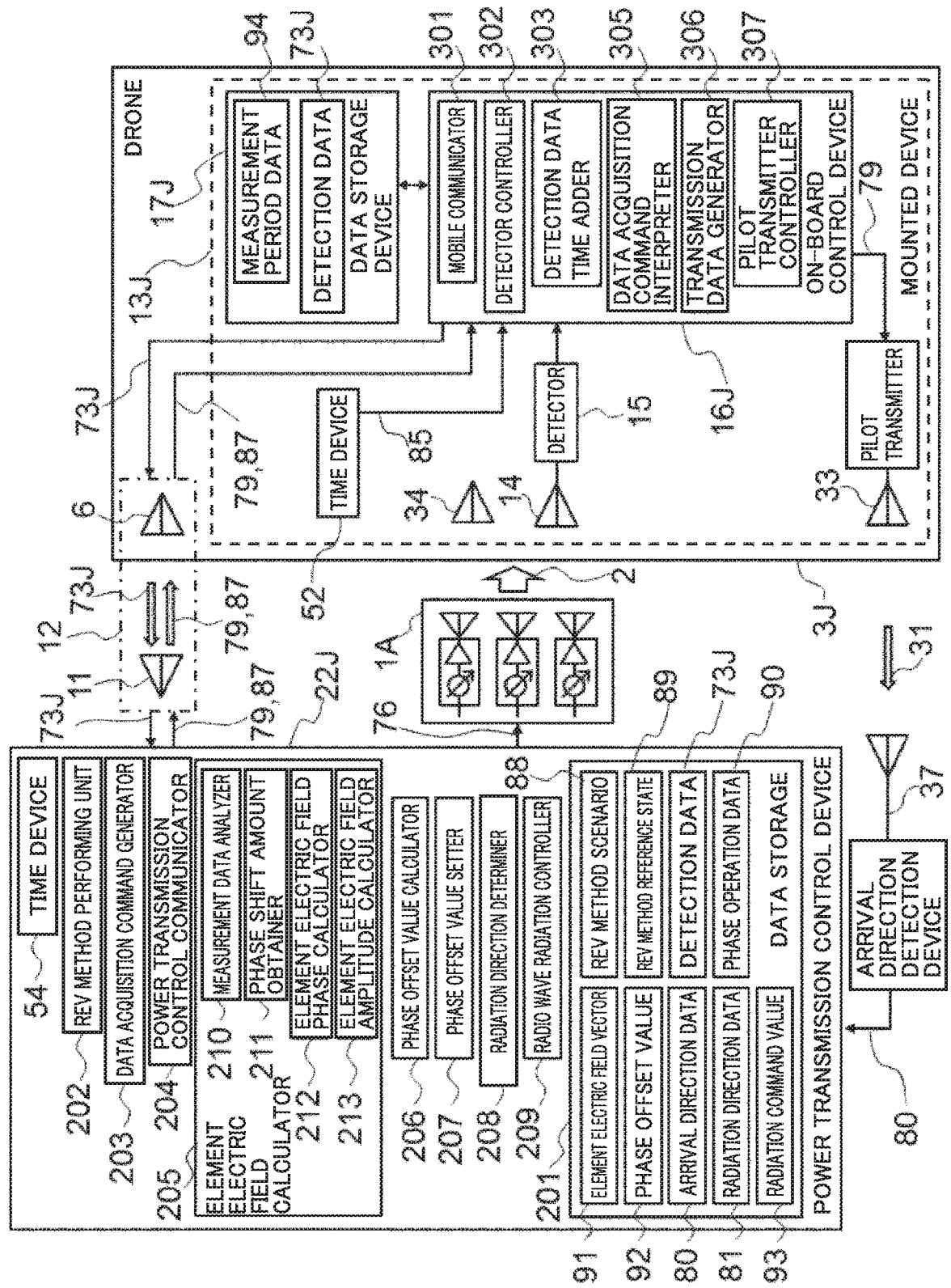
FIG. 27 is a view illustrating an internal configuration of a power transmission control device and an on-board control device in a power transmission system to an aerial moving body by the wireless power transmission device of the tenth embodiment.

A tenth embodiment is the case that the second embodiment is changed such that the aerial moving body and the ground-side device are equipped with time devices synchronized with each other. With reference to FIGS. 26 and 27, a configuration of a power transmission system to an aerial moving body by a wireless power transmission device according to the tenth embodiment is described. FIG. 26 is a configuration diagram illustrating the power transmission system to the aerial moving body by the wireless power transmission device of the tenth embodiment of the present disclosure. FIG. 27 is a view illustrating an internal configuration of a power transmission control device and an on-board control device in the power transmission system to the aerial moving body by the wireless power transmission device of the tenth embodiment.

As illustrated in FIG. 26, a drone 3J includes a GPS receiver that operates as time device 52 and positioning sensor 18H. Measurement system control device 21J also includes a GPS receiver that operates as time device 53. Power transmission control device 22J also includes a GPS receiver that operates as a time device 54. Thus, on-board control device 16J, measurement system control device 21J, and power transmission control device 22J that are mounted on drone 3J can use the synchronized time. FIGS. 26 and 27 also illustrate the flows of the command to perform the REV method and the data.

Power transmission control device 22J generates a data acquisition command 87 to be sent to drone 3J. Data acquisition command 87 is a command to instruct on-board control device 16J to acquire electric field change data. The electric field change data is data representing a change in the electric field vector that is measured by monitor antenna 14 and obtained by performing the REV method. Data acquisition command 87 is sent from power transmission control device 22J to on-board control device 16J mounted on drone 3J through measurement system control device 21J, mobile command device 4A, mobile communication system 12, and flight control device 5A. When receiving data acquisition command 87, on-board control device 16J sets a measurement period designated by data acquisition command 87. The measurement period is set within a period in which a REV method scenario 88 (to be described later) is scheduled to be performed. The measurement period may be one period or a plurality of divided periods. Detector 15 measures the electric field vector of the radio wave received by monitor antenna 14 in a period including at least the measurement period. The electric field vector may be measured as a vector represented by the amplitude and the phase, or only the amplitude of the electric field vector may be measured. The amplitude of the electric field vector is referred to as electric field strength. Data acquisition command 87 may be sent in each measurement period, for example.

On-board control device 16J adds time data 85 at the point of time of the measurement to the electric field vector measured by detector 15J, to generate detection data 73J. Detection data 73J measured by detector 15 while performing REV method scenario 88 is referred to as REV method performing time radio wave data. Detection data 73J represents the change in the electric field vector measured by monitor antenna 14. Detection data 73J measured in at least the measurement period is stored in a data storage device 17J. Detection data 73J measured while performing REV method scenario 88 is sent from on-board control device 16J to power transmission control device 22J in a path reverse to data acquisition command 87. The data sent from the drone to power transmission control device 22J to obtain an element electric field vector is electric field change data. In the tenth embodiment, detection data. 73J is the electric field change data.

In the REV method, in order to match (calibrate) the phase reference of each element module, while at least a part of element antennas 28 radiates the radio wave, the phase shift amount of some of phase shifters 28 is changed, and monitor antenna 14 repeats the measurement of the change in the electric field vector. The phase shift amount is an amount that changes the phase of the signal outputted from phase shifter 28 from the phase of the input signal. The element electric field vector is calculated in each element antenna 27 from the change in the electric field vector. The element electric field vector is an electric field vector that is generated at the position of monitor antenna 14 by the radio wave radiated by element antenna 27 to which the transmission signal outputted from one element module is supplied. A phase shift offset value 88 arranging the phase reference of each phase shifter 28 is calculated from the phase of the element electric field vector of each element antenna 27. Calculated phase shift offset value 88 is set to each phase shifter 28. Further, an amplification factor of each amplifier 29 may be adjusted from an amplitude ratio of the element electric field vector of each element antenna 27 such that the amplitude of the element electric field vector is also matched. Only the element electric field phase that is the phase of the element electric field vector may be obtained instead of the element electric field vector.

With reference to FIG. 27, the configurations of power transmission control device 22J, on-board control device 16J, and data storage device 17J are described. FIG. 27 illustrates only the configuration necessary to operate as the power transmission system to the aerial moving body. Measurement control device 21J is not illustrated in FIG. 27 because measurement control device 21J only relays the data between power transmission control device 22J and on-board control device 16J. When the power transmission control device and the on-board control device communicate directly with each other, the measurement control device can be omitted.

Power transmission control device 22J includes time device 54, a data storage 201, a REV method performing unit 202, a data acquisition command generator 2013, a power transmission control communicator 204, an element electric field calculator 205, a phase offset value calculator 206, a phase offset value setter 207, a radiation direction determiner 208, and a radio wave radiation controller 209. Element electric field calculator 205 includes a measurement data analyzer 210, a phase shift amount obtainer 211, an element electric field phase calculator 212, and an element electric field amplitude calculator 213.

Data storage 201 stores the data necessary to perform the REV method and the data necessary for power transmission control device 1A to transmit the power to drone 3J. REV method scenario 88, a REV method reference state 89, detection data 73J, phase operation data 90, an element electric field vector 91, a phase offset value 92, arrival direction data 80, radiation direction data 81, and a radiation command value 93 are stored in data storage 201.

REV method scenario 88 is data that defines the pattern of the amount (phase shift amount) changing the phase of each phase shifter 28 in order to perform the REV method. In REV method scenario 88, the phase shift amount of phase shifter 28 may be changed one by one, or the phases of the plurality of phase shifters 28 may be changed by the same phase shift amount. In REV method scenario 88, the radio waves may be radiated from all element antennas 27, or the radio waves may be radiated from some of the element antennas 27. REV method scenario 88 may define a pattern that repeats the change in the phase shift amount of some of phase shifters 28 while at least some of the element antennas 27 radiate the radio waves. Phase shifter 28 that changes the phase shift amount is referred to as an operation phase shifter.

REV method reference state 89 is data designating the phase of phase shifter 28 other than phase shifter 28 that changes the phase shift amount. For example, REV method reference state 89 is a phase offset value obtained by the REV method performed recently. For example, phases of all phase shifters 28 are set to zero in the case of performing the REV method for the first time. REV method scenario 88 defines order of phase shifters 28 that change the phase shift amount from the reference state and a phase operation pattern that is a pattern of time change that changes the phase shift amount in each phase shifter 28. Power transmission control signal 76 is generated according to REV method scenario 88, and sent to power transmission device 1A. By power transmission control signal 76, power transmission control device 22J sends the command value to each first-stage module 24 and each second-stage module 26, namely, each phase shifter 28 and each amplifier 29.

The phase operation pattern defines a sequence changing the phase shift amount of each phase shifter 28 in relative time from the start of REV method scenario 88. In each phase shifter 28, the change in the phase shift amount of phase shifter 28 may be expressed in relative time from the start of the period in which the phase shift amount is changed by phase shifter 28. Generally, in REV method scenario 88, the phase operation pattern is expressed by one or a plurality of reference events in which the time is designated and a non-reference event in which the time is expressed by the relative time from one of the reference events. The REV method scenario may be one defining only the order of the event as the phase operation pattern and having a more degree of freedom in expression. In REV method scenario 88 used in the tenth embodiment, the start is the reference event, and the other events are the non-reference event.

Data acquisition command 87 is a command for on-board control device 16J to instruct a measurement period in which detector 15 mounted on drone 3J measures detection data 73J. For example, in data acquisition command 87, the measurement period is expressed by a start time and an elapsed time from the start time. The measurement period may be expressed by the start time and an end time. Data acquisition command 87 may be a command sent at start and end timings of the measurement period.

Detection data 73J is time-added data of the electric field vector generated by detector 15. Detection data 73J is measured at a pitch width of a predetermined time. Phase operation data 90 is data of the phase shift amount per pitch width of the time of phase shifter 28, the phase shift amount being changed according to REV method scenario 88.

Element electric field vector 91 is data representing the electric field vector that is generated by element antenna 27 at the position where monitor antenna 14 exists. As is described later, element electric field calculator 205 calculates an element electric field phase being the phase of the element electric field vector and an element electric field amplitude being the amplitude of the element electric field vector. The element electric field calculator may calculate only the element electric field phase.

Phase offset value 92 is a phase shift amount, namely, a numerical value that is subtracted from the phase command value. Phase shift offset value 92 is set to each phase shifter 28. Each phase shifter 28 changes the phase by the phase shift amount obtained by subtracting phase offset value 92 from the phase command value. Consequently, the phase of element electric field vector 27 generated by each element antenna 27 becomes the same when the same phase command value is given to each phase shifter 28. Phase offset value 92 is calculated as the difference in the element electric field phase between the element modules. Phase offset value 92 is data arranging the phase reference of the element module, the data being obtained based on the element electric field phase of each element module.

A method different from the method for setting the phase offset value to phase shifter 28 may be used to match the phase reference of the element module. The same applies to the power transmission system to the aerial moving body of other embodiments.

Arrival direction data 80 is data representing the direction in which pilot signal 31 arrives. Arrival direction data 80 is obtained by arrival direction detection device 38. Radiation direction data 81 is data designating the direction of the radio wave radiated from phased array antenna 30. Radiation command value 93 is data representing a command value instructing for each phase shifter 28 and each amplifier 29 to radiate the radio wave in the direction indicated by radiation direction data 81. Radiation command value 93 is sent to power transmission device 1A as power transmission control signal 76.

REV method performing unit 202 changes the phase shift amount of phase shifter 28 designated by REV method scenario 88, and generates phase operation data 90 that is a record of the changed result. REV method performing unit 202 is also a phase operation recorder that generates phase operation data 90 in which a temporal change in the phase shift amount of phase shifter 28 changed based on REV method scenario is recorded. REV method scenario 88 may not be stored in data storage 201, but may be written in a program implementing REV method performing unit 202.

Data acquisition command generator 203 generates data acquisition command 87. Power transmission control communicator 204 sends data acquisition command 87 to on-board control device 16J, and receives detection data 73J sent from on-board control device 16J. Power transmission control communicator 204 also performs other communications between power transmission control device 22J and other devices.

Element electric field calculator 205 calculates element electric field vector 91 of each phase shifter 28 based on REV method scenario 88, phase operation data 90, and detection data 73J. The method for calculating element electric field vector 91 is a conventional technique. For example, the method for calculating element electric field vector 91 is described in Patent Publication No. 1-37882. For example, the phase of the element electric field vector is calculated from the phase shift amount recorded in phase operation data 90 at the point of time when the amplitude of the electric field vector recorded in detection data 73J takes the maximum value. The amplitude of the element electric field vector is calculated from a ratio of the maximum value and the minimum value of the amplitude of the electric field vector. Element electric field calculator 205 is a REV method analyzer that obtains the element electric field phase in each element module. The internal configuration of element electric field calculator 205 is described later. Phase operation data 90 is generated based on REV method scenario 88. Thus, element electric field calculator 205 calculates element electric field vector 91 of each phase shifter 28 based on REV method scenario 88 and detection data 73J.

Phase offset value calculator 206 calculates phase offset value 92 of each phase shifter 28 from element electric field vector 91 of each phase shifter 28. Phase offset value setter 207 sets phase offset value 92 to each phase shifters 28.

Radiation direction determiner 208 determines the radiation direction based on arrival direction data 80, and sets the radiation direction to radiation direction data 81. Radio wave radiation controller 209 generates radiation command value 93 based on radiation direction data 81. When the radiation direction is not determined, namely, when radiation direction data 81 is not set, radio wave radiation controller 209 does not generate radiation command value 93. Radio wave radiation controller 209 is an orientation direction changer that directs the orientation direction of phased array antenna 30 to the radiation direction.

As illustrated in FIG. 27, data storage device 17J mounted on drone 3G stores measurement period data 94 and detection data 73J. Measurement period data 94 is data representing a period in which detection data 73J is recorded. Measurement period data 94 is instructed by data acquisition command 87 sent from power transmission control device 22J. Detection data 73J is data in which the electric field vector measured by monitor antenna 14 in the measurement period designated by measurement period data 94 is correlated with time data 85 at the point of time when the electric field vector is measured.

On-board control device 16J includes time device 52, mobile communicator 301, detector controller 302, detection data time adder 303, a data acquisition command interpreter 305, a transmission data generator 306, and a pilot transmitter controller 307. Mobile communicator 301 receives data acquisition command 87 sent by power transmission control device 22A, and sends detection data 73J to power transmission control device 22A. Detection data time adder 303 adds time data 85 at the time of point when on-board control device 16J receives detection data 73 to detection data 73 outputted from detector 15. On-board control device 16J differs from on-board control device 16H in that on-board control device 16J includes data acquisition command interpreter 305, transmission data generator 306, and pilot transmitter controller 307, and that on-hoard control device 16J does not include positioned detection data generator 304.

Data acquisition command interpreter 305 extracts measurement period data 94 from data acquisition command 87, and stores measurement period data 94 in a data storage device 17J. Detector controller 302 controls detector 15 such that detection data 73 is generated in the measurement period designated by measurement period data 94. Detection data time adder 303 adds time data 85 to detection data 73 to generate detection data 73J. Detection data 73J is stored in data storage device 17J.

Transmission data generator 306 generates detection data 73J to be sent, by compressing detection data 73J of the measurement period defined by measurement period data 94. Mobile communicator 301 receives data acquisition command 87, and sends the detection data 73J generated by transmission data generator 306 to power transmission control device 22J. Transmission data generator 306 may generate data to be sent, by compressing positioned detection data 70H correlated with detection data 73J and position data 74H.

Pilot transmitter controller 307 controls whether or not pilot transmitter 32 transmits pilot signal 31.

Element electric field calculator 205 includes measurement data analyzer 210, phase shift amount obtainer 211, element electric field phase calculator 212, and element electric field amplitude calculator 213. Measurement data analyzer 210 analyzes detection data 73J sent from on-board control device 16J, and detects the times when the electric field strength takes the maximum value and takes the minimum value, and the maximum value and the minimum value of the electric field strength in each measurement period. Phase shift amount obtainer 211 refers to phase operation data 90 at the time when the electric field strength takes the maximum value and takes the minimum value, and obtains the operation phase shift amount that is the phase shift amount of the operation phase shifter in each measurement period. The time when the electric field strength takes the maximum value or the minimum value is also the time when the phase shift amount is obtained, so that the time when the electric field strength takes the maximum value or the minimum value is also referred to as a phase shift amount detection time.

Element electric field phase calculator 212 calculates the element electric field phase of each element module based on the operation phase shift amount of each phase shifter 28. When the phase shift amount of the phase shifter 28 is changed one by one by REV method scenario 88, the element electric field phase can be calculated by subtracting a constant from the operation phase shift amount of each phase shifter 28. The constant to be subtracted is determined appropriately according to the phase reference. When the operation phase shift amount measured by simultaneously changing the phase shift amount of the plurality of phase shifters 28 exists, the element electric field phase of each element module can be calculated by solving simultaneous equations.

Element electric field amplitude calculator 213 calculates the amplitude of the element electric field vector from the ratio of the maximum value and the minimum value of the electric field strength in each measurement period.

To obtain the phase shift amount of phase shifter 28 at the phase shift amount detection time, referring to phase operation data 90 enables to obtain more correct phase, but REV method scenario 88 can be referred to. In this case, the change pattern of the phase shift amount of each phase shifter 28 defined by the relative time from the start of REV method scenario 88 is referred to by a relative value obtained by subtracting the start time of REV method scenario 88 from the phase shift amount detection time, and the phase shift amount of phase shifter 28 is obtained at the phase shift amount detection time. The relative time of REV method scenario 88 may be converted into an absolute time (time), and the REV method scenario converted into the absolute time may be referred to at the phase shift amount detection time.

Figure 28:
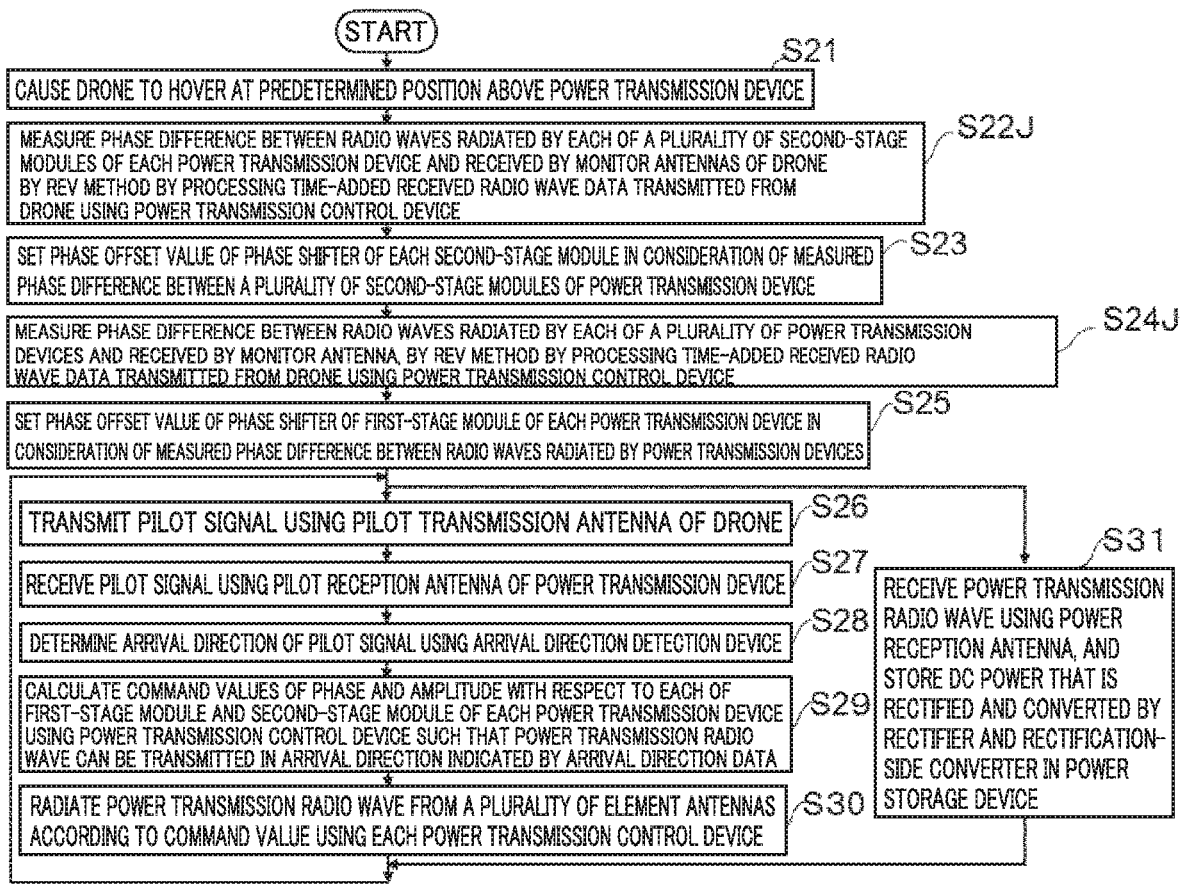
FIG. 28 is a flowchart illustrating a power transmission procedure in the power transmission system to the aerial moving body by the wireless power transmission device of the tenth embodiment.
Figure 29:
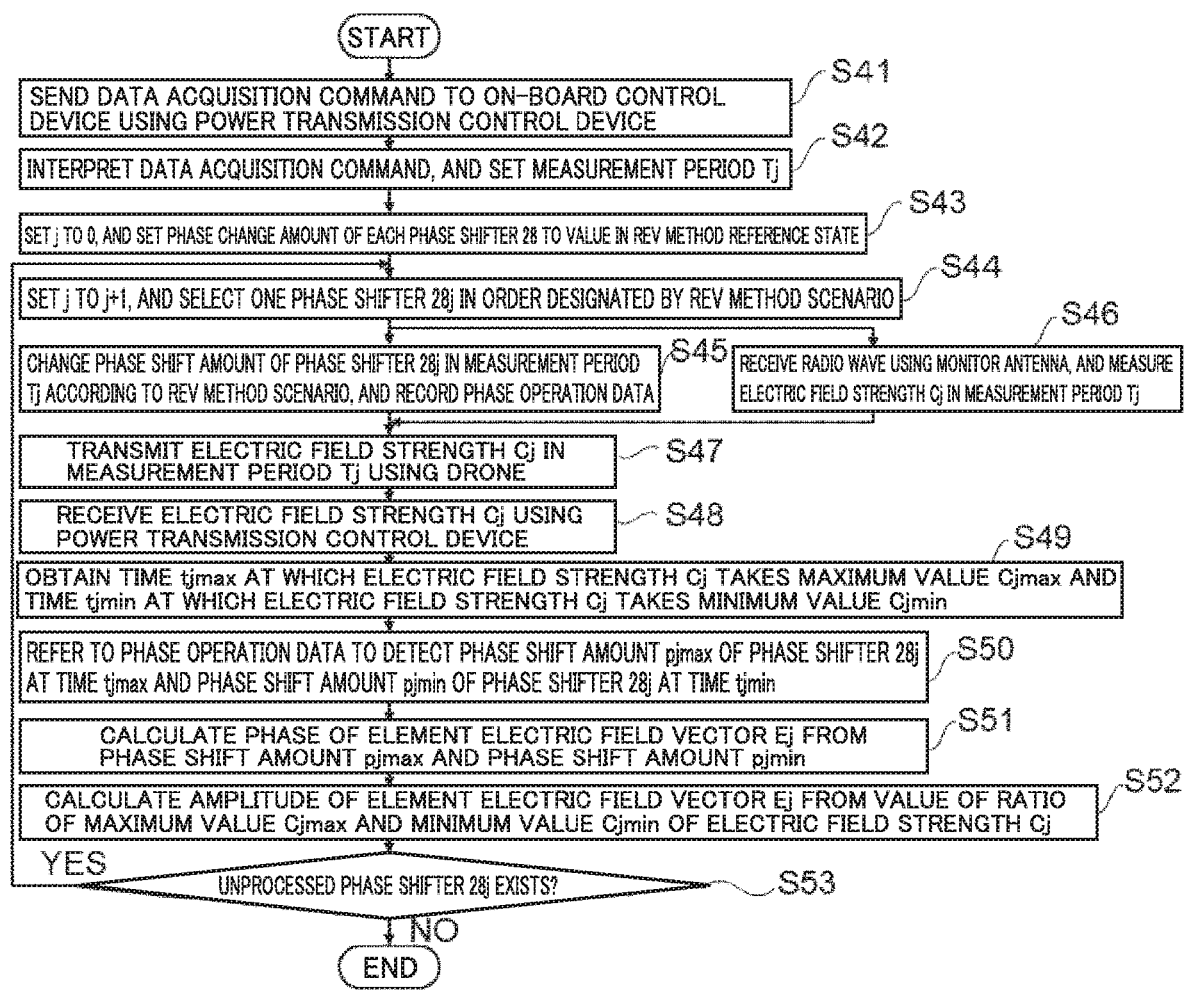
FIG. 29 is a flowchart illustrating a procedure for calculating an element electric field vector of the radio wave radiated from each element antenna by a REV method in the power transmission system to the aerial moving body by the wireless power transmission device of the tenth embodiment.

The operation is described. FIG. 28 is a flowchart illustrating a power transmission procedure in the power transmission system to the aerial moving body by the wireless power transmission device of the tenth embodiment. In FIG. 28, points different from FIG. 9 of the second embodiment are described. In step S22J, the REV method is performed while the phase shift amount of second-stage module 29 and the electric field vector (at least the amplitude value) measured by monitor antenna 14 at the phase shift amount are correlated with time data 85. FIG. 29 illustrates a specific procedure for performing the REV method. In S22J, the processing shown in FIG. 29 is performed on phase shifter 28 of second-stage module 26. In S24J, the processing shown in FIG. 29 is performed on phase shifter 28 of first-stage module 25.

With reference to FIG. 29, the procedure for performing the REV method is described. FIG. 29 is a flowchart illustrating the procedure for calculating the element electric field vector of the radio wave radiated from each element antenna by the REV method in the power transmission system to the aerial moving body by the wireless power transmission device of the tenth embodiment.

In step S41, power transmission control device 22J sends data acquisition command 87 to on-board control device 17J.

In step S42, data acquisition command interpreter 305 interprets data acquisition command 87, and stores the designated number of measurement period data 94 designating the start and end times of the measurement in data storage device 17J. The j-th measurement period is represented by a variable Tj. In step S43, j is set to 0, and REV method performing unit 202 sets the phase shift amount of each phase shifter 28 to a value in the REV method reference state.

In step S44, j is set to j+1, and REV method performing unit 202 selects one phase shifter 28 in the order designated by the REV method scenario. Selected phase shifter 28 is referred to as a phase shifter 28j. Phase shifter 28j is an operation phase shifter that is a part of the phase shifters and that changes the phase shift amount. In step S45, REV method performing unit 202 changes the phase shift amount of phase shifter 28j in a measurement period Tj based on REV method scenario 88, and records phase operation data 90. When a sequence for changing the phase shift amount of phase shifter 28j is completed, the phase shift amount of phase shifter 28j is returned to the value in the REV method reference state. In measurement period Tj, step S46 is performed as processing performed in parallel to step S45. In step S46, monitor antenna 14 receives the radio wave, and measures electric field strength Cj that is detection data 73J in measurement period Tj.

In step S47, mobile communicator 301 sends electric field strength Cj in measurement period Tj from drone 3J to power transmission control device 22J. Transmission data generator 306 compresses electric field strength Cj such that the same content can be sent with a small data amount, and sends compressed electric field strength Cj. The processing of transmitting electric field strength Cj in step S47 may be performed without waiting for the completion of the processing of measuring electric field strength Cj in step S46. Electric field strength Cj in measurement period Tj is electric field change data representing the change in the electric field in measurement period Tj.

In step S48, power transmission control communicator 204 receives electric field strength Cj.

In step S49, measurement data analyzer 210 obtains time tjmax at which electric field strength Cj takes a maximum value Cjmax and time tjmin at which electric field strength Cj takes a minimum value Cjmin. Step S49 may be performed after all electric field strengths Cj in measurement period Tj are inputted, or element electric field calculator 205 may detect time tjmax and time tjmin every time electric field strength Cj is inputted. Time tjmax and time tjmin are the phase shift amount detection time of phase shifter 28j that is the operation phase shifter.

In step S50, phase shift amount obtainer 211 refers to phase operation data 90 to detect a phase shift amount pjmax of phase shifter 28j at time tjmax and a phase shift amount pjmin of phase shifter 28j at time tjmin. Phase shift amount pjmax and phase shift amount pjmin are the operation phase shift amount of phase shifter 28j.

In step S51, element electric field phase calculator 212 calculates the phase of an element electric field vector Ej from phase shift amount pjmax and phase shift amount pjmin. An average of the phase calculated from phase shift amount pjmax and the phase calculated from phase shift amount pjmin is set as the phase of element electric field vector Ej. The phase calculated from only phase shift amount pjmax or phase shift amount pjmin may be set as the phase of element electric field vector Ej.

In step S52, element electric field amplitude calculator 213 calculates the amplitude of element electric field vector Ej from the value of the ratio of maximum value Cjmax and minimum value Cjmin of electric field strength Cj. The amplitude of element electric field vector Ej may not be calculated.

In step S53, whether or not unprocessed phase shifter 28 exists is checked. When unprocessed phase shifter 28 exists (YES in S53), the processing returns to step S44.

When unprocessed phase shifter 28 does not exist (NO in S53), the processing is ended.

By performing the REV method, phase offset value 92 is calculated and set to phase shifter 28 of each element module. Phase offset value 92 can equalize (match) the phase reference of each element module. In step S29, radio wave radiation controller 209 generates the command values of the phase and the amplitude for each element module while the phase reference of each element module is matched. The command value is sent to power transmission device 1A as power transmission control signal 76. The command values of the phase and the amplitude for each element module are calculated such that the orientation direction of phased array antenna 30 is directed toward the power transmission direction.

In step S30, power transmission device 1A radiates the radio wave according to the instruction indicated with power transmission control signal 76. Thus, based on the element electric field phase of each element module, radio wave radiation controller 209 controls power transmission device 1A such that the electric wave is radiated in the power transmission direction under a condition in which each of the plurality of element modules has the matched phase reference.

Pilot signal 31 is transmitted from drone 3J, and power transmission device 1A radiates power transmission radio wave 2 in the direction in which pilot signal 31 arrives, so that power reception antenna 34 of drone 3J can efficiently receive power transmission radio wave 2.

As in the second embodiment, by performing the REV method using the aerial moving body such as the drone, the REV method can be performed in the situation where the power is transmitted actually to the aerial moving body. For this reason, the REV method can accurately be performed, and the radio wave can accurately be radiated in the radiation direction when the power is transmitted to the aerial moving body. Additionally, time data 85 is included in detection data 73J used to perform the REV method, so that the REV method can accurately be performed.

As the electric field change data from on-board control device 16J, detection data 73J while performing the REV method is not sent, but the electric field change data generated based on detection data 73J may be sent. Consequently, the data amount sent from the on-board control device to the power transmission control device can be reduced. Alternatively, the on-board control device is provided with the element electric field calculator, and the on-board control device may calculate the element electric field phase. Detection data 73J itself is also included in the electric field change data that is generated based on detection data 73J.

The above can be applied to other embodiments.

Eleventh Embodiment

Figure 30:
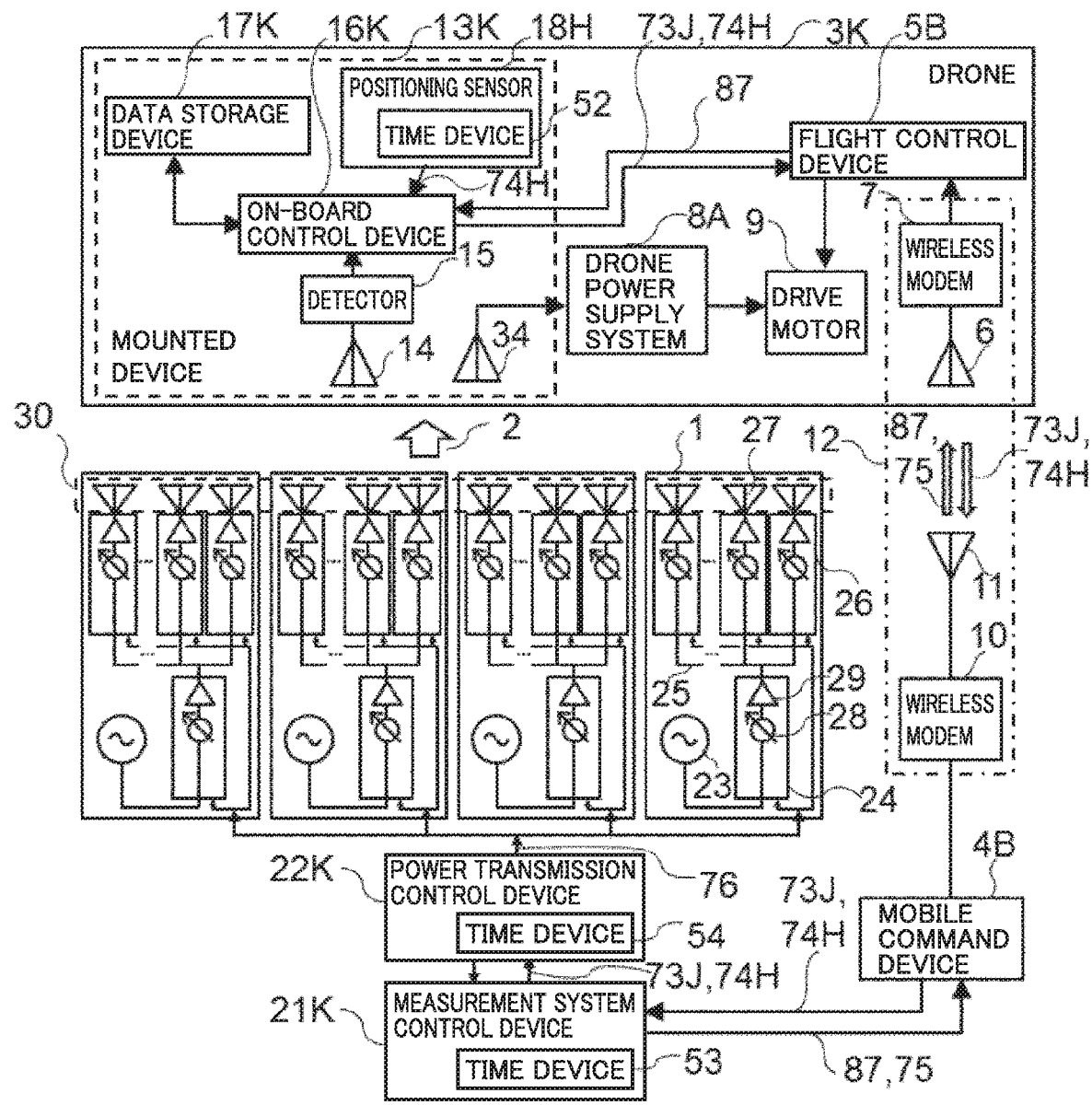
FIG. 30 is a configuration diagram illustrating a power transmission system to an aerial moving body by a wireless power transmission device according to an eleventh embodiment of the present disclosure.
Figure 31:
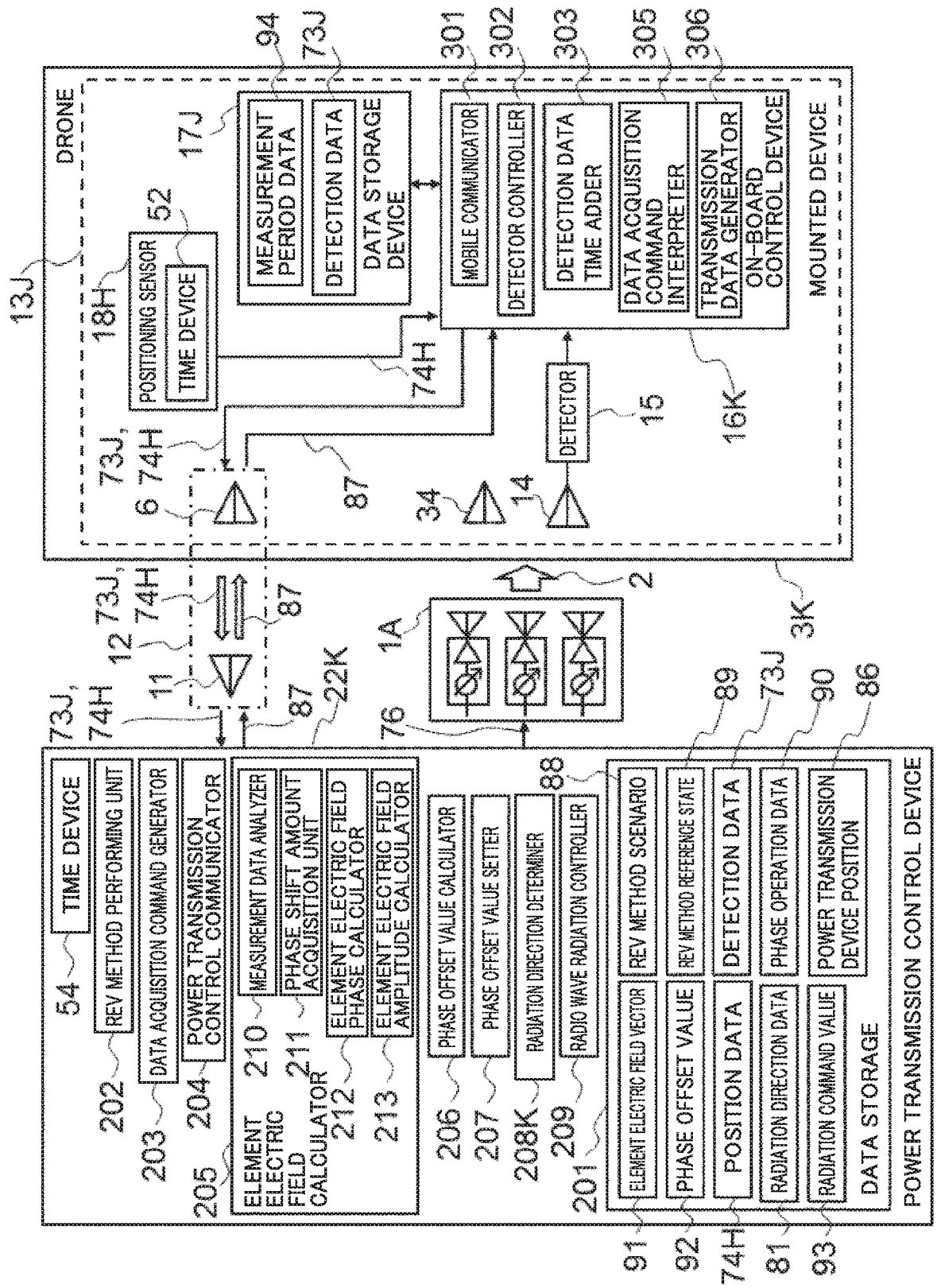
FIG. 31 is a view illustrating an internal configuration of a power transmission control device and an on-board control device in a power transmission system to an aerial moving body by the wireless power transmission device of the eleventh embodiment.

An eleventh embodiment is the case that the third embodiment is changed such that the aerial moving body and the ground-side device are equipped with time devices synchronized with each other. In the eleventh embodiment, as compared with the tenth embodiment, the position data of the aerial moving body is sent to the power transmission control device instead of the pilot signal. With reference to FIGS. 30 and 31, a configuration of a power transmission system to an aerial moving body by a wireless power transmission device according to the eleventh embodiment is described. FIG. 30 is a configuration diagram illustrating the power transmission system to the aerial moving body by the wireless power transmission device of the eleventh embodiment of the present disclosure. FIG. 31 is a view illustrating an internal configuration of a power transmission control device and an on-board control device in the power transmission system to the aerial moving body by the wireless power transmission device of the eleventh embodiment.

As illustrated in FIG. 30, a drone 3K includes positioning sensor 18H that is also time device 52. Position data 74H measured by positioning sensor 18H is sent to a measurement system control device 21K. Measurement system control device 21K includes time device 53. A power transmission control device 22K includes time device 54. An on-board control device 16K, measurement system control device 21K, and power transmission control device 22K can use the synchronized time.

In FIG. 31, points different from FIG. 27 of the tenth embodiment are described. On-board control device 16K includes positioning sensor 18H including time device 52, but does not include pilot transmitter controller 307. Mobile communicator 301 sends position data 74H to power transmission control device 22K at least while receiving the power from power transmission device 1A.

In power transmission control device 22K, a data storage 201K and a radiation direction determiner 208K are changed. Data storage 201K stores position data 74H and power transmission device position 86, but does not store arrival direction data 80. Radiation direction determiner 208K converts position data 74H sent from drone 3K into the relative position with respect to power transmission device position 86, and determines the radiation direction from the relative position.

Figure 32:
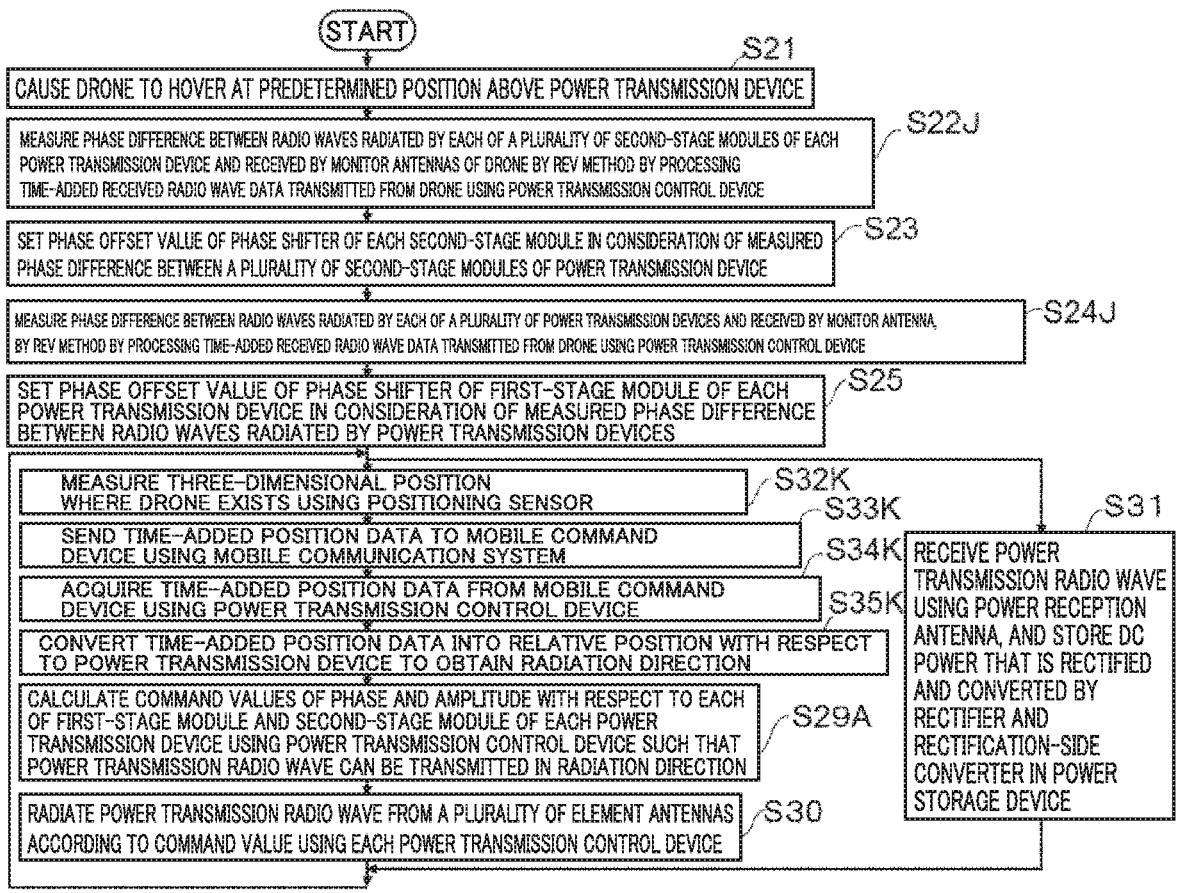
FIG. 32 is a flowchart illustrating the power transmission procedure in the power transmission system to the aerial moving body by the wireless power transmission device of the eleventh embodiment.

The operation is described. FIG. 32 is a flowchart illustrating a power transmission procedure in the power transmission system to the aerial moving body by the wireless power transmission device of the eleventh embodiment. Referring to FIG. 32, points different from FIG. 11 of the third embodiment are described. Steps S22J and S24J are similar to those in FIG. 28. In step S32K, drone 3K measures the own three-dimensional position together with time data 85 using positioning sensor 18H, and generates position data 74H. Position data 74H is position data with time. Steps 33K to S35K that are pieces of processing of obtaining the radiation direction operates with respect to position data 74H (including the time data 85) instead of position data 74 similarly to steps S33 to S35.

The power transmission system to the aerial moving body of the eleventh embodiment operates similarly to the third embodiment, and the similar effect can be obtained. Time data 85 is included in detection data. 73J, so that the REV method can accurately be performed similarly to the tenth embodiment.

The above also applied to other embodiments.

Twelfth Embodiment

Figure 33:
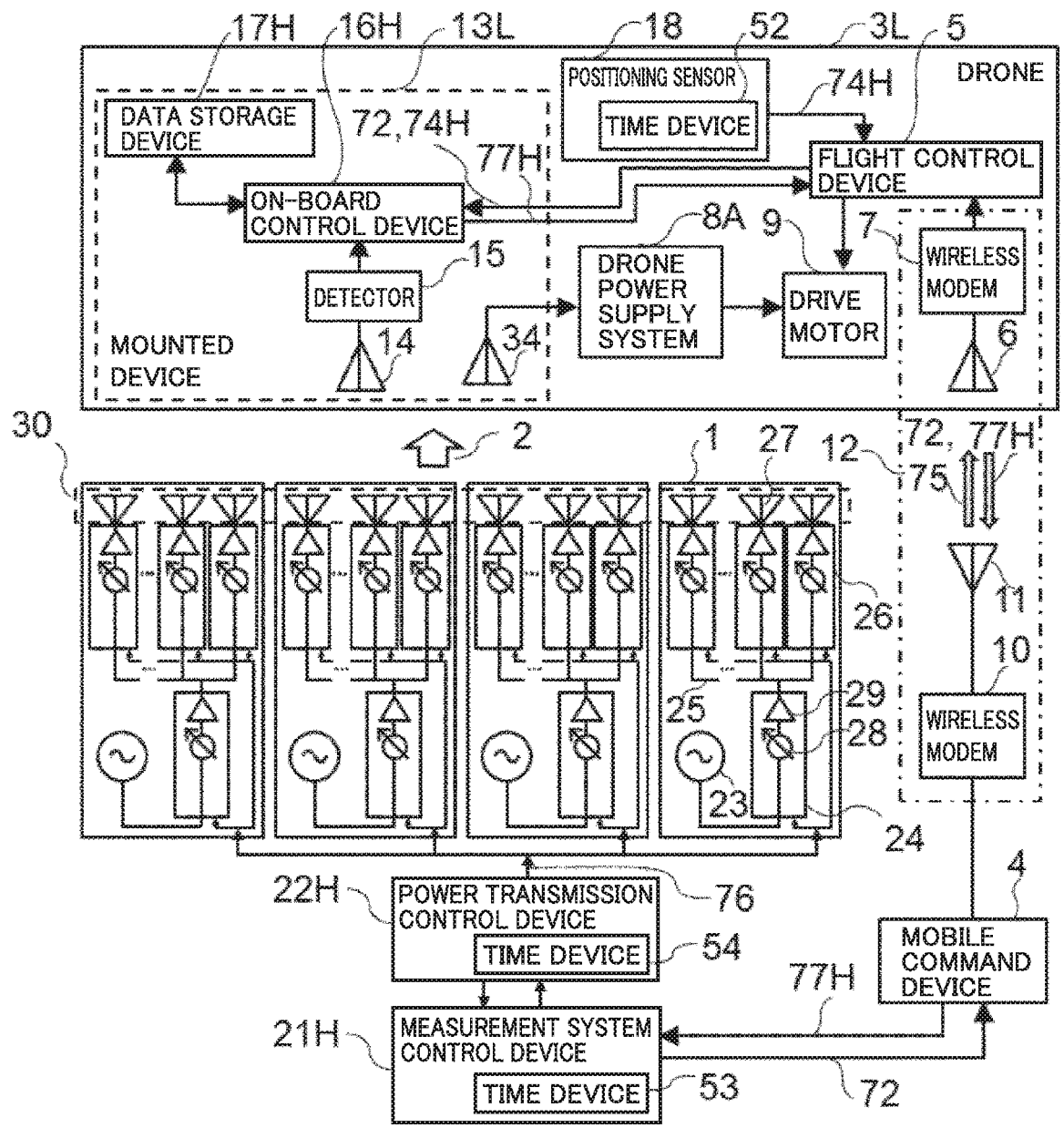
FIG. 33 is a configuration diagram illustrating a radio wave measurement system using an aerial moving body according to a twelfth embodiment of the present disclosure and a power transmission system to the aerial moving body by a wireless power transmission device of the twelfth embodiment.

A twelfth embodiment is the case that the fourth embodiment is changed such that the aerial moving body and the ground-side device are equipped with time devices synchronized with each other. With reference to FIG. 33, a configuration of a radio wave measurement system using an aerial moving body of the twelfth embodiment and a power transmission system to an aerial moving body by a wireless power transmission device of the twelfth embodiment is described. FIG. 33 is a configuration diagram illustrating the radio wave measurement system using the aerial moving body of the twelfth embodiment of the present disclosure and the power transmission system to the aerial moving body by the wireless power transmission device of the twelfth embodiment.

In FIG. 33, points different from FIG. 22 of the ninth embodiment are described. A drone 3L includes power reception antenna 34 and drone power supply system 8A similarly to the second embodiment. As compared with FIG. 12 of the fourth embodiment, time device 53 and time device 54 are added similarly to the ninth embodiment. Positioning sensor 18 is changed to positioning sensor 18H including time device 52.

Figure 34:
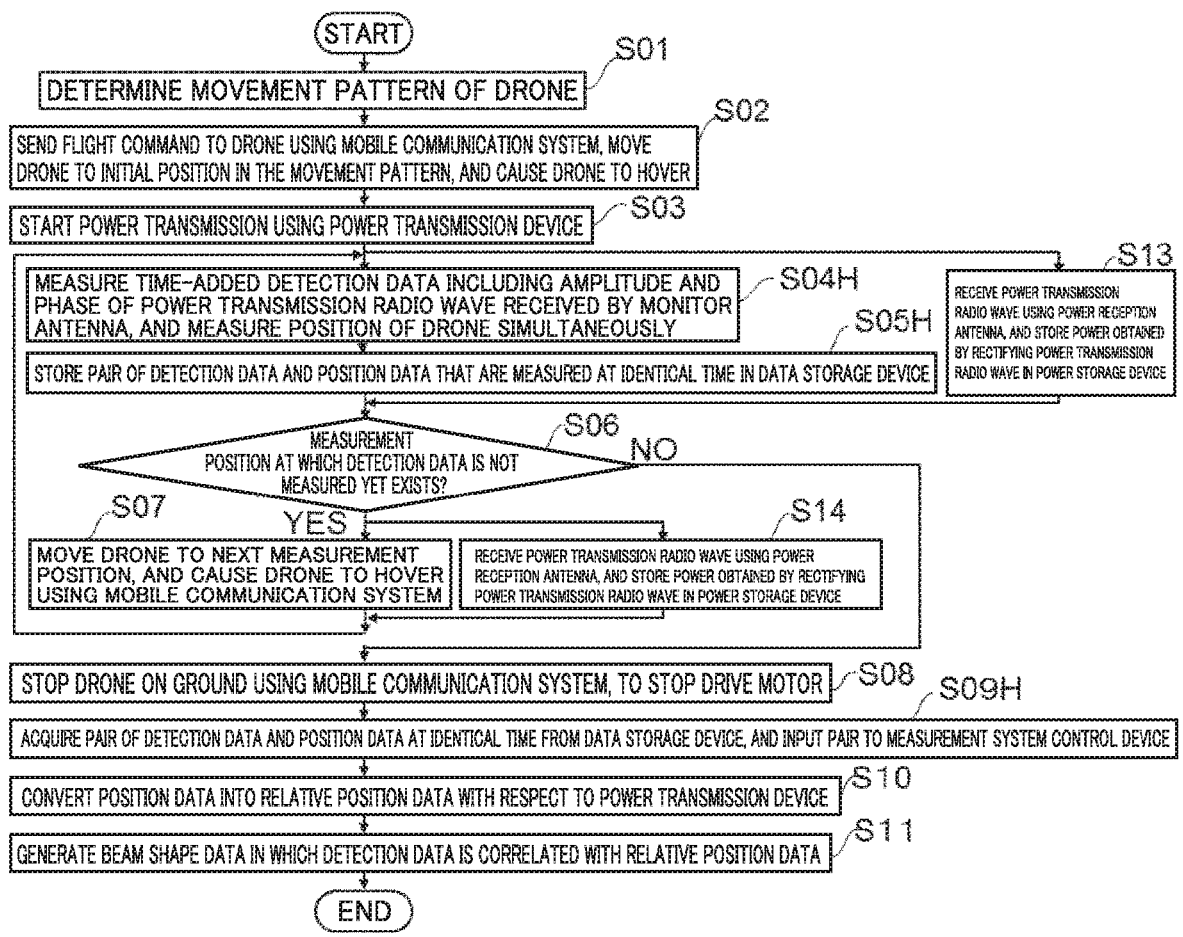
FIG. 34 is a flowchart illustrating a procedure for measuring the radiation pattern of the radio wave in the radio wave measurement system using the aerial moving body of the twelfth embodiment and the power transmission system to the aerial moving body by the wireless power transmission device of the twelfth embodiment.

The operation is described. FIG. 34 is a flowchart illustrating a procedure for measuring the radiation pattern of the radio wave in the radio wave measurement system using the aerial moving body of the twelfth embodiment and the power transmission system to the aerial moving body by the wireless power transmission device of the twelfth embodiment. In FIG. 34, points different from FIG. 28 of the tenth embodiment are described. As in the fourth embodiment, steps S13 and S14 are added in parallel to steps S04 to S07. In steps S13 and S14, power transmission radio wave 2 is received by power reception antenna 34, and the power obtained by rectifying received power transmission radio wave 2 using rectifier 35 is stored in power storage device 19. Step S13 operates in parallel to steps S04 and S05. Step S14 operates in parallel to step S07.

The twelfth embodiment operates similarly to the fourth embodiment and the similar effect can be obtained. Additionally, time data 85 is included in detection data 73J similarly to the eleventh embodiment, so that the REV method can accurately be performed.

Thirteenth Embodiment

Figure 35:
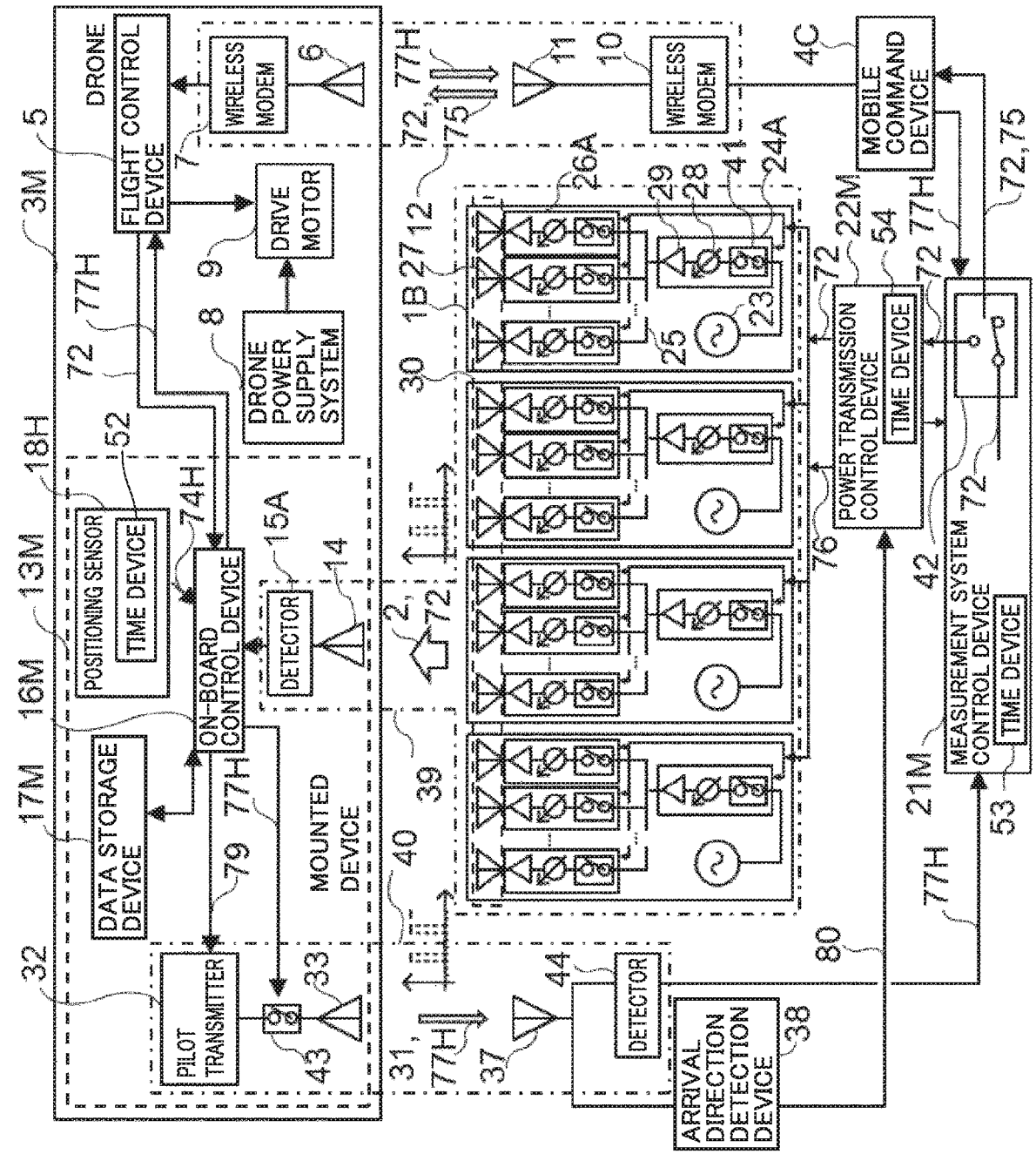
FIG. 35 is a configuration diagram illustrating a radio wave measurement system using an aerial moving body according to a thirteenth embodiment of the present disclosure.
Figure 36:
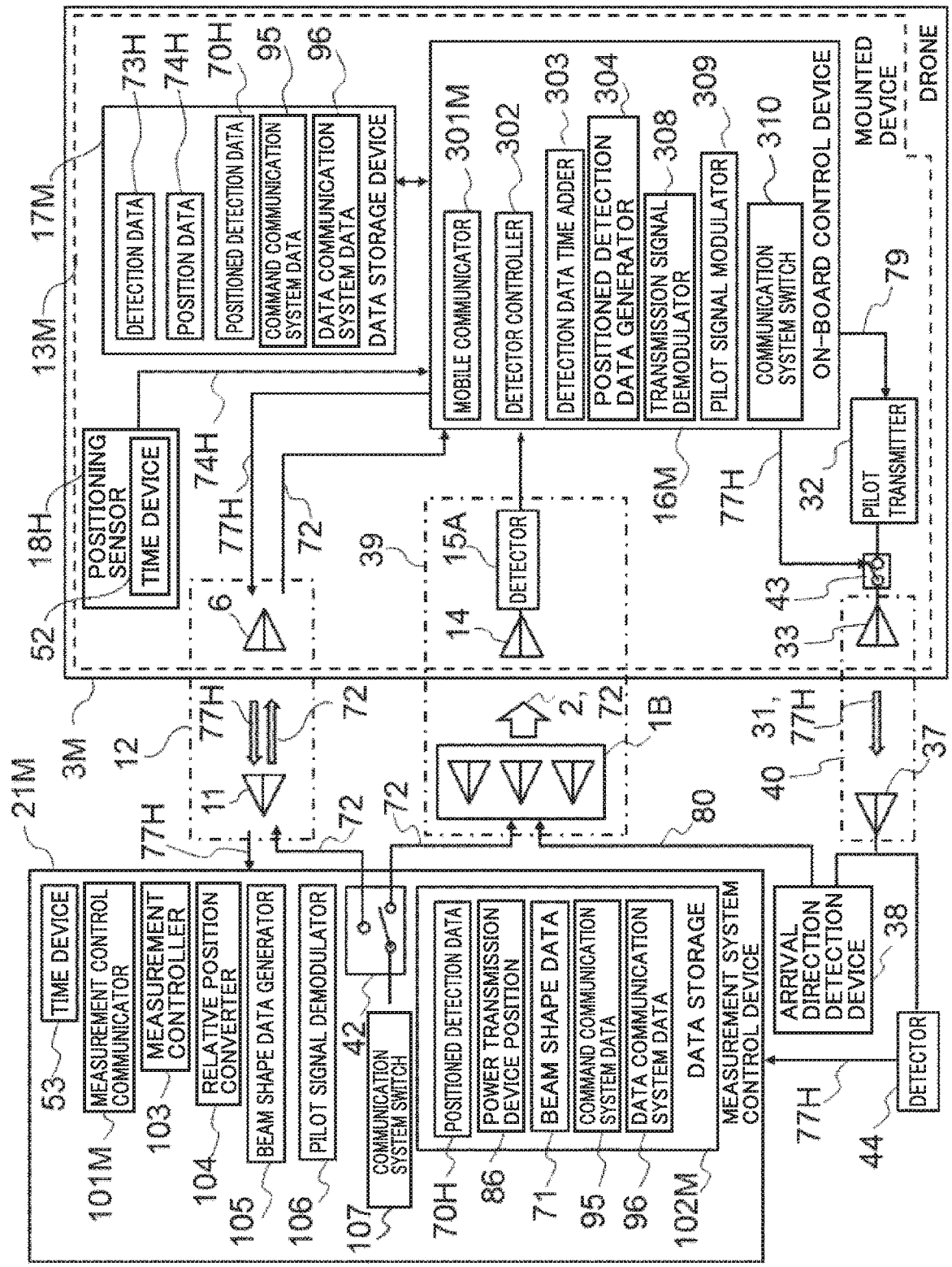
FIG. 36 is a view illustrating an internal configuration of a measurement system control device and an on-board control device in the radio wave measurement system using the aerial moving body of the thirteenth embodiment.

A thirteenth embodiment is the case that the fifth embodiment is changed such that the aerial moving body and the ground-side device are equipped with time devices synchronized with each other. With reference to FIGS. 35 and 36, a configuration of a radio wave measurement system using an aerial moving body according to the thirteenth embodiment is described. FIG. 35 is a configuration diagram illustrating the radio wave measurement system using the aerial moving body of the thirteenth embodiment of the present disclosure. FIG. 36 is a view illustrating an internal configuration of the measurement system control device and the on-board control device in the radio wave measurement system using the aerial moving body of the thirteenth embodiment. The thirteenth embodiment differs from the twelfth embodiment in that the thirteenth embodiment includes power transmission communication system 39 and pilot communication system 40.

With reference to FIG. 35, points different from FIG. 14 of the fifth embodiment are described. A drone 3M includes positioning sensor 18H that is also used as time device 52. A measurement system control device 21M includes time device 53. A power transmission control device 22M includes time device 54. An on-board control device 16M, measurement system control device 21M, and power transmission control device 22M can use the synchronized time.

With reference to FIG. 36, points different from FIG. 27 of the ninth embodiment are described. A data storage device 17M has command communication system data 95 and data communication system data 96. Command communication system data 95 indicates which one of mobile communication system 12 and power transmission communication system 39 is used as the command communication system. Data communication system data 96 indicates which one of mobile communication system 12 and pilot communication system 40 is used as the data communication system.

On-board control device 16M includes a power transmission signal demodulator 308, a pilot signal modulator 309, and a communication system switch 310. Power transmission signal demodulator 308 demodulates detection data 73 to generate measurement command 72. Pilot signal modulator 309 generates the control signal for pulse modulation switch 43 in order to send measurement data 77H. Communication system switch 310 determines which one of mobile communication system 12 and power transmission communication system 39 is used as the command communication system and which one of mobile communication system 12 and pilot communication system 40 is used as the data communication system according to the instruction from measurement system control device 21M.

Measurement system control device 21M includes a pilot signal demodulator 106 and a communication system switch 107. A data storage 102M has command communication system data 95 and data communication system data 96.

Pilot signal demodulator 106 demodulates pilot detection data 97 (not illustrated) that detector 44 detects pilot signal 31 to generate. Communication system switch 107 switches which one of mobile communication system 12 and power transmission communication system 39 is used as the command communication system, and switches which one of mobile communication system 12 and pilot communication system 40 is used as the data communication system. When the communication system is switched, the data values of command communication system data 95 and data communication system data 96 that are stored in data storage 102M are changed, and on-board control device 16M is notified of the switched communication system. The data values of command communication system data 95 and data communication system data 96 may be changed after the notification. A communication system that notifies on-board control device 16M of the communication system to be used from measurement system control device 21M is referred to as a switching notification communication system. For example, a command communication system in use is used as the switching notification communication system. Alternatively, mobile communication system 12 may always be used as the switching notification communication system.

Figure 37:
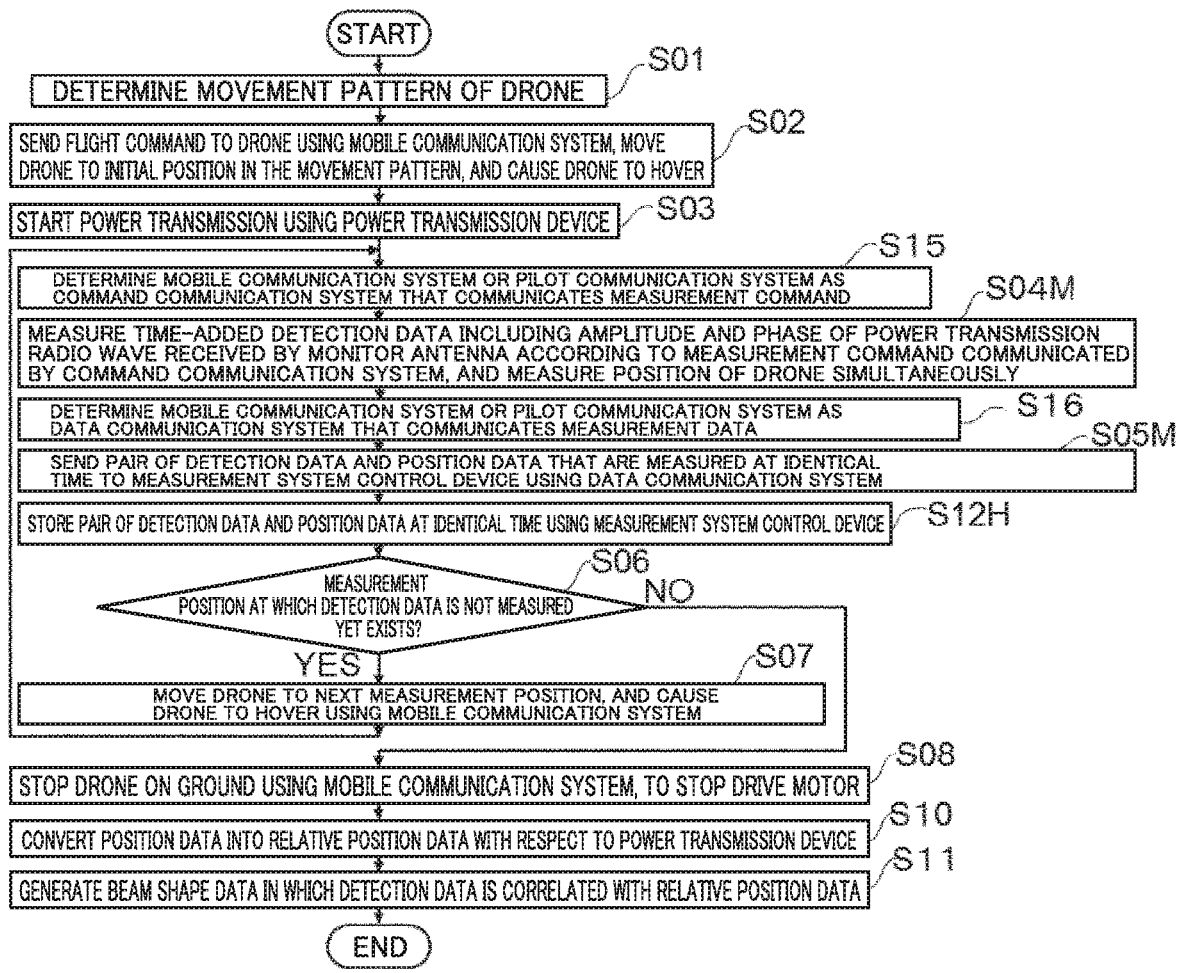
FIG. 37 is a flowchart illustrating a procedure for measuring the radiation pattern of the radio wave in the radio wave measurement system using the aerial moving body of the thirteenth embodiment.

The operation is described. FIG. 37 is a flowchart illustrating a procedure for measuring the radiation pattern of the radio wave in the radio wave measurement system using the aerial moving body of the thirteenth embodiment. In FIG. 37, points different from FIG. 25 of the ninth embodiment are described. Similarly to the fifth embodiment, steps S15 and S16 are added. In step S15, the command communication system is determined. In step S16, the data communication system is determined. In step S04M, measurement command 72 is communicated through the command communication system determined in step S15. In step S05M, positioned detection data 70H is communicated through the data communication system determined in step S16.

The power transmission system to the aerial moving body of the thirteenth embodiment operates similarly to the fifth embodiment and the similar effect can be obtained. The detection data and the position data are combined using the synchronized time data, so that the beam shape can more accurately be measured.

Fourteenth Embodiment

Figure 38:
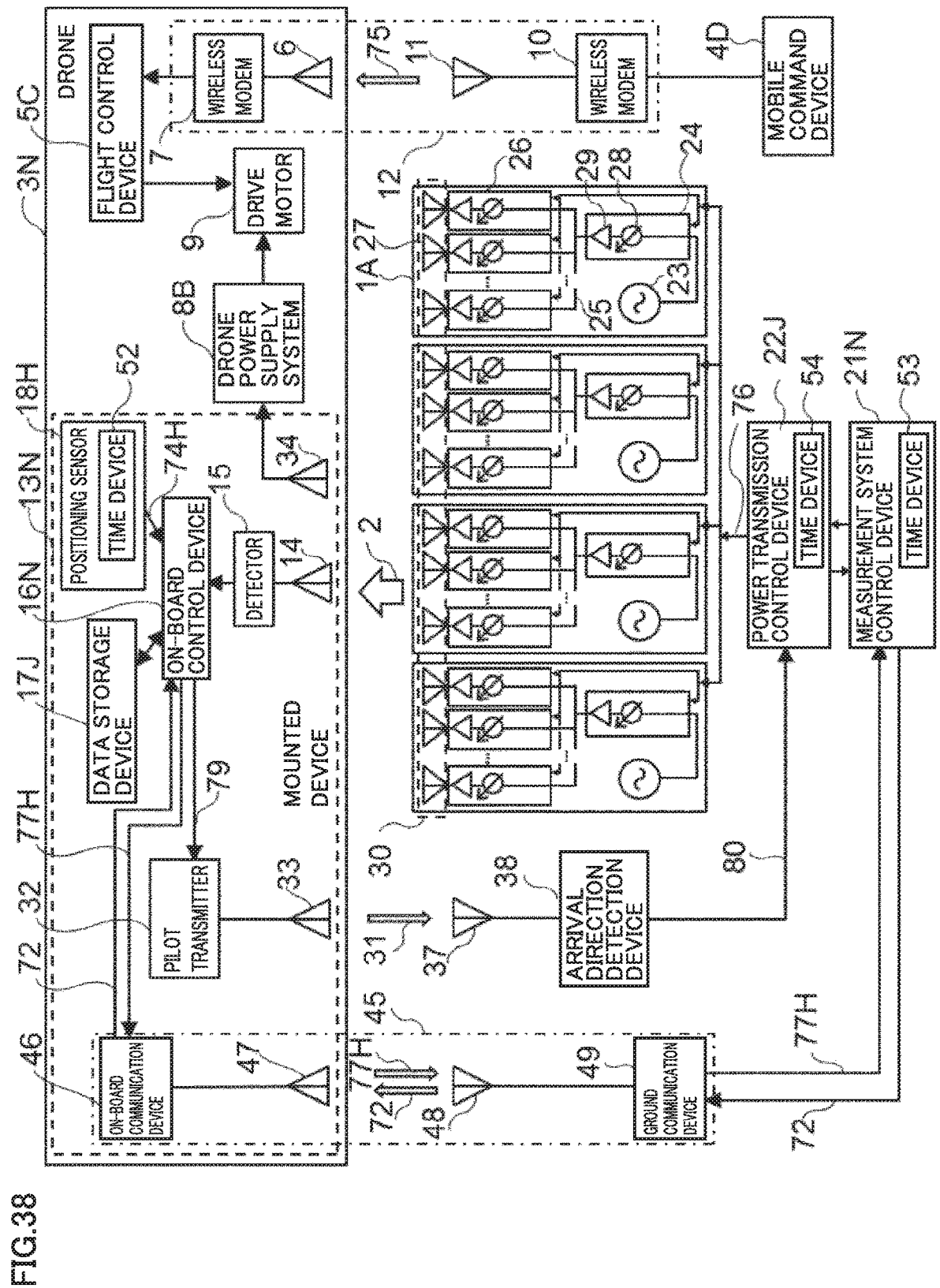
FIG. 38 is a configuration diagram illustrating a radio wave measurement system using an aerial moving body according to a fourteenth embodiment of the present disclosure and a power transmission system to the aerial moving body by a wireless power transmission device of the fourteenth embodiment.
Figure 39:
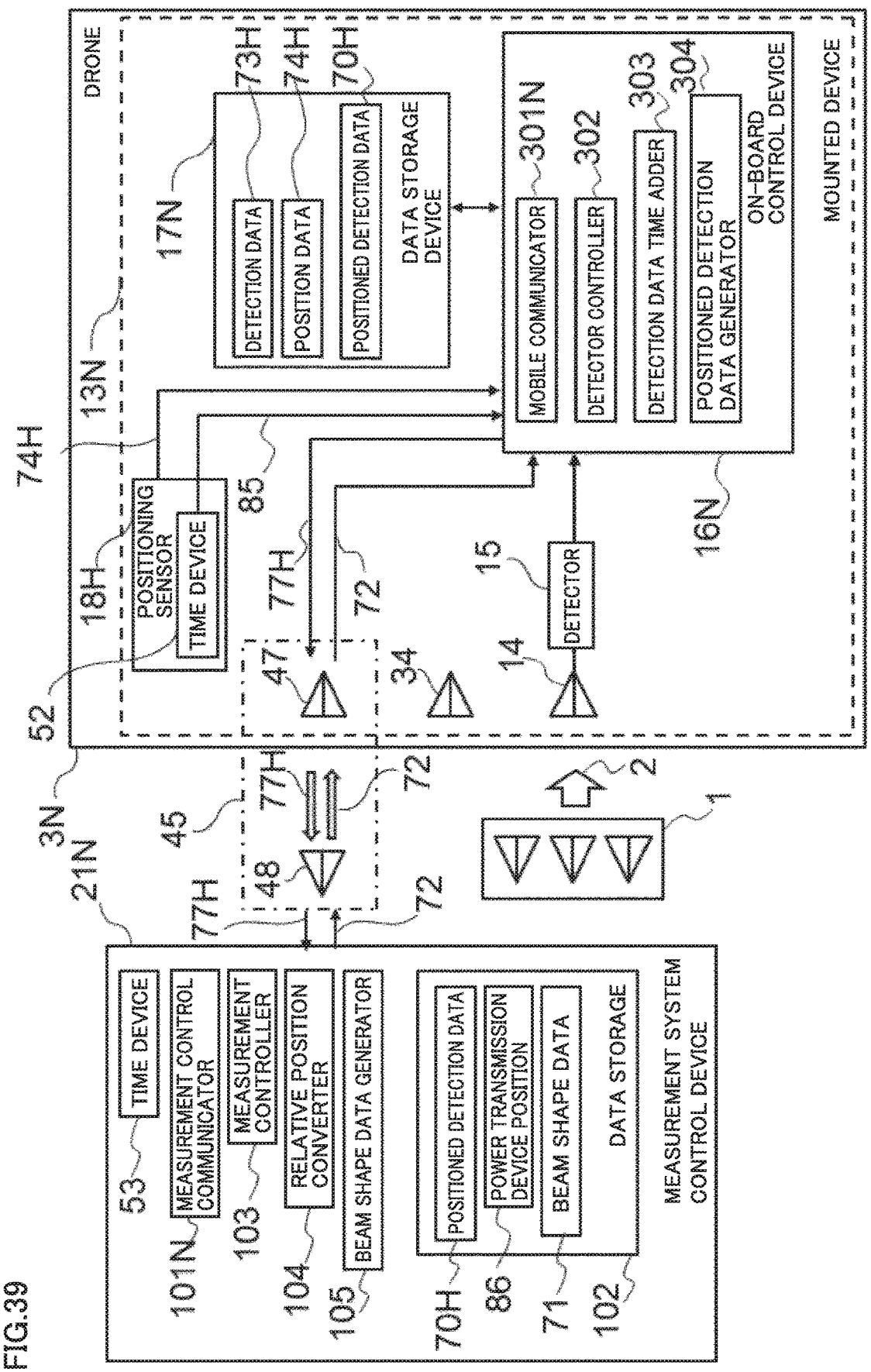
FIG. 39 is a view illustrating an internal configuration of a measurement system control device and an on-board control device in the radio wave measurement system using the aerial moving body of the fourteenth embodiment.
Figure 40:
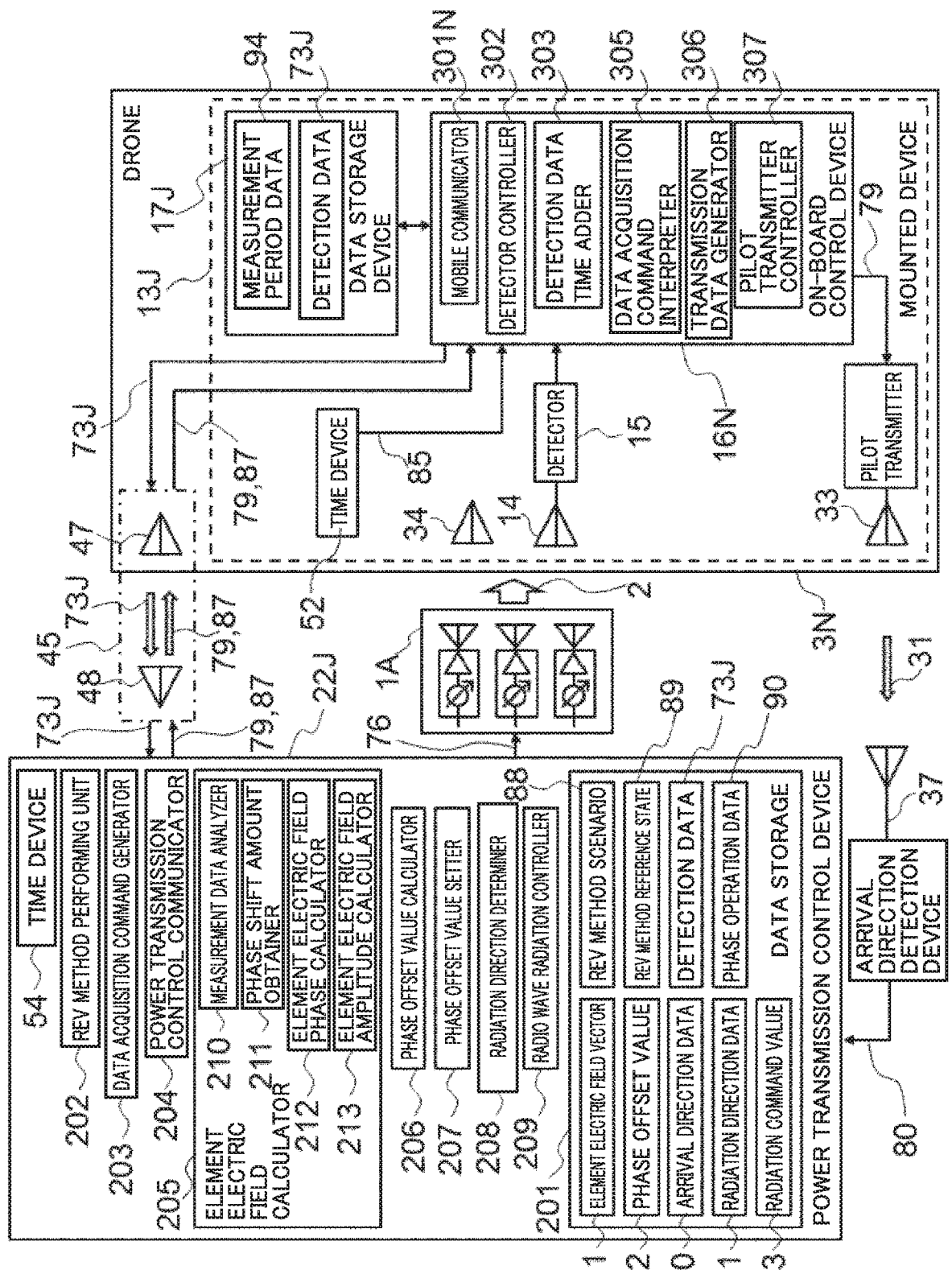
FIG. 40 is a view illustrating an internal configuration of a power transmission control device and an on-board control device in a power transmission system to an aerial moving body by the wireless power transmission device of the fourteenth embodiment.

A fourteenth embodiment is the case that the sixth embodiment is changed such that the aerial moving body and the ground-side device are equipped with time devices synchronized with each other. The fourteenth embodiment differs from the ninth or tenth embodiment in that the fourteenth embodiment includes measurement communication system 45 instead of mobile communication system 12. With reference to FIGS. 38 to 40, a configuration of a radio wave measurement system using an aerial moving body of the fourteenth embodiment and a power transmission system to an aerial moving body by a wireless power transmission device of the fourteenth embodiment is described. FIG. 38 is a configuration diagram illustrating the radio wave measurement system using the aerial moving body of the fourteenth embodiment of the present disclosure and the power transmission system to the aerial moving body by the wireless power transmission device of the fourteenth embodiment. FIG. 39 is a view illustrating an internal configuration of the measurement system control device and the on-board control device in the radio wave measurement system using the aerial moving body of the fourteenth embodiment. FIG. 40 is a view illustrating an internal configuration of a power transmission control device and an on-board control device in the power transmission system to the aerial moving body by the wireless power transmission device of the fourteenth embodiment.

In FIG. 38, points different from FIG. 16 of the sixth embodiment are described. A mounted device 13N mounted on a drone 3N includes positioning sensor 18H that is also used as time device 52. Measurement data 77H including position data 74H to which time data 85 is added is sent to a measurement system control device 21N. Measurement system control device 21N includes time device 53. Power transmission control device 22J includes time device 54. An on-board control device 16N, measurement system control device 21N, and power transmission control device 22J can use the synchronized time.

In FIG. 39, points different from FIG. 23 of the ninth embodiment are described. On-board control device 16N includes a mobile communicator 301N. Measurement system control device 21N includes a measurement control communicator 101N. Mobile communicator 301N and measurement control communicator 101N use not mobile communication system 12, but measurement communication system 45.

In FIG. 40, points different from FIG. 27 of the tenth embodiment are described. On-board control device 16N includes a mobile communicator 301N. Because power transmission control device 22J uses measurement communication system 45 through measurement system control device 21N, there is no change in power transmission control communicator 204.

The fourteenth embodiment as the radio wave measurement system operates similarly to the radio wave measurement system of the ninth embodiment. The radio wave measurement system of the fourteenth embodiment has the effect similar to that of the ninth embodiment. The detection data and the position data are combined using the synchronized time data, so that the beam shape can more accurately be measured.

The power transmission system to the aerial moving body of the fourteenth embodiment operates similarly to the tenth embodiment. The power transmission system of the fourteenth embodiment has the effect similar to that of the tenth embodiment. Time data 85 is included in detection data 73J used to perform the REV method, so that the REV method can accurately be performed.

Fifteenth Embodiment

Figure 41:
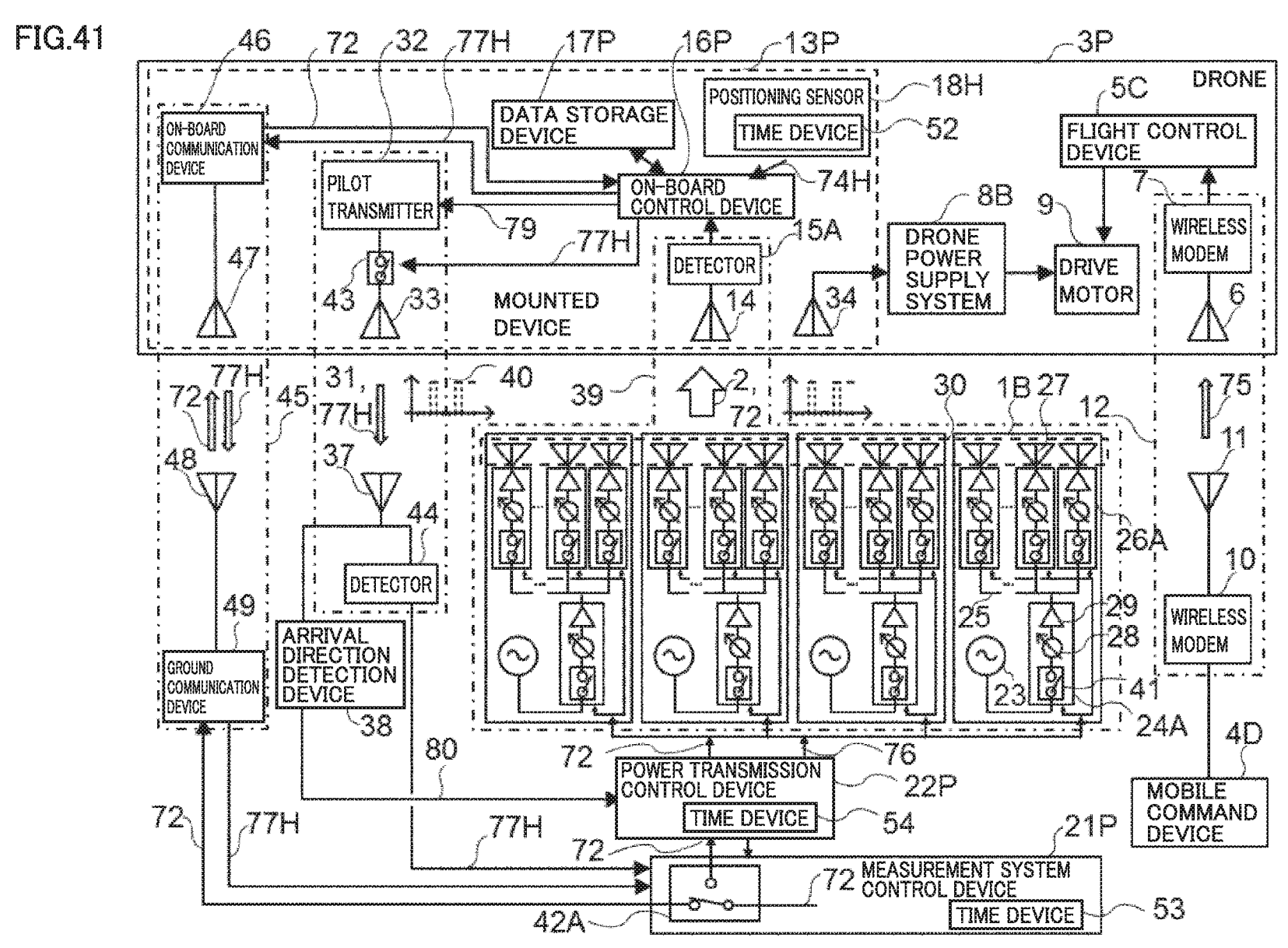
Figure 42:
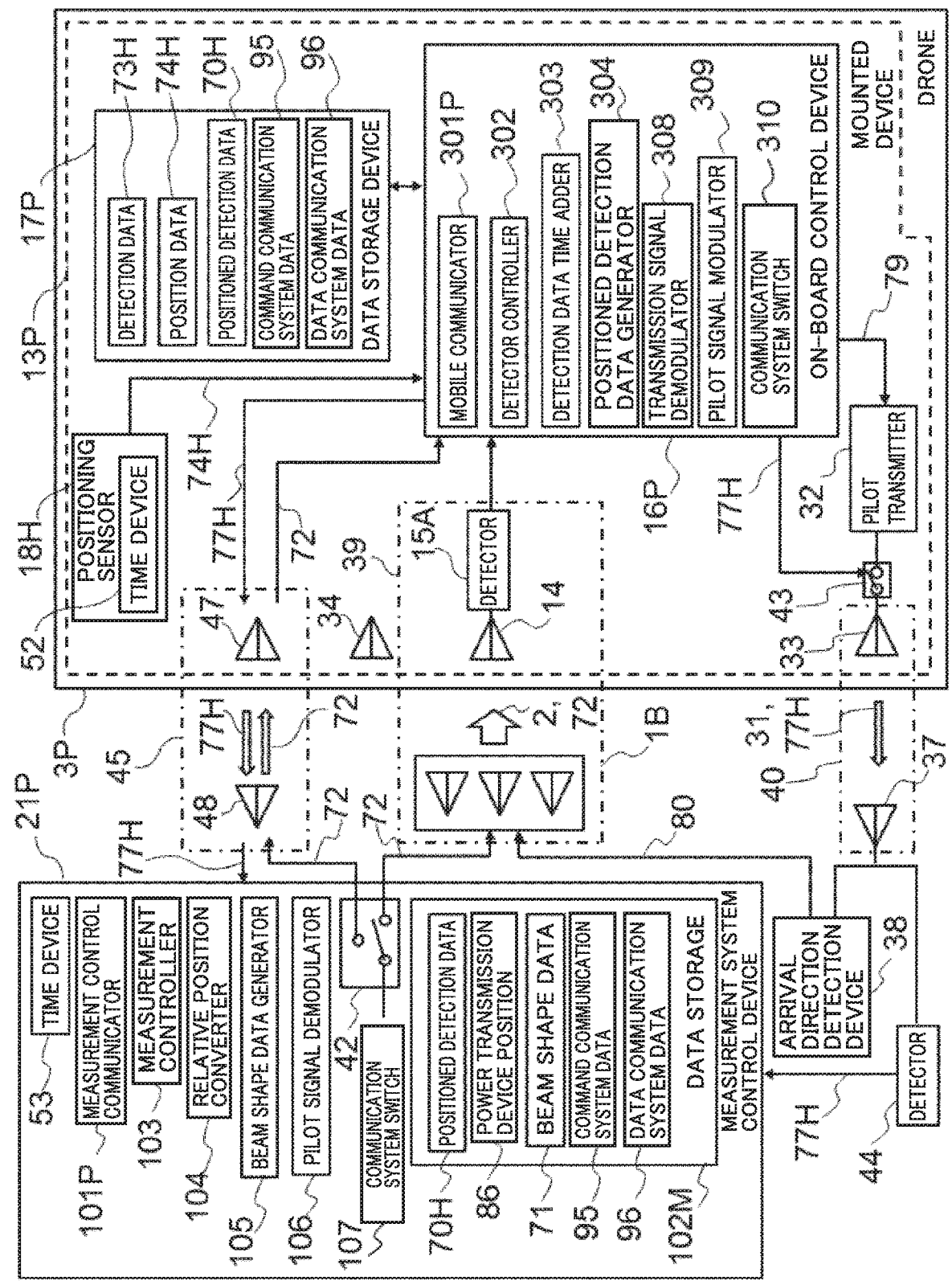
FIG. 42 is a view illustrating an internal configuration of a measurement system control device and an on-board control device in the radio wave measurement system using the aerial moving body of the fifteenth embodiment.

A fifteenth embodiment is the case that the seventh embodiment is changed such that the aerial moving body and the ground-side device are equipped with time devices synchronized with each other. The fifteenth embodiment is different from the fourteenth embodiment in that the fifteenth embodiment includes power transmission communication system 39 and pilot communication system 40. With reference to FIGS. 41 and 42, a configuration of a radio wave measurement system using an aerial moving body of the fifteenth embodiment and a power transmission system to an aerial moving body by a wireless power transmission device of the fifteenth embodiment is described. FIG. 41 is a configuration diagram illustrating the radio wave measurement system using the aerial moving body of the fifteenth embodiment of the present disclosure and the power transmission system to the aerial moving body by the wireless power transmission device of the fifteenth embodiment. FIG. 42 is a view illustrating an internal configuration of the measurement system control device and the on-board control device in the radio wave measurement system using the aerial moving body of the fifteenth embodiment. Although described later, because power transmission communication system 39 and pilot communication system 40 are not used when the REV method is performed, the internal configuration of the power transmission control device is similar to that in FIG. 40 of the fourteenth embodiment.

In FIG. 41, points different from FIG. 18 of the seventh embodiment are described. A mounted device 13P mounted on a drone 3P includes positioning sensor 18H that is also used as time device 52. Position data 74H measured by positioning sensor 18H is sent to a measurement system control device 21P. Measurement system control device 21P includes time device 53. A power transmission control device 22P includes time device 54. An on-board control device 16P, measurement system control device 21P, and power transmission control device 22P can use the synchronized time.

FIG. 41 differs from FIG. 35 of the thirteenth embodiment in that mobile communication system 12 does not exist but measurement communication system 45 exists.

In FIG. 42, points different from FIG. 36 of the thirteenth embodiment are described. On-board control device 16P includes a mobile communicator 301P. Measurement system control device 21P includes a measurement control communicator 101P. Mobile communicator 301P and measurement control communicator 101P use not mobile communication system 12, but measurement communication system 45.

The reason why power transmission communication system 39 and pilot communication system 40 are not used when the REV method is performed is described below. While performing the REV method, it is necessary to change only the phase shift amount of designated phase shifter 28, without changing other states. For this reason, in power transmission communication system 39 that needs to switch whether or not to radiate the radio wave from at least a part of the element antennas 27, the communication cannot be performed while the REV method is performed. Detection data 73J has a large data amount, and pilot communication system 40 lacks a sufficient communication capacity, so that the pilot communication system 40 is not used when the REV method is performed. When the data amount that is sent from the drone and is necessary to perform the REV method becomes smaller or when the communication capacity of pilot communication system 40 becomes larger, pilot communication system 40 can be used while performing the REV method.

The radio wave measurement system of the fifteenth embodiment operates similarly to the fifth embodiment and the similar effect can be obtained. The detection data and the position data are combined using the synchronized time data, so that the beam shape can more accurately be measured.

The power transmission system to the aerial moving body of the fifteenth embodiment operates similarly to the tenth embodiment and the fourteenth embodiment, and the similar effects can be obtained. Time data 85 is included in detection data 73J used to perform the REV method, so that the REV method can be performed accurately.

Sixteenth Embodiment

Figure 43:
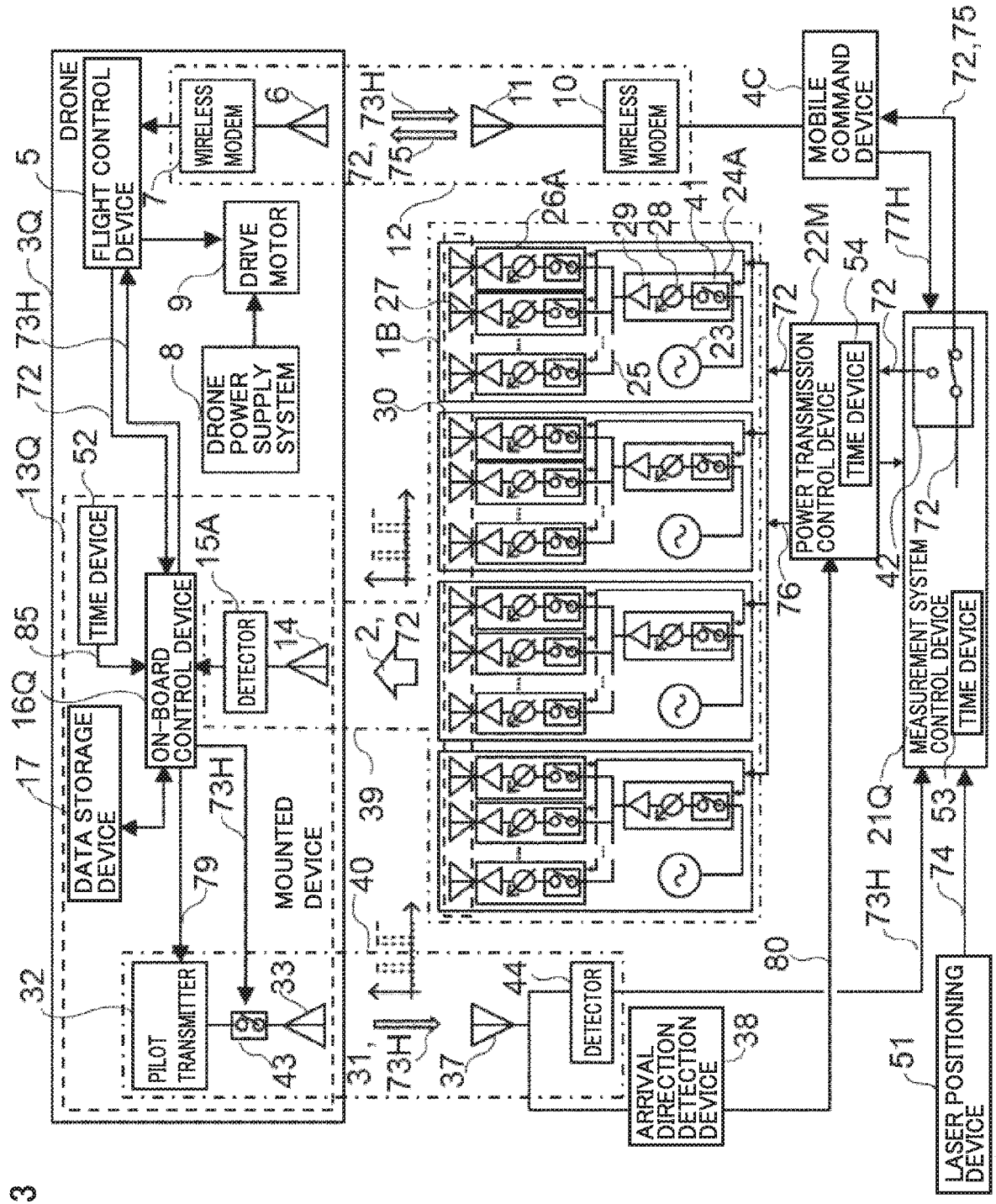
FIG. 43 is a configuration diagram illustrating a radio wave measurement system using an aerial moving body according to a sixteenth embodiment of the present disclosure.
Figure 44:
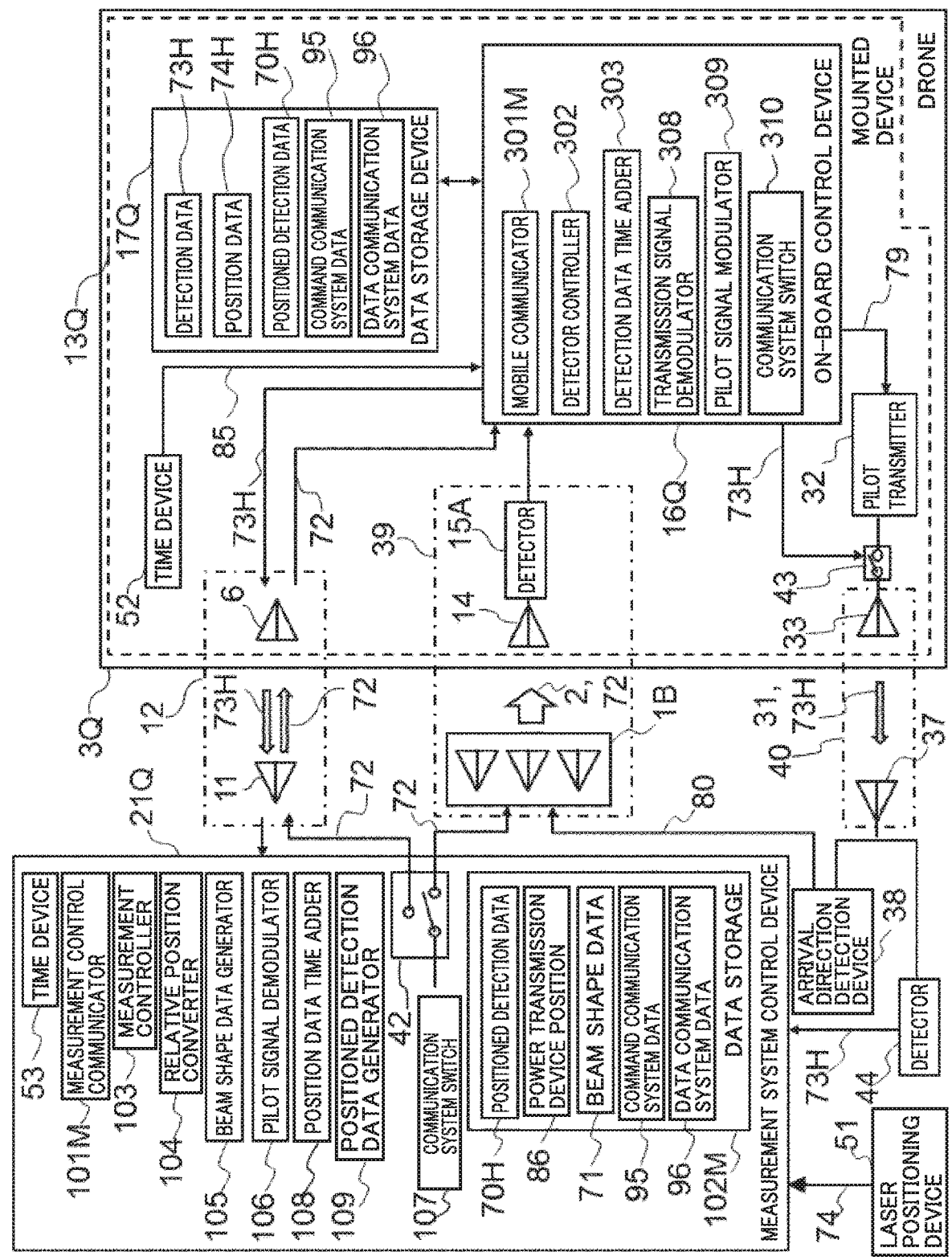
FIG. 44 is a view illustrating an internal configuration of a measurement system control device and an on-board control device in the radio wave measurement system using the aerial moving body of the sixteenth embodiment.

A sixteenth embodiment is the case that the eighth embodiment is changed such that the aerial moving body and the ground-side device are equipped with time devices synchronized with each other. As compared with the thirteenth embodiment, the sixteenth embodiment is the case that the position of the aerial moving body is measured from the ground. With reference to FIGS. 43 and 44, a configuration of a radio wave measurement system using an aerial moving body according to the sixteenth embodiment is described. FIG. 43 is a configuration diagram illustrating the radio wave measurement system using the aerial moving body of the sixteenth embodiment of the present disclosure. FIG. 44 is a view illustrating an internal configuration of the measurement system control device and the on-board control device in the radio wave measurement system using the aerial moving body of the sixteenth embodiment.

In FIG. 43, points different from FIG. 20 of the eighth embodiment are described. A mounted device 13Q mounted on a drone 3Q includes time device 52. A measurement system control device 21Q includes time device 53. A power transmission control device 22Q includes time device 54. An on-board control device 16Q, measurement system control device 21Q, and power transmission control device 22M can use the synchronized time.

In FIG. 44, points different from FIG. 36 of the thirteenth embodiment are described. On-board control device 16Q does not include positioned detection data generator 304. Measurement system control device 21Q includes position data time adder 108 and positioned detection data generator 109. Position data time adder 108 adds time data 85 at the point of time when time data 73 is received, to position data 73 inputted from laser positioning device 51. Laser positioning device 51 may include the time device, and output position data 73H including time data 85. When laser positioning device 51 outputs position data 73H, position data time adder 108 can be omitted.

Positioned detection data generator 109 generates positioned detection data 70H by pairing detection data 73H and position data 74H to which identical time data 85 is attached. Positioned detection data 70H is stored in a data storage 102Q.

Figure 45:
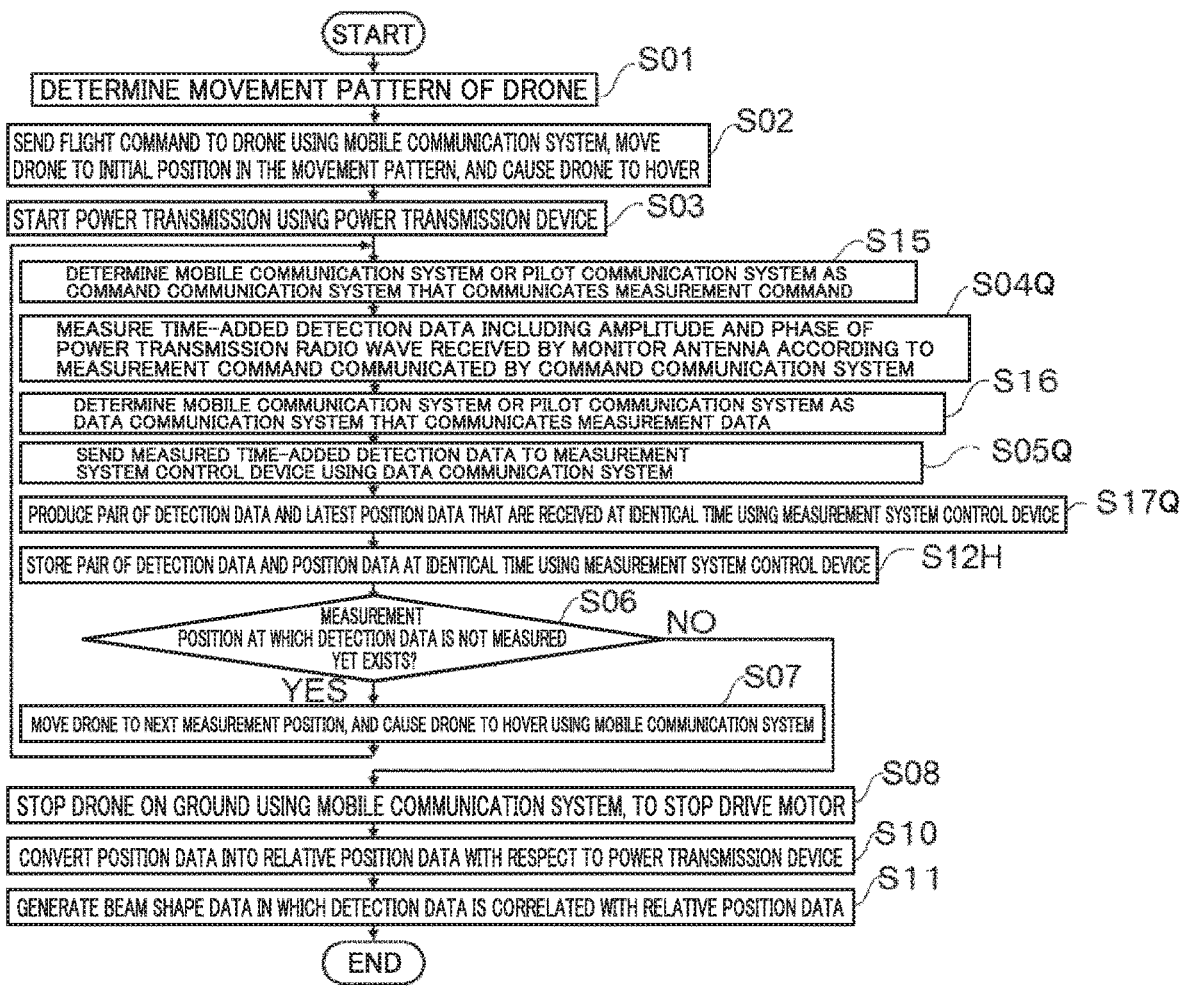
FIG. 45 is a flowchart illustrating a procedure for measuring the radiation pattern of the radio wave in the radio wave measurement system using the aerial moving body of the sixteenth embodiment.

The operation is described. FIG. 45 is a flowchart illustrating a procedure for measuring the radiation pattern of the radio wave in the radio wave measurement system using the aerial moving body of the sixteenth embodiment. In FIG. 45, points different from FIG. 37 of the thirteenth embodiment are described. In step S04Q, drone 3Q does not measure position data 74. In step S05Q, detection data 73H measured by drone 3Q is sent from on-board control device 16Q to flight control device 5, and sent to measurement system control device 21Q through mobile communication system 12 and mobile command device 4C. In step S17Q, measurement system control device 21Q combines received detection data 73H and position data 74H having the identical time data 85 to produce positioned detection data 70H.

The radio wave measurement system of the sixteenth embodiment has the effect similar to that of the eighth embodiment. The detection data and the position data are combined using the synchronized time data, so that the beam shape can be measured more accurately.

Seventeenth Embodiment

A seventeenth embodiment is changed from the tenth embodiment in the following two points. (Change A) Only when the pilot signal can be received, the wireless power transmission device radiates the radio wave. (Change B) The radiation direction is determined from the pilot signal before power transmission device 1A radiates the radio wave, and the radio wave is radiated in the radiation direction. When the REV method is performed, the state where the radio wave is radiated in the radiation direction is taken as the reference state of the REV method.

Figure 46:
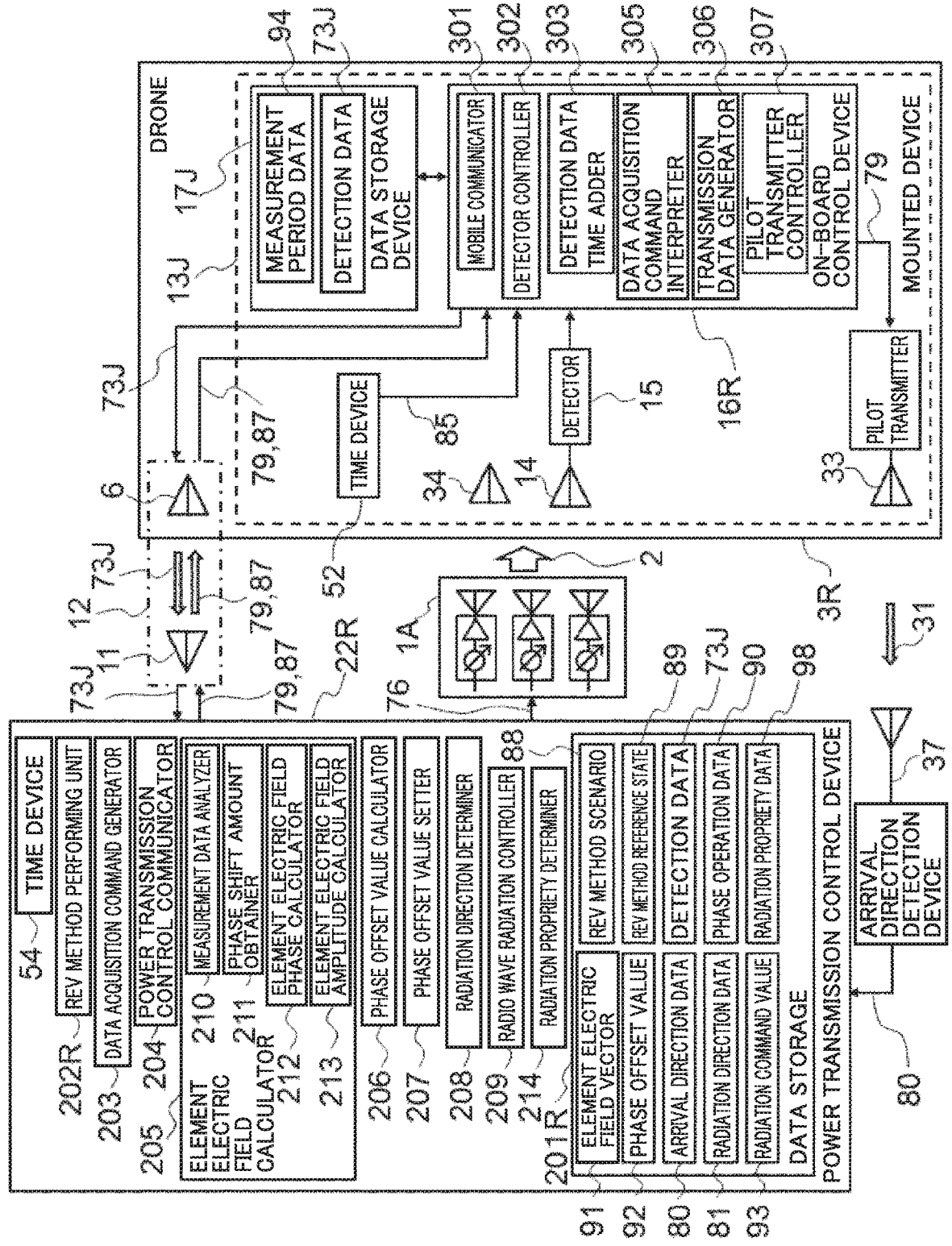
FIG. 46 is a view illustrating an internal configuration of a power transmission control device and an on-board control device in a power transmission system to an aerial moving body by the wireless power transmission device according to a seventeenth embodiment.

The seventeenth embodiment differs from the tenth embodiment only in that a power transmission control device 22R is changed. With reference to FIG. 46, a configuration of a power transmission system to an aerial moving body by a wireless power transmission device according to the seventeenth embodiment is described. FIG. 46 is a view illustrating an internal configuration of a power transmission control device and an on-board control device in the power transmission system to the aerial moving body by the wireless power transmission device of the seventeenth embodiment.

In FIG. 46, points different from FIG. 27 of the tenth embodiment are described. Power transmission control device 22R includes a radiation determiner 214. Radiation determiner 214 determines whether or not power transmission device 1A radiates the radio wave. A data storage 201R, a REV method performing unit 202R, and a radio wave radiation controller 209R are also changed. Data storage 201R also stores radiation allowance data 98. Radiation allowance data 98 is data indicating whether or not power transmission device 1A is allowed to radiate the radio wave.

Radiation determiner 214 determines whether or not the radio wave is radiated from the signal strength of pilot signal 31, and sets radiation allowance data 98. When the signal strength of pilot signal 31 is greater than or equal to a threshold, radiation determiner 214 determines allowance of the radiation, namely, that the radiation is allowed. When the signal strength of pilot signal 31 is less than the threshold, radiation determiner 214 determines non-allowance of the radiation, namely, that the radiation is not allowed. When the signal strength of the pilot signal 31 is greater than or equal to the threshold, it is said that pilot signal 31 can be received. When the signal strength of pilot signal 31 is less than the threshold, it is said that pilot signal 31 cannot be received.

Radio wave radiation controller 209R refers to the radiation allowance data 98 to generate radiation command value 93 and power transmission control signal 76 with respect to each element module. When radiation allowance data 98 is changed to the non-allowance of the radiation, radio wave radiation controller 209R sends power transmission control signal 76 prohibiting the power transmission to power transmission device 1A. While power transmission device 1A is transmitting the power (radiating the radio wave), power transmission device 1A stops the power transmission when receiving power transmission control signal 76 prohibiting the power transmission. After power transmission control signal 76 prohibiting the power transmission is received, the power transmission device 1A cannot transmit the power until receiving power transmission control signal 76 permitting (not prohibiting) the power transmission.

When radiation allowance data 98 is changed to the allowance of the radiation, radio wave radiation controller 209R sends power transmission control signal 76 notifying power transmission device 1A that the power transmission can be performed. When receiving power transmission control signal 76 notifying power transmission device 1A that the power transmission can be performed, power transmission device 1A cancels the prohibition of the power transmission. Power transmission control signal 76 notifying power transmission device 1A that the power transmission can be performed may not be sent, but power transmission may be performed when power transmission control signal 76 representing radiation command value 93 is received even in the state of the power transmission prohibition.

Radiation allowance data 98 indicates that the radiation is allowed, power transmission device 1A is not in the state of the power transmission prohibition state, the power transmission is required, and the power transmission direction is determined. At this point, radio wave radiation controller 209R sends power transmission control signal 76 generated based on radiation command value 93 to power transmission device 1A. Otherwise, radio wave radiation controller 209R does not generate radiation command value 93, and does not send power transmission control signal 76 generated based on radiation command value 93 to power transmission device 1A. That is, wireless power transmission device 1A is controlled based on the radiation allowance data 98 that is the determination result of radio wave radiation determiner 214. Wireless power transmission device 1A is controlled so as to radiate power transmission radio wave 2 when the signal strength of received pilot signal 31 is greater than or equal to the threshold. Wireless power transmission device 1A is controlled so as not to radiate power transmission radio wave 2 when the signal strength of obtained pilot signal 31 is less than the threshold.

REV method performing unit 202R determines the radiation direction from pilot signal 31 before power transmission device 1A radiates the radio wave for purpose of the REV method, and sets the state where the radio wave is radiated in the radiation direction to REV method reference state 89. Subsequently, REV method performing unit 202R performs REV method scenario 88 to radiate the radio wave.

Before the radio wave is radiated for the purpose of the power transmission after the REV method is performed, wireless power transmission device 1A determines the radiation direction based on the pilot signal 31 and radiates power transmission radio wave 2 to start the power transmission. Consequently, the radio wave radiated in a direction different from the direction in which drone 3R exists can be reduced.

Figure 47:
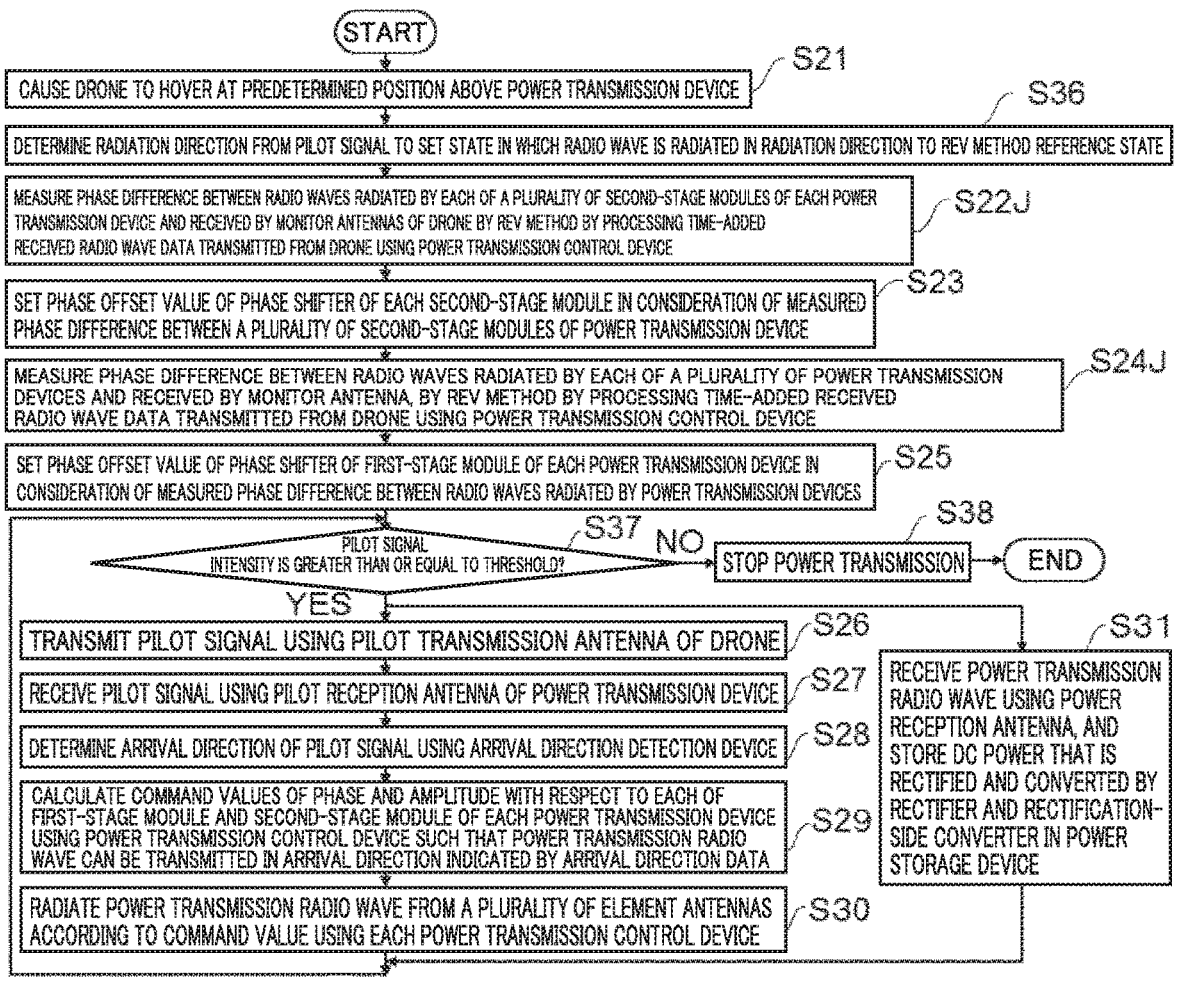
FIG. 47 is a flowchart illustrating the power transmission procedure in the power transmission system to the aerial moving body by the wireless power transmission device of the seventeenth embodiment.

The operation is described. FIG. 47 is a flowchart illustrating a power transmission procedure in the power transmission system to the aerial moving body by the wireless power transmission device of the seventeenth embodiment. In FIG. 47, points different from FIG. 28 of the tenth embodiment are described.

Step S36 is added subsequent to step S21, in step S36, REV method performing unit 202R determines the radiation direction from pilot signal 31, and sets the phase shift amount of each phase shifter 28 in the state where power transmission radio wave 2 is radiated in the radiation direction in REV method reference state 89.

Steps S23 and S25 of setting the phase offset value to phase shifter 28 are the state where power transmission device 1A does not radiate the radio wave. In step S37 performed before step S26, whether or not the signal strength (pilot signal strength) of pilot signal 31 is greater than or equal to the threshold is checked when steps S26 to S30 are performed repeatedly in a determined period after performing step S25 and while performing the power transmission. When the pilot signal strength is greater than or equal to the threshold (YES in S37), the power transmission processing in steps S26 to S30 is continued. When the pilot signal strength is less than the threshold (NO in S37), the power transmission is stopped in step S38. The threshold is set appropriately to a small value based on the pilot signal strength in the state where pilot signal 31 can be received normally.

In the power transmission processing of steps S26 to S30, after the arrival direction in which pilot signal 31 transmitted by drone 3R arrives is determined, the power transmission is performed while the direction toward the arrival direction is set to the radiation direction.

The state where the pilot signal strength is less than the threshold is considered to be any one of the following states.
(State 1) A state where some sort of abnormality is occurred in drone 3R and power transmission radio wave 2 cannot be received.
(State 2) A state where an attitude of drone 3R is inclined and power reception antenna 34 and pilot transmitter 32 are not directed toward power transmission device 1A.

In either (state 1) or (state 2), the power transmitted from power transmission device 1A is wasted because the power cannot be received by drone 3R By comparing the pilot signal strength to the threshold, (state 1) or (state 2) can be detected, and power transmission radio wave 2 can be prevented from being radiated wastefully.

Only (change A) or (change B) may be performed. At least one of (change A) and (change B) may be applied to an embodiment of a power transmission system different from the tenth embodiment.

Eighteenth Embodiment

Figure 48:
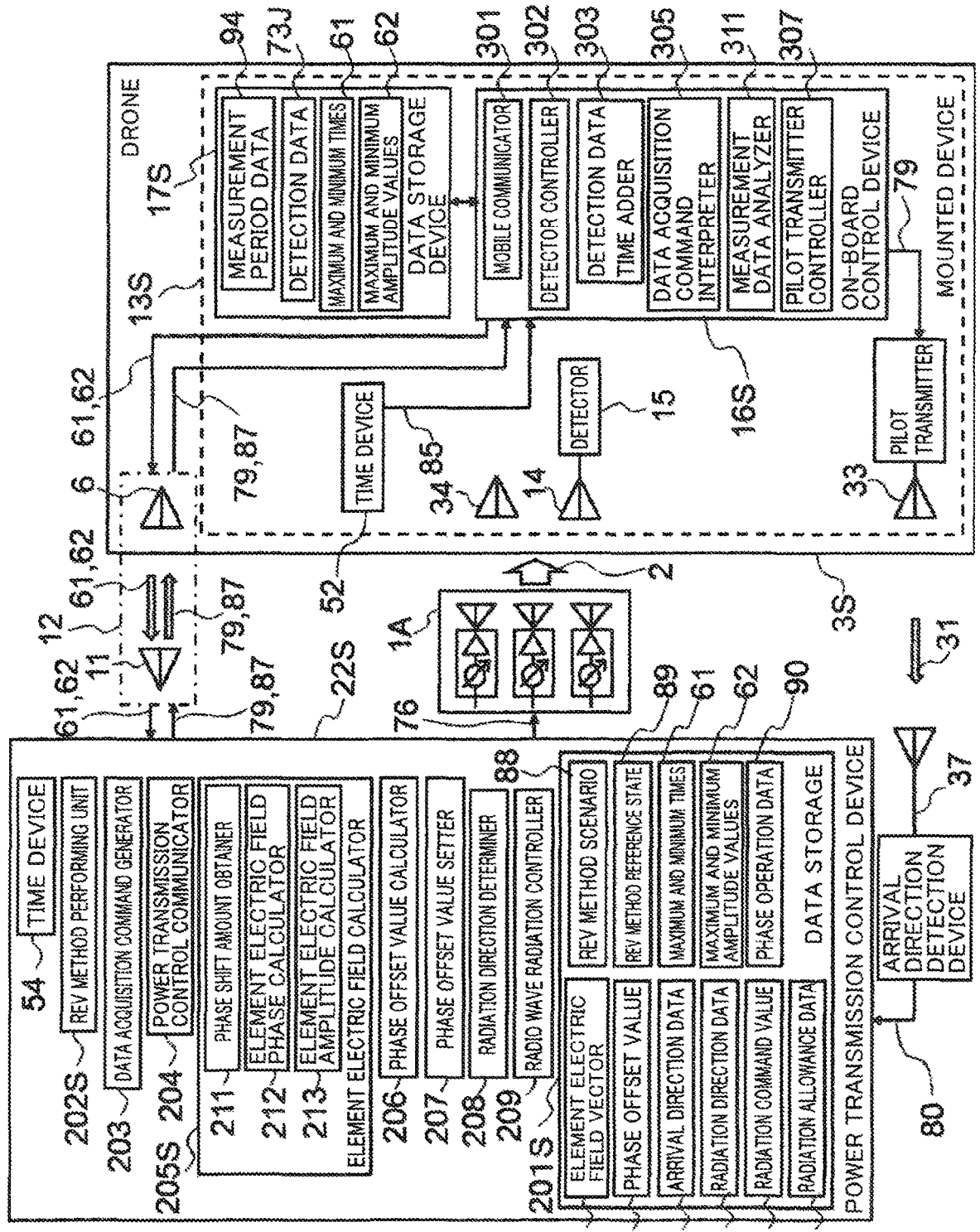
FIG. 48 is a view illustrating an internal configuration of a power transmission control device and an on-board control device in a power transmission system to an aerial moving body by the wireless power transmission device according to an eighteenth embodiment.

An eighteenth embodiment is the case that the seventeenth embodiment is changed such that a part of the processing of calculating the element electric field vector by the REV method is performed by the aerial moving body to reduce the data amount sent from the aerial moving body to the power transmission control device. In the eighteenth embodiment, as compared with the seventeenth embodiment, a power transmission control device 22S, an on-board control device 16S, and a data storage device 17S are changed. With reference to FIG. 48, a configuration of a power transmission system to an aerial moving body by a wireless power transmission device according to the eighteenth embodiment is described. FIG. 48 is a view illustrating an internal configuration of a power transmission control device and an on-board control device in the power transmission system to the aerial moving body by the wireless power transmission device of the eighteenth embodiment. In FIG. 48, points different from FIG. 46 of the seventeenth embodiment are described.

Measurement period Tj is a plurality of periods of which drone 3S is notified by the data acquisition command. Each measurement period corresponds to a period in which the operation phase shifter changes the phase shift amount. Data storage device 17S mounted on drone 3S also stores maximum and minimum times 61 and maximum and minimum amplitude values 62. Maximum and minimum times 61 is time tjmax at which electric field strength Cj(t) detected actually in measurement period Tj takes the maximum value and time tjmin at which electric field strength Cj(t) takes the minimum value. Maximum and minimum amplitude values 62 is a maximum value Cjmax and a minimum value Cjmin of electric field strength Cj(t) in measurement period Tj. Maximum and minimum times 61 and maximum and minimum amplitude values 62 are sent from on-board control device 16S to power transmission control device 22S as a response to data acquisition command 87. Maximum and minimum times 61 and maximum and minimum amplitude values 62 are electric field change data representing the change in the electric field in measurement period Tj. Only maximum and minimum times 61 may be sent as the electric field change data.

On-board control device 16S does not includes transmission data generator 306, but includes a measurement data analyzer 311. Measurement data analyzer 311 performs the processing similar to that of measurement data analyzer 210 of power transmission control device 22J in the tenth embodiment. Measurement data analyzer 311 detects time tjmax and time tjmin from electric field strength Cj(t) measured actually in measurement period Tj. Maximum value Cjmax and minimum value Cjmin of electric field strength Cj(t) are also detected. Measurement period Tj is an analysis period in which electric field strength Cj(t) measured in the measurement period Tj is analyzed. Time tjmax and time tjmin that are stored in data storage device 17S as maximum and minimum times 61 are the phase shift amount detection time obtained by analyzing electric field strength Cj(t) measured in each analysis period. Measurement data analyzer 311 detects the phase shift amount detection time in each analysis period.

Mobile communicator 301 sends maximum and minimum times 61 and maximum and minimum amplitude values 62 to power transmission control device 22S. Mobile communicator 301 does not send electric field strength Cj measured in measurement period Tj, namely, detection data 73J, to power transmission control device 22S.

A data storage 201S of power transmission control device 22S stores maximum and minimum times 61 and maximum and minimum amplitude values 62 that are sent from drone 3S. Because detection data 73J is not sent from drone 3S, detection data 73J is not stored in data storage 201S.

An element electric field calculator 205S does not include measurement data analyzer 210. Phase shift amount obtainer 211 obtains the phase shift amount of phase shifter 28j recorded in phase operation data 90 at time tjmax and time tjmin that are maximum and minimum times 61. Element electric field phase calculator 212 calculates the phase (element electric field phase) of element electric field vector 91 of phase shifter 28j in which the phase is changed. Element electric field amplitude calculator 213 calculates the amplitude of element electric field vector 91 from the ratio of maximum value Cjmax and minimum value Cjmin of electric field strength Cj(t). Phase offset value calculator 206 calculates phase offset value 92 of each phase shifter 28 from the phase of element electric field vector 91 of each phase shifter 28. Phase offset value setter 207 sets phase offset value 92 to each phase shifters 28.

Figure 49:
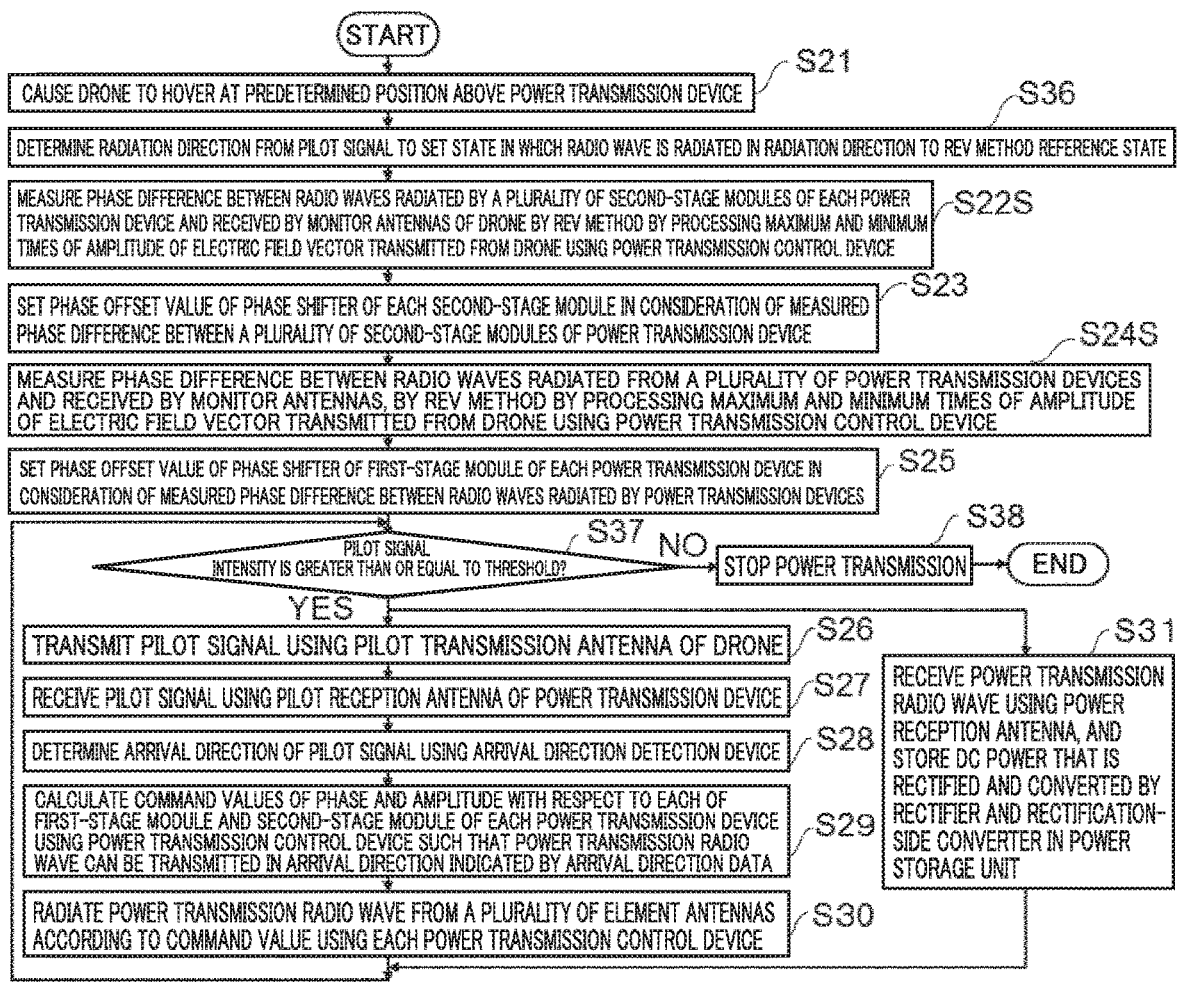
FIG. 49 is a flowchart illustrating the power transmission procedure in the power transmission system to the aerial moving body by the wireless power transmission device of the eighteenth embodiment.
Figure 50:
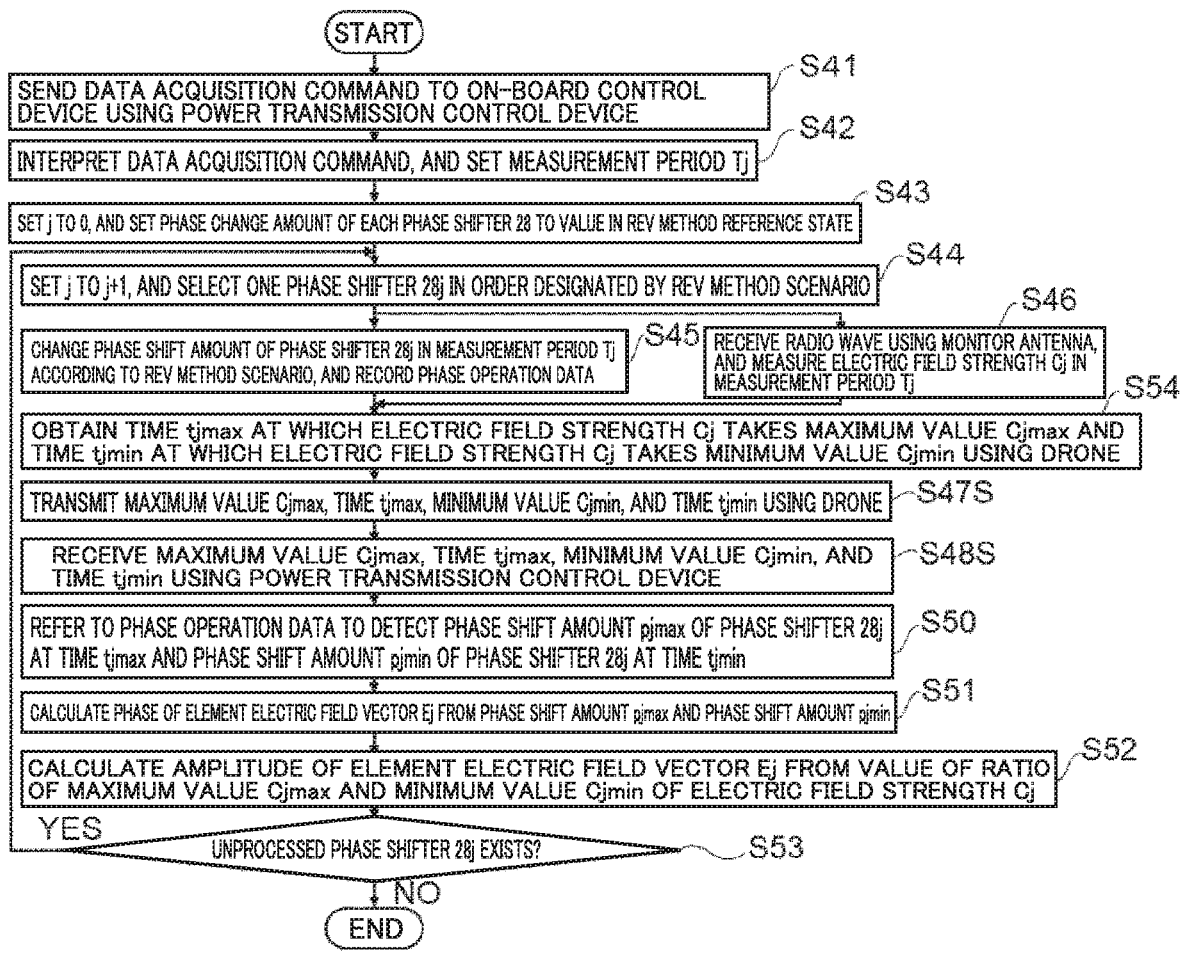
FIG. 50 is a flowchart illustrating the procedure for calculating the element electric field vector of the radio wave radiated from each element antenna by the REV method in the power transmission system to the aerial moving body by the wireless power transmission device of the eighteenth embodiment.

The operation is described. FIG. 49 is a flowchart illustrating a power transmission procedure in the power transmission system to the aerial moving body by the wireless power transmission device of the eighteenth embodiment. FIG. 50 is a flowchart illustrating the procedure for calculating the element electric field vector of the radio wave radiated from each element antenna by the REV method in the power transmission system to the aerial moving body by the wireless power transmission device of the eighteenth embodiment.

In FIG. 49, points different from FIG. 47 of the seventeenth embodiment are described. In step S22S of obtaining the element electric field vector of second-stage module 26, the element electric field vector of the radio wave radiated by an element antenna 27j in which the phase is controlled by phase shifter 29j is calculated using maximum and minimum times 61 sent from drone 3S. In step S24S, in order to obtain the phase difference of the electric field vector generated by power transmission device 1A, the REV method is performed on first-stage module 24 similarly to step S22S.

In FIG. 50, points different from FIG. 29 of the tenth embodiment are described. Step S54 is added before step S47S. In step S54, measurement data analyzer 311 of drone 3S detects maximum value Cjmax of electric field strength Cj in measurement period Tj and time tjmax at which maximum value Cjmax is taken. Additionally, measurement data analyzer 311 detects minimum value Cjmin of electric field strength Cj in measurement period Tj and time tjmin at which minimum value Cjmin is taken.

The processing in step S54 corresponds to the processing in step S49 of FIG. 29. For this reason, the processing in step S49 does not exist in FIG. 50.

In step S47S, mobile communicator 301 sets time tjmax and time tjmin to maximum and minimum times 61, sets maximum value Cjmax and minimum value Cjmin to maximum and minimum amplitude values 62, and sends time tjmax, time tjmin, maximum value Cjmax, and minimum value Cjmin to power transmission control communicator 204 of power transmission control device 22S.

In step S48S, power transmission control communicator 204 receives time Cjmax, time tjmin, maximum value Cjmax, and minimum value Cjmin.

Step S50 is performed after step S48S. The subsequent steps are similar to those in FIG. 29.

In the power transmission system to the aerial moving body of the eighteenth embodiment, the data amount sent from drone 3S to execute the REV method can be reduced in addition to the effect exhibited by the seventeenth embodiment.

Nineteenth Embodiment

A nineteenth embodiment is the case that the seventeenth embodiment is changed such that the processing of calculating the element electric field vector by the REV method is performed by the aerial moving body to reduce the data amount sent from the aerial moving body to the power transmission control device. Additionally, in the REV method scenario, the phase shift amount of each phase shifter is set discretely, and the time when the phase shift amount takes the same value is set to an appropriate length. Consequently, an error in obtaining the phase shift amount from time can be reduced using not the record of the actual change in the phase shift amount of the phase shifter, but the REV method scenario.

Figure 51:
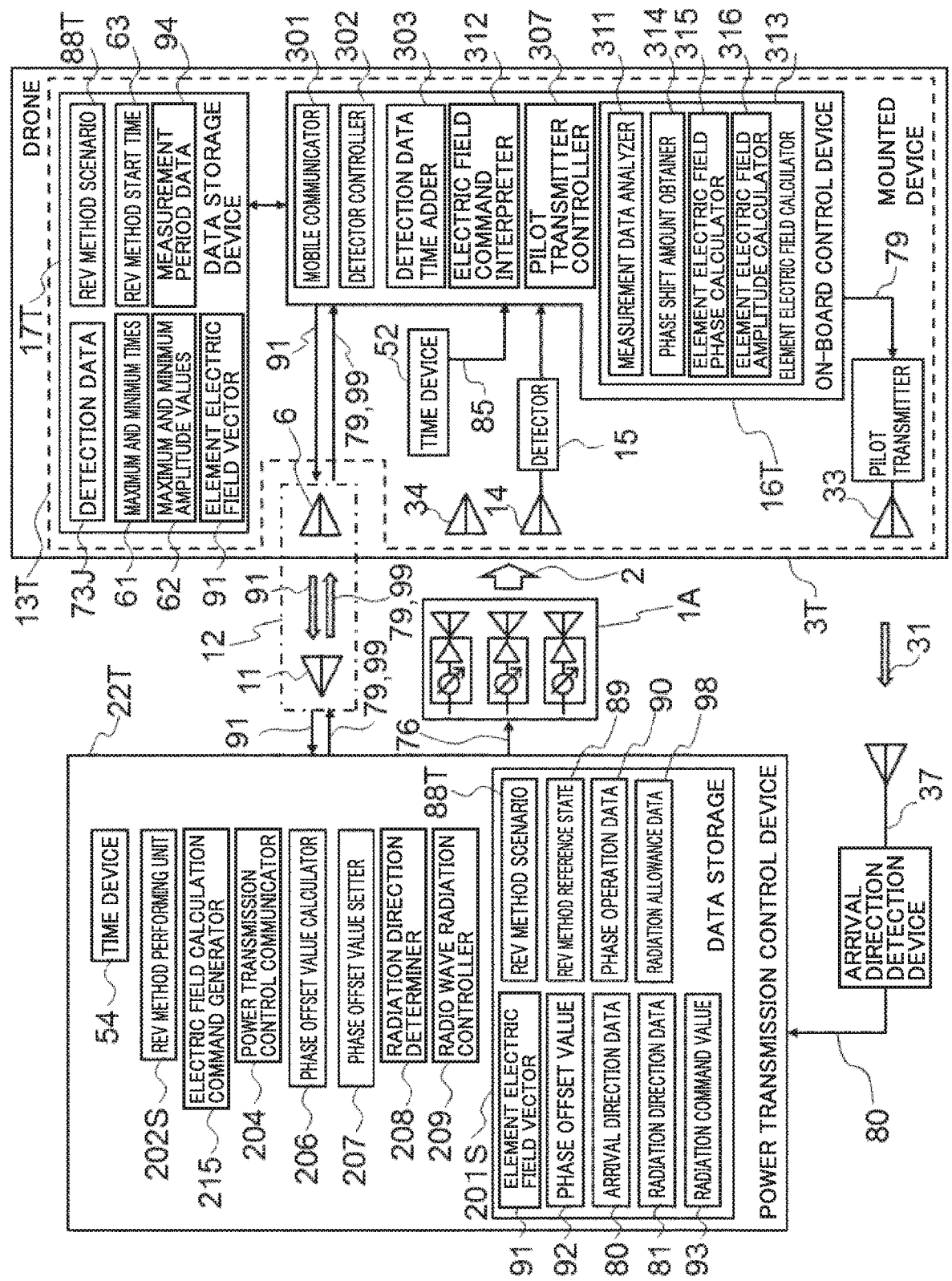
FIG. 51 is a view illustrating an internal configuration of a power transmission control device and an on-board control device in a power transmission system to an aerial moving body by the wireless power transmission device according to a nineteenth embodiment.

In the nineteenth embodiment, as compared with the seventeenth embodiment, a power transmission control device 22T, an on-board control device 16T, and a data storage device 17T are changed. With reference to FIG. 51, a configuration of a power transmission system to an aerial moving body by a wireless power transmission device according to the nineteenth embodiment is described. FIG. 51 is a view illustrating an internal configuration of a power transmission control device and an on-board control device in the power transmission system to the aerial moving body by the wireless power transmission device of the nineteenth embodiment. In FIG. 51, points different from FIG. 48 of the eighteenth embodiment are described.

An electric field calculation command 99 is a command instructing for on-board control device 16T to calculate the element electric field vector. Electric field calculation command 99 is sent from power transmission control device 22T to on-board control device 16T. On-board control device 16T generates detection data 73J. On-board control device 16T calculates element electric field vector 91 of each element module based on detection data 73J and REV method scenario 88. On-board control device 16T sends element electric field vector 91 to power transmission control device 22T.

Power transmission control device 22T does not include data acquisition command generator 203 and element electric field calculator 205. A data storage 201T does not store maximum and minimum times 61 and maximum and minimum amplitude values 62. Data storage 201T stores a REV method scenario 88T. REV method scenario 88T is changed from REV method scenario 88 so that on-board control device 16T calculates easily element electric field vector 91. REV method scenario 88T is described later.

Power transmission control device 22T includes an electric field calculation command generator 215 that generates electric field calculation command 99. Electric field calculation command 99 is sent to on-board control device 16T by mobile communication system 12. Electric field calculation command 99 includes a REV method start time 63. A REV method start time 63 is time at which REV method performing unit 202 of power transmission control device 22T starts to perform REV method scenario 88T. In REV method scenario 88T, the start of performing the scenario is the reference event, and other events are the non-reference event in which the time is represented by the relative time from the start of performing the scenario.

When the REV method scenario has a plurality of reference events, electric field calculation command 99 may be sent a plurality of times, or a command conveying the time of the reference event may be sent at least once and electric field calculation command 99 may be sent once.

On-board control device 16T includes an electric field calculation command interpreter 312 and an element electric field calculator 313. A data storage device 17T stores REV method scenario 88T, REV method start time 63, measurement period data 94, detection data 73J, maximum and minimum times 61, maximum and minimum amplitude values 62, and element electric field vector 91. REV method scenario 88T is stored in data storage device 17T before drone 3T takes off.

REV method scenario 88T stored in data storage device 17T may be identical to that included in power transmission control device 22T, or may include only data necessary for element electric field calculator 313. Maximum and minimum times 61 and maximum and minimum amplitude values 62 are data used to obtain element electric field vector 91 by element electric field calculator 313. Maximum and minimum times 61 and maximum and minimum amplitude values 62 are used as internal data of element electric field calculator 313, and may not be stored in data storage device 17T.

When receiving electric field calculation command 99, electric field calculation command interpreter 312 takes out REV method start time 63 from electric field calculation command 99, and stores REV method start time 63 in data storage device 17T. Measurement period data 94 that is measurement period Tj of each operation phase shifter is set by referring to REV method scenario 88T. In measurement period data 94, the relative time is replaced with the time using REV method start time 63. The setting of a plurality of measurement periods Tj based on REV method start time 63 and REV method scenario 88T may be applied to the eighteenth embodiment and the like in which time tjmax and time tjmin that are the phase shift amount detection time are obtained by the drone.

Detector controller 302 generates detection data 73 in the measurement period designated by measurement period data 94. Detection data time adder 303 adds time data 85 to detection data 73 to generate detection data 73J. Detection data 73J is stored in data storage device 17J.

Element electric field calculator 313 calculates element electric field vector 91 based on detection data 73J measured in the period designated by measurement period data 94 and REV method scenario 88T. Phase operation data 90 is not sent from power transmission control device 21J to on-board control device 16T. For this reason, element electric field calculator 313 refers to REV method scenario 88T instead of phase operation data 90.

Element electric field calculator 313 includes measurement data analyzer 311, a phase shift amount obtainer 314, an element electric field phase calculator 315, and an element electric field amplitude calculator 316. Similarly to the eighteenth embodiment, measurement data analyzer 311 detects time tjmax and time tjmin at which electric field strength $Cj(t)$ measured actually in measurement period Tj takes the maximum value or the minimum value. The maximum time or the minimum time is not strictly obtained, but the time near a center of the period in which electric field strength $Cj(t)$ takes a value near the maximum or the minimum smoothing a variation due to noise is detected as time tjmax and time tjmin. Maximum value Cjmax and minimum value Cjmin of electric field strength $Cj(t)$ are also detected. Time tjmax and time tjmin are stored in data storage device 17T as maximum and minimum times 61. Maximum value Cjmax and minimum value Cjmin are stored in data storage device 17T as maximum and minimum amplitude values 62.

Phase shift amount obtainer 314 subtracts REV method start time 63 from time tjmax and time tjmin to convert them into the relative time. A phase shift amount pjmax at time tjmax and a phase shift amount pjmin at time tjmin are determined by referring to REV method scenario 88T at time tjmax and time tjmin that are converted into relative time. The relative time in REV method scenario 88T may be converted into the time by adding REV method start time 63, and referred to at time tjmax and time tjmin.

The element electric field phase calculator 315 calculates the element electric field phase of each element module from phase shift amount pjmax and phase shift amount pjmin. Element electric field amplitude calculator 316 calculates the element electric field amplitude from maximum value Cjmax and minimum value Cjmin.

When element electric field calculator 313 does not refer to the phase operation data 90, REV method scenario 88T is changed to be able to obtain the operation phase shift amount surely. In REV method scenario 88T, the phase shift amount of each phase shifter 28 is changed discretely. A period in which phase shifter 28 takes a same phase shift amount is set to at least a predetermined length. That is, in REV method scenario 88T, the phase operation pattern is defined such that each of a plurality of different phase shift amounts of the operation phase shifter (phase shifter 28 in which the phase shift amount is operated) takes at least a predetermined duration.

When a REV method performing unit 202T controls power transmission device 1A according to REV method scenario 88T, an error may be generated in the timing at which the phase shift amount is changed actually. Because the period in which the phase shift amount takes the same value is greater than or equal to a determined length even if the error is generated, so that phase shift amount pjmax and phase shift amount pjmin at time tjmax and time tjmin acquired, by referring to REV method scenario 88T, to have a smaller error. The length of the period in which the phase shift amount takes the same value is determined appropriately in consideration of magnitude of the error in which the performing time fluctuates.

Figure 52:
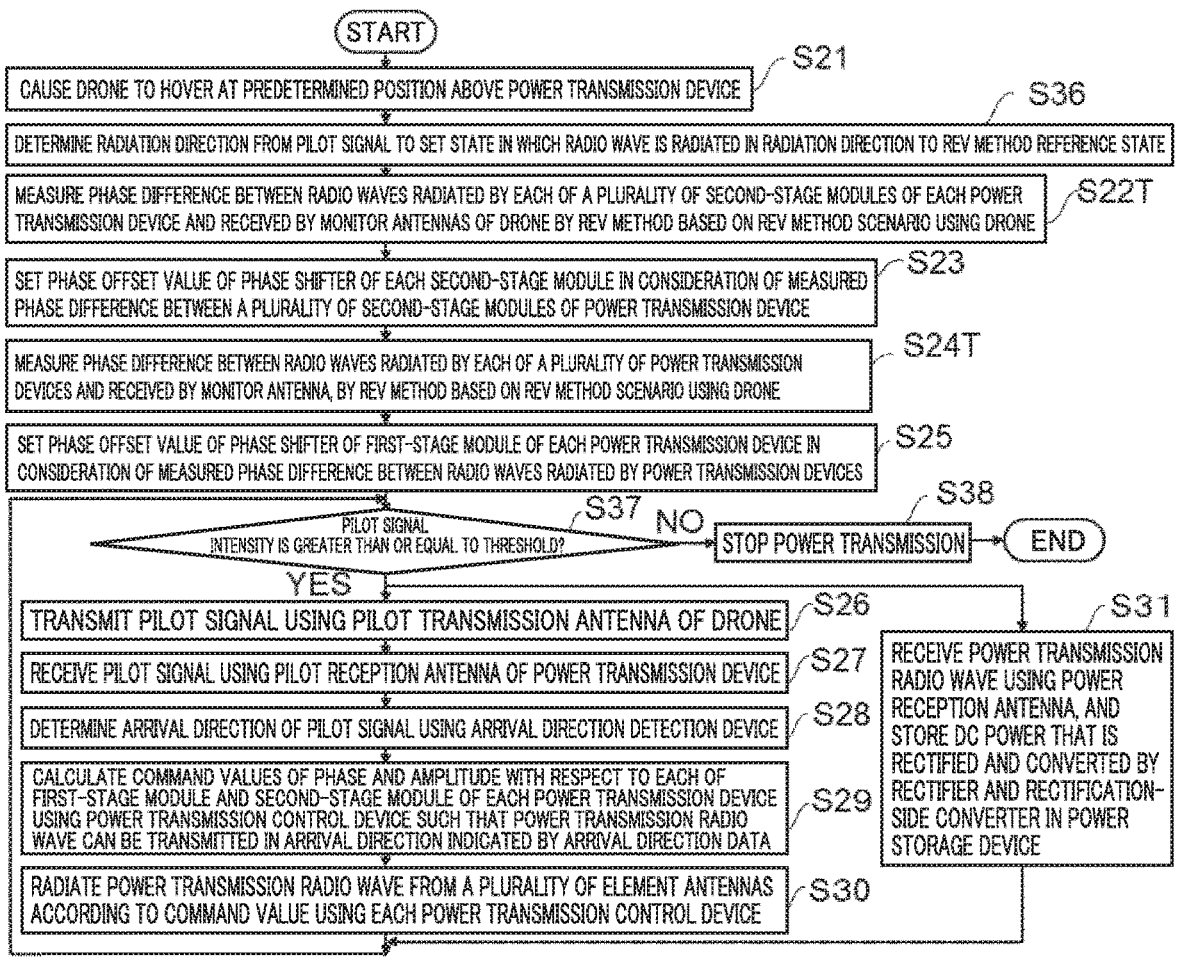
FIG. 52 is a flowchart illustrating the power transmission procedure in the power transmission system to the aerial moving body by the wireless power transmission device of the nineteenth embodiment.
Figure 53:
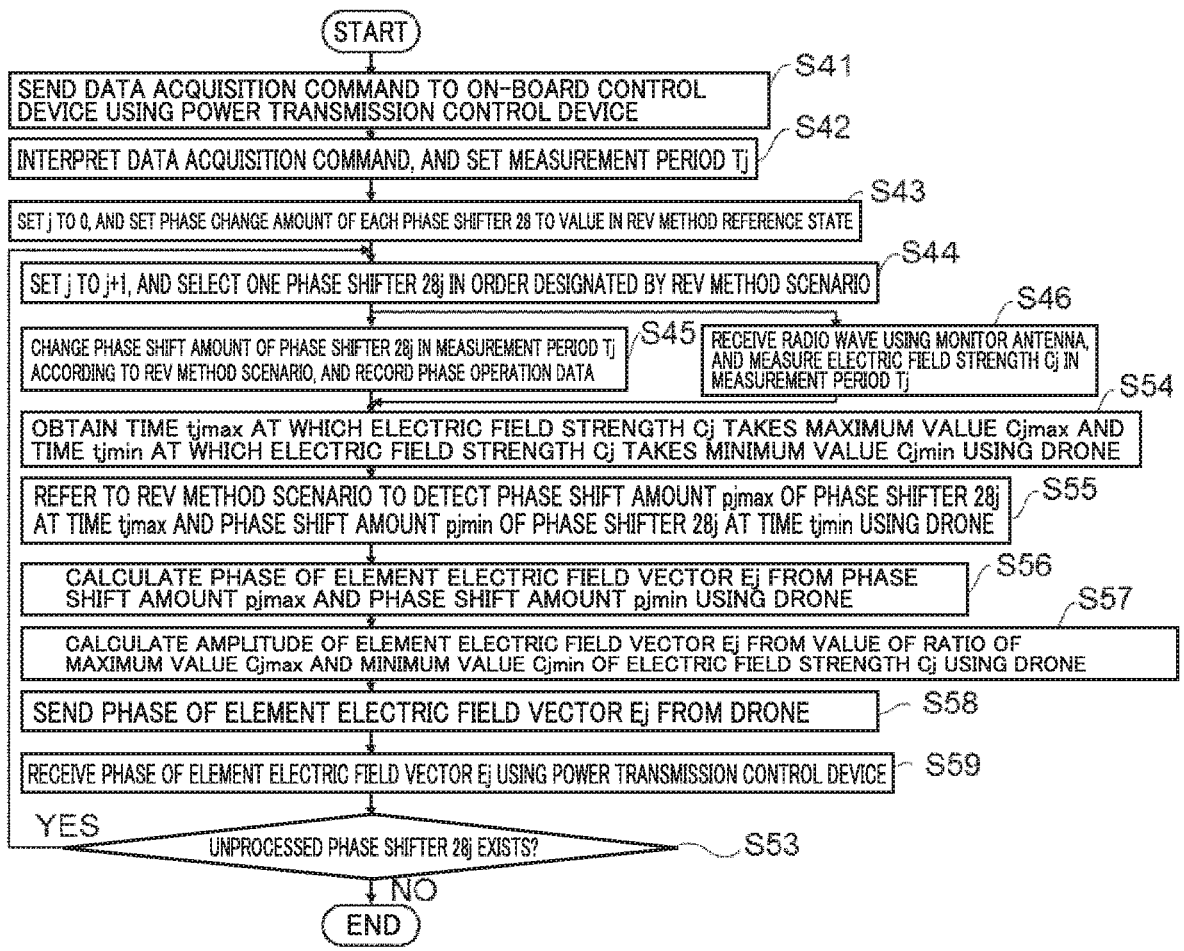
FIG. 53 is a flowchart illustrating the procedure for calculating the element electric field vector of the radio wave radiated from each element antenna by the REV method in the power transmission system to the aerial moving body by the wireless power transmission device of the nineteenth embodiment.

The operation is described. FIG. 52 is a flowchart illustrating a power transmission procedure in the power transmission system to the aerial moving body by the wireless power transmission device of the nineteenth embodiment. FIG. 53 is a flowchart illustrating the procedure for calculating the element electric field vector of the radio wave radiated from each element antenna by the REV method in the power transmission system to the aerial moving body by the wireless power transmission device of the nineteenth embodiment.

In FIG. 52, points different from FIG. 49 of the eighteenth embodiment are described. In step S22T of obtaining the element electric field vector of second-stage module 26, the element electric field vector (the phase difference of the radio wave) of the radio wave radiated by element antenna 27j in which the phase is controlled by phase shifter 29j is calculated based on REV method scenario 88T by drone 3T. In step S24T, in order to obtain the phase difference of the electric field vector generated by power transmission device 1A, the REV method is performed on first-stage module 24 by drone 3T similarly to step S22T.

In FIG. 53, points different from FIG. 50 of the eighteenth embodiment are described. Steps S47S and S48S do not exist, but steps S55 to S59 are added. Steps S54 to S58 are processing performed by drone 3T. In step S54, measurement data analyzer 311 detects time tjmax and time tjmin similarly to the eighteenth embodiment. Subsequent to step S54, phase shift amount obtainer 314 detects phase shift amount pjmax of phase shifter 28i at time tjmax by referring to REV method scenario 88T in step S55. Phase shift amount pjmin of phase shifter 28j at time tjmin is also detected.

In step S56, element electric field phase calculator 315 calculates the phase of element electric field vector Ej from phase shift amount pjmax and phase shift amount pjmin. An average of the phase calculated from phase shift amount pjmax and the phase calculated from phase shift amount pjmin is set as the phase of element electric field vector Ej. In step S57, element electric field amplitude calculator 316 calculates the amplitude of element electric field vector Ej from the value of the ratio of maximum value Cjmax to minimum value Cjmin of electric field strength Cj.

In step S58, mobile communicator 301 sends element electric field vector Ej to power transmission control communicator 204 of power transmission control device 22S. In step S59, power transmission control communicator 204 receives element electric field vector Ej.

Subsequent to step S59, whether or not unprocessed phase shifter 28 exists is checked in step S53.

In the nineteenth embodiment, in addition to the effects exhibited by the seventeenth embodiment, the REV method is performed by the drone, so that the data amount sent from drone 3S can be reduced. It is not necessary for power transmission control device 22T to calculate element electric field vector Ej by the REV method.

The on-board control device may perform the processing until the processing of phase shift amount pjmax and phase shift amount pjmin that are the operation phase shift amount of the operation phase shifter, and the power transmission control device may perform the processing of calculating element electric field vector Ej from phase shift amount pjmax and phase shift amount pjmin. In this case, the on-board control device sends phase shift amount pjmax and phase shift amount pjmin to the power transmission control device.

Twentieth Embodiment

Figure 54:
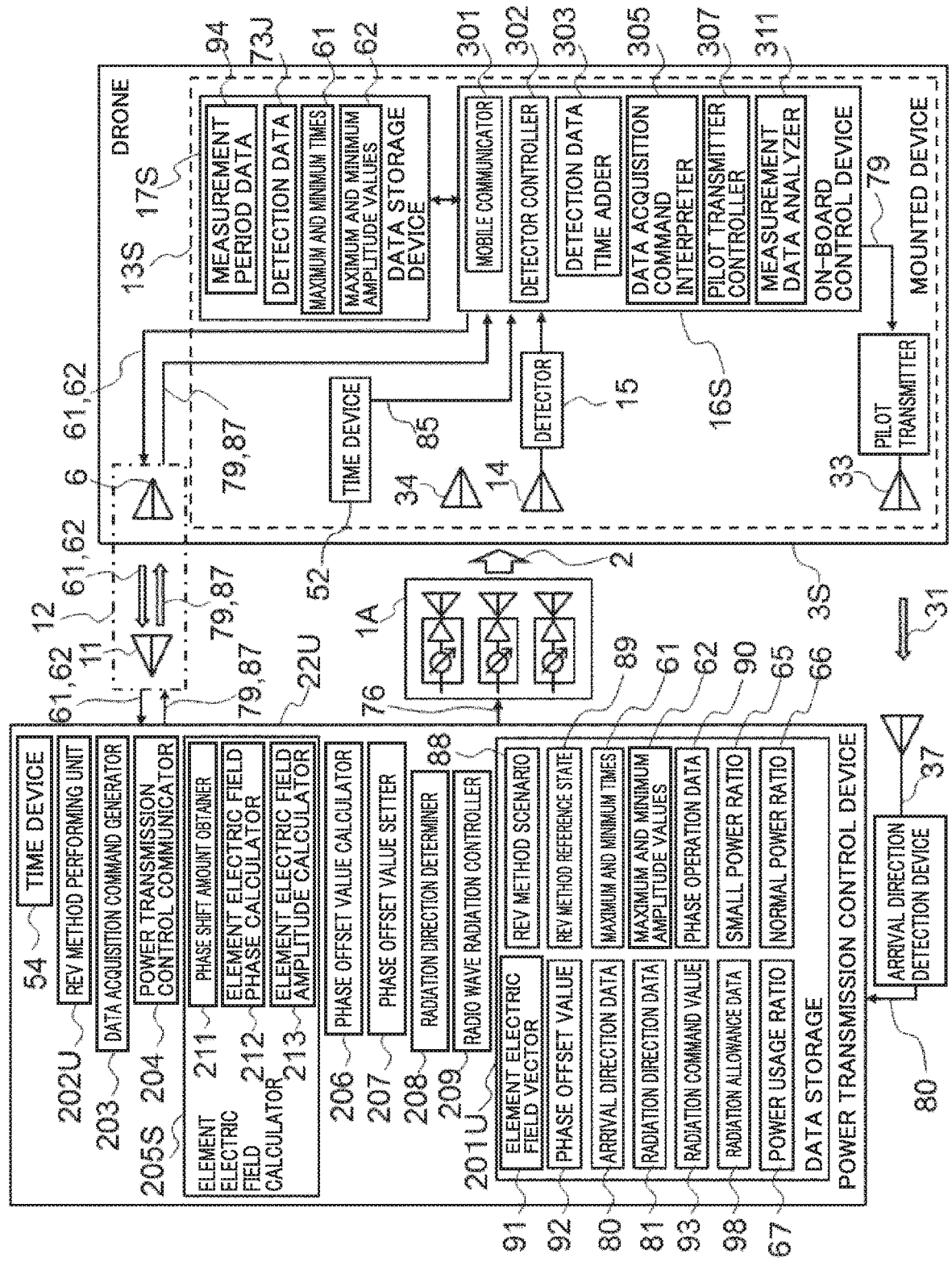
FIG. 54 is a view illustrating an internal configuration of a power transmission control device and an on-board control device in a power transmission system to an aerial moving body by the wireless power transmission device according to a twentieth embodiment.

A twentieth embodiment is the case that the eighteenth embodiment is changed such that the REV method is performed in two stages of low power and normal power. In the twentieth embodiment, a power transmission control device 22U is changed as compared with the eighteenth embodiment. With reference to FIG. 54, a configuration of a power transmission system to an aerial moving body by a wireless power transmission device according to the twentieth embodiment is described. FIG. 54 is a view illustrating an internal configuration of a power transmission control device and an on-board control device in the power transmission system to the aerial moving body by the wireless power transmission device of the twentieth embodiment. In FIG. 54, points different from FIG. 48 of the eighteenth embodiment are described.

In power transmission control device 22U, a data storage 201U and a REV method performing unit 202U are changed. Data storage 201U stores a low power ratio 65, a normal power ratio 66, and a power usage ratio 67. Low power ratio 65 is a ratio of the power of radiated power transmission radio wave 2 to a rated output when the REV method is performed for the first time. Low power ratio 65 is set less than a half (50%), for example, about 20%, Normal power ratio 66 is a ratio of the power of radiated power transmission radio wave 2 to the rated output when the REV method is performed for the second time. Normal power ratio 66 is set to a value exceeding a half (50%), for example, 80%, Power usage ratio 67 is a power ratio used in the REV method performed in each of the two stages. In the first-time REV method, low power ratio 65 is set to power usage ratio 67. In the second-time REV method, normal power ratio 66 is set to power usage ratio 67. That is. REV method scenario 88 has a portion performed with the low power and a portion performed with the normal power.

REV method performing unit 202U performs the REV method in two steps by referring to low power ratio 65, normal power ratio 66, and power usage ratio 67.

Figure 55:
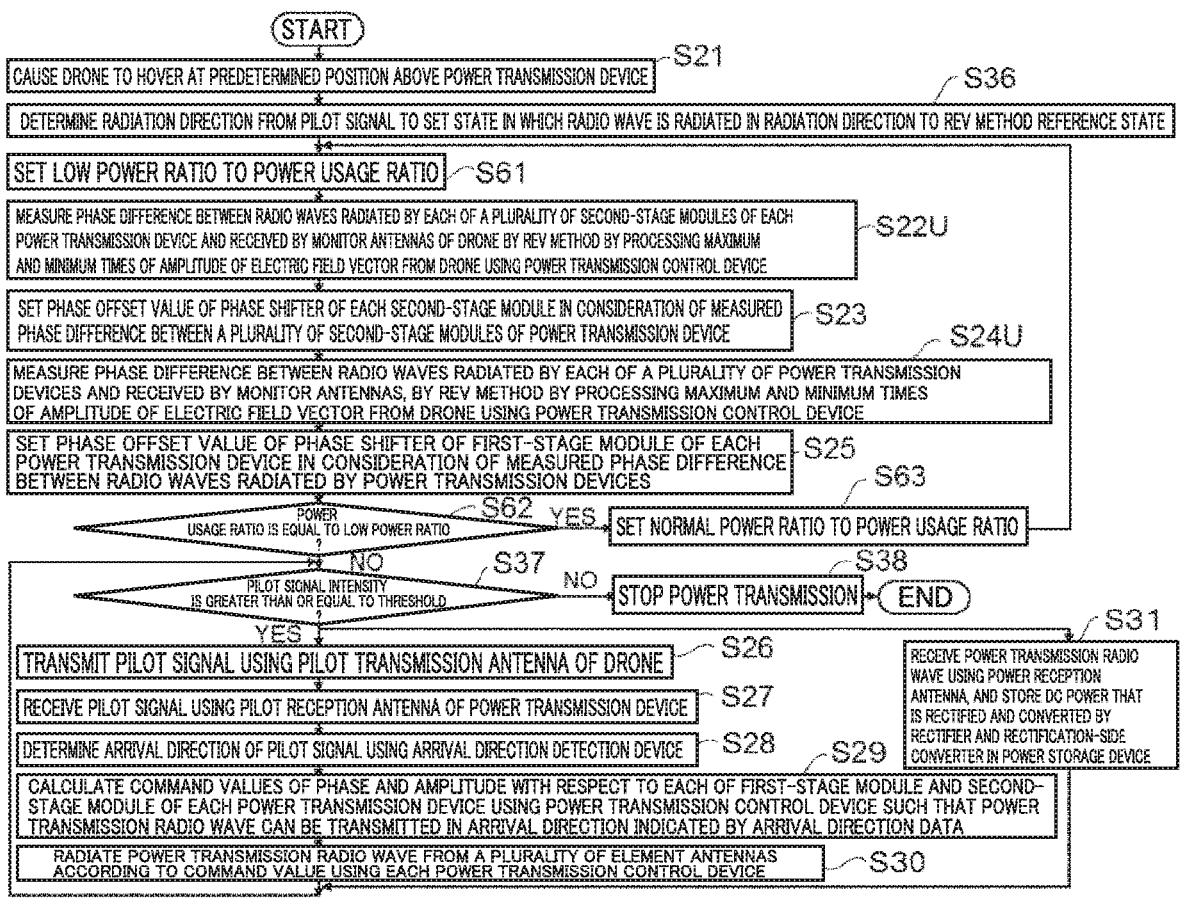
FIG. 55 is a flowchart illustrating the power transmission procedure in the power transmission system to the aerial moving body by the wireless power transmission device of the twentieth embodiment.

The operation is described. FIG. 55 is a flowchart illustrating a power transmission procedure in the power transmission system to the aerial moving body by the wireless power transmission device of the twentieth embodiment. In FIG. 55, points different from FIG. 49 of the eighteenth embodiment are described.

Step S61 is added between steps S36 and S22U. In step S61, low power ratio 65 is set to power usage ratio 67.

In steps S22U and S24U, the radio wave is radiated with the power designated by power usage ratio 67.

Steps S62 and S63 are added subsequent to step S25. Whether or not power usage ratio 67 is equal to low power ratio 65, namely, whether or not the power usage is the low power is checked in step S62. When power usage ratio 67 is equal to low power ratio 65 (YES in S62), normal power ratio 66 is set to power usage ratio 67 in step S63. After performing step S63, the processing returns to step S22U to perform the REV method with the normal power. When power usage ratio 67 is not equal to low power ratio 65 (NO in S62), the processing proceeds to S37 to start the power transmission.

In the flowchart of FIG. 55, the REV method is performed with the small power at first. In the state where the REV method is not performed yet, there is a possibility that power transmission device 1A radiates power transmission radio wave 2 in an unintended direction. When power transmission radio wave 2 is radiated with the normal power in the unintended direction, an unexpected adverse effect may be generated. By performing the REV method with the small power at first, the adverse effect can be reduced to an extent in which the adverse effect does not cause serious problem even if the adverse effect is generated by radiating power transmission radio wave 2 in the unintended direction.

The REV method is performed with the low power for the first time, and the phase offset value obtained by the low-power REV method in steps S23 and S25 is set to the phase shifter. For this reason, the second-time REV method performed with the normal power is performed while the phase reference of each element module is fairly matched. That is, after the REV method is performed with the small power, power transmission device 1A can radiate power transmission radio wave 2 in the direction substantially identical to the intended direction. When the REV method is performed with the normal power, the possibility that the radiation of power transmission radio wave 2 generates the adverse effect can be reduced extremely. The REV method is performed with the normal power, so that the REV method can be performed in the state of the actual use.

Performing the REV method in two stages of the low power and the normal power can be applied to other embodiments. The low power and the normal power may designate a power value instead of the ratio to the rated power.

In the present disclosure, a free combination of the embodiments or a modification or omission of each embodiment can be made without departing from the scope of the present disclosure.

REFERENCE SIGNS LIST 1, 1A: power transmission device (wireless power transmission device)
2: power transmission radio wave (radio wave)
3, 3A, 3B, 3C, 3D, 3E, 3F, 3G, 3H, 3J, 3K, 3L, 3M, 3N, 3P, 3Q, 3R, 3S, 3T: drone (aerial moving body)
4, 4A, 4B, 4C, 4D: mobile command device
5, 5A, 5B, 5C: flight control device
6: on-board communication antenna
7: wireless modem
8, 8A, 8B: drone power supply system
9: drive motor
10: wireless modem
11: communication antenna
12: mobile communication system
13, 13A, 13B, 13C, 13D, 13E, 13F, 13G, 13H, 13J, 13K, 13L, 13M, 13N, 13P, 13Q, 13R, 13S, 13T: mounted device
14: monitor antenna (measurement antenna)
15, 15A: detector (radio wave measurer)
16, 16A, 16B, 16D, 16E, 16F, 16G, 16H, 16J, 16K, 16M, 16N, 16P, 16Q, 16R, 16S, 16T: on-board control device
17, 17A, 17B, 17D, 17E, 17G, 17S, 17T: data storage device (storage device)
18, 18H: positioning sensor (position measurer)
19: power storage device
20a, 20b, 20c: load-side converter
21, 21D, 21E, 21F, 21G: measurement system control device (radiated radio wave data generator)
21A, 21B, 21H, 21J, 21K, 21L, 21M, 21N, 21P, 21Q: measurement system control device
22: power transmission control device 22A, 22B, 22C, 22D: power transmission control device (radiation direction determiner, orientation direction changer)
22H, 22J, 22K, 22L, 22M, 22R, 22S, 22T, 22U: power transmission control device
23: transmission signal generator
24, 24A: first-stage module (element module)
25: distribution circuit
26, 26A: second-stage module (element module)
27: element antenna
28: phase shifter
29: amplifier
30: phased array antenna (measurement target antenna, power transmission antenna)
31: pilot signal
32: pilot transmitter (direction signal transmitter, direction signal transmission reception system)
33: pilot transmission antenna (direction signal transmitter, direction signal transmission reception system)
34: power reception antenna
35: rectifier
36: rectification-side converter
37: pilot reception antenna (direction signal receiver, direction signal transmission reception system)
38: arrival direction detection device (radiation direction determiner)
39: power transmission communication system
40: pilot communication system
41: pulse modulation switch
42, 42A: communication system changeover switch
43: pulse modulation switch
44: detector
45: measurement communication system
46: on-board communication device
47: on-board communication antenna.
48: ground communication antenna
49: ground communication device
50: measurement system power supply line
51: laser positioning device
52, 53, 54: time device
101, 101N, 101P: measurement control communicator
102, 102Q: data storage
103: measurement controller
104: relative position converter
105: beam shape data generator (radiated radio wave data generator)
106: pilot signal demodulator
107: communication system switch
108: position data time adder
109: positioned detection data generator
201, 201K, 201R, 201S: data storage
202, 202R: REV method performing unit
203: data acquisition command generator
204: power transmission control communicator
205: element electric field calculator
206: phase offset value calculator
207: phase offset value setter
208: radiation direction determiner
209, 209R: radio wave radiation controller (orientation direction changer)
210: measurement data analyzer
211: phase shift amount obtainer
212: element electric field phase calculator
213: element electric field amplitude calculator
214: radiation determiner
215: electric field calculation command generator
301, 301N, 301P: mobile communicator
302: detector controller
303 detection data time adder (received radio wave data time adder)
304: positioned detection data generator
305: data acquisition command interpreter
306: transmission data generator
307: pilot transmitter controller
308: transmission signal demodulator
309: pilot signal modulator
310: communication system switch
311: measurement data analyzer
312: electric field calculation command interpreter
313: element electric field calculator
314: phase shift amount obtainer
315: element electric field phase calculator
316: element electric field amplitude calculator
70, 70A, 70H: positioned detection data (radio wave measurement data)
71, 71A: beam shape data (radiated radio wave data)
72: measurement command
73, 73H: detection data (received radio wave data)
73J: detection data (received radio wave data, electric field change data)
74, 74H: position data (measurement point data)
75: flight command
76: power transmission control signal
77, 77H: measurement data
78: relative position data (radio wave source relative position data)
79: pilot transmitter control command
80: arrival direction data
81: radiation direction data
82: laser beam
83: reflected laser beam
85: time data
86: power transmission device position
87: data acquisition command
88, 88T: REV method scenario
89: REV method reference state
90: phase operation data
91: element electric field vector (element electric field phase)
92: phase offset value
93: radiation command value
94: measurement period data (measurement period, analysis period)
95: command communication system data
96: data communication system data
97: pilot detection data
98: radiation allowance data
99: electric field calculation command
61: maximum and minimum time (electric field change data)
62: maximum and minimum amplitude value (electric field change data)
63: REV method start time (time of reference event)
65: low power ratio
66: normal power ratio
67: power usage ratio

The invention claimed is:
1. A wireless power transmission device comprising:
a power transmission antenna to transmit power by radiating a radio wave and being capable of changing an orientation direction;
a radiation direction determiner to determine a radiation direction, the radiation direction being a direction in which an aerial moving body exists, the aerial moving body being a target to transmit the power;

an orientation direction changer to direct the orientation direction of the power transmission antenna toward the radiation direction; and a transmission signal generator to generate a transmission signal transmitted as the radio wave from the power transmission antenna, wherein the power transmission antenna is a phased array antenna including:

a plurality of element antennas to radiate the radio wave; and a plurality of element modules, each of the plurality of element modules including a phase shifter to change a phase of the transmission signal and an amplifier to amplify the transmission signal, the orientation direction changer controls a phase shift amount of the phase shifter, and a phase offset value for the phase shifter included in each of the plurality of element modules is calculated by performing a REV (rotating element electric field vector) method using an aerial moving body hovering over the power transmission antenna and mounting a measurement antenna to receive the radio wave and a radio wave measurer to measure received radio wave data including an amplitude of the radio wave received by the measurement antenna.

2. The wireless power transmission device according to claim 1, wherein the aerial moving body mounting the measurement antenna and the radio wave measurer further mounts a mobile time device to output time data synchronized with a ground time device installed on a ground and a received radio wave data time adder to generate time-added received radio wave data by adding, to the received radio wave data, the time data outputted from the mobile time device at a point of time when the received radio wave data is measured, and the phase offset value is calculated based on REV method performing time radio wave data being the time-added received radio wave data measured by the radio wave measurer while performing the REV method in which the radio wave is radiated, a phase of the radio wave being varied by a part of the phase shifters according to the time data outputted from the ground time device.

3. The wireless power transmission device according to claim 1, wherein the power transmission antenna includes a plurality of power transmitters, each of the plurality of power transmitters includes a plurality of element antennas, a plurality of second-stage modules, each of the plurality of second-stage modules being the element module provided in each predetermined number of the element antennas, and a first-stage module being the element module changing the phases of the transmission signals uniformly, each of the transmission signals being inputted to each of the plurality of element antennas, the phase offset value for the phase shifter included in each of the plurality of second-stage modules is determined so that the element antenna corresponding to the second-stage module radiate the radio wave having the same phase when the same phase command value is given to each of the plurality of second-stage modules, and the phase offset value for the phase shifter included in the first-stage module is determined based on a phase difference measured among the radio waves, each of the radio waves being radiated by each of the plurality of power transmitters.

4. A power transmission system to an aerial moving body, the power transmission system comprising:

a wireless power transmission device including:

a power transmission antenna to transmit power by radiating a radio wave and being capable of changing an orientation direction;

a radiation direction determiner to determine a radiation direction, the radiation direction being a direction in which an aerial moving body exists, the aerial moving body being a target to transmit the power;

an orientation direction changer to direct the orientation direction of the power transmission antenna toward the radiation direction; and a transmission signal generator to generate a transmission signal transmitted as the radio wave from the power transmission antenna, wherein the power transmission antenna is a phased array antenna including:

a plurality of element antennas to radiate the radio wave; and a plurality of element modules provided in each predetermined number of the element antennas, each of the plurality of element modules including a phase shifter to change a phase of the transmission signal and an amplifier to amplify the transmission signal, and the orientation direction changer controls a phase shift amount of the phase shifter;

a power transmission control device to control the wireless power transmission device;

a ground time device installed on a ground and to output time data;

an aerial moving body mounting a measurement antenna, a radio wave measurer, a mobile time device, a received radio wave data time adder, and a mobile communicator, the measurement antenna to receive the radio wave radiated by the wireless power transmission device, the radio wave measurer to measure received radio wave data including electric field strength that is an amplitude of the radio wave received by the measurement antenna, the mobile time device to output time data synchronized with the ground time device, the received radio wave data time adder to generate time-added received radio wave data by adding, to the received radio wave data, the time data outputted from the mobile time device at a point of time when the received radio wave data is measured, the mobile communicator to communicate with the power transmission control device; and a REV method analyzer to obtain an element electric field phase in each of the plurality of element modules based on a REV scenario and REV method performing time radio wave data, the element electric field phase being a phase of an element electric field vector generated at a position of the measurement antenna by the radio wave radiated by the element antenna being supplied with the transmission signal outputted from one element module, the REV method scenario defining a phase operation pattern in which a phase shift amount of at least one operation phase shifter that is a part of the phase shifters is changed repeatedly with at least a part of the element antennas radiating the radio wave to perform a REV (rotating element electric field vector) method for obtaining the element electric field phase, the REV method performing time radio wave data being the time-added received radio wave data measured by the radio wave measurer while performing the REV method scenario, wherein the power transmission control device includes a power transmission control communicator to communicate with the mobile communicator and REV method performing circuitry to control the wireless power transmission device based on the REV method scenario, and the orientation direction changer directs the orientation direction toward the radiation direction, under a condition in which each of the plurality of element modules has a phase reference matched based on the element electric field phase of each of the plurality of element modules.

5. The power transmission system to the aerial moving body according to claim 4, further comprising:

a power reception antenna mounted on the aerial moving body mounting the measurement antenna and to receive the radio wave radiated by the wireless power transmission device.

6. The power transmission system to the aerial moving body according to claim 4, wherein the power transmission control device includes the REV method analyzer, the power transmission control communicator sends, to the mobile communicator, a data acquisition command instructing acquisition of electric field change data generated based on the REV method performing time radio wave data, and receives the electric field change data sent by the mobile communicator in response to the data acquisition command, and the REV method analyzer obtains the element electric field phase in each of the plurality of element modules based on the electric field change data and the REV method scenario.

7. The power transmission system to the aerial moving body according to claim 6, wherein the electric field change data is the REV method performing time radio wave data, and the REV method analyzer includes:

a measurement data analyzer to analyze the REV method performing time radio wave data based on the REV method scenario to detect a phase shift amount detection time for each set of the at least one operation phase shifter;

a phase shift amount obtainer to obtain an operation phase shift amount that is a phase shift amount of the set of the at least one operation phase shifter at the phase shift amount detection time based on the REV method scenario; and an element electric field phase calculator to calculate the element electric field phase based on the operation phase shift amount.

8. The power transmission system to the aerial moving body according to claim 6, wherein the aerial moving body further mounts a measurement data analyzer, the measurement data analyzer analyzes the REV method performing time radio wave data in each of a plurality of analysis periods which is notified to the aerial moving body by the data acquisition command and detects a phase shift amount detection time in each of the plurality of analysis periods, the electric field change data is the phase shift amount detection time, and the REV method analyzer includes:

a phase shift amount obtainer to obtain an operation phase shift amount that is a phase shift amount of the at least one operation phase shifter at the phase shift amount detection time based on the REV method scenario; and an element electric field phase calculator to calculate the element electric field phase based on the operation phase shift amount.

9. The power transmission system to the aerial moving body according to claim 6, wherein in the REV method scenario, the phase operation pattern is expressed by one or more reference events in which time is designated and a non-reference event in which time is expressed by a relative time from one of the reference events, the aerial moving body mounts:

a data storage device to store the REV method scenario; and a measurement data analyzer to analyze the REV method performing time radio wave data in each of a plurality of analysis periods set based on the REV method scenario and the time of the reference event which is notified to the aerial moving body by the data acquisition command, and to detect a phase shift amount detection time in each of the plurality of analysis periods, the electric field change data is the phase shift amount detection time, and the REV method analyzer mounts:

a phase shift amount obtainer to obtain an operation phase shift amount that is a phase shift amount of the at least one operation phase shifter at the phase shift amount detection time based on the REV method scenario; and an element electric field phase calculator to calculate the element electric field phase based on the operation phase shift amount.

10. The power transmission system to the aerial moving body according to claim 7, wherein the power transmission control device includes a phase operation recorder to record phase operation data that is a temporal change in a phase shift amount of the at least one operation phase shifter while performing the REV method scenario, and the phase shift amount obtainer obtains the operation phase shift amount by referring to the phase operation data at the phase shift amount detection time.

11. The power transmission system to the aerial moving body according to claim 7, wherein in the REV method scenario, the phase operation pattern is expressed by one or more reference events in which the time is designated and the non-reference event in which the time is expressed by the relative time from one of the reference events, and the phase shift amount obtainer obtains the operation phase shift amount based on the time of the reference event, the REV method scenario, and the phase shift amount detection time.

12. The power transmission system to the aerial moving body according to claim 4, wherein in the REV method scenario, the phase operation pattern is expressed by one or more reference events in which time is designated and a non-reference event in which time is expressed by a relative time from one of the reference events, the power transmission control communicator sends an electric field calculation command instructing to obtain the element electric field phase to the mobile communicator, and receives the element electric field phase sent by the mobile communicator in response to the electric field calculation command, and the aerial moving body mounts:
   a data storage device to store the REV method scenario;
   a measurement data analyzer to analyze the REV method performing time radio wave data to detect a phase shift amount detection time in each set of the at least one operation phase shifter based on the REV method scenario and the time of the reference event which is notified to the aerial moving body by the electric field calculation command;
   a phase shift amount obtainer to obtain an operation phase shift amount that is a phase shift amount of the at least one operation phase shifter at the phase shift amount detection time based on the time of the reference event and the REV method scenario; and
   the REV method analyzer to obtain the element electric field phase from the operation phase shift amount.

13. The power transmission system to the aerial moving body according to claim 4, wherein the phase operation pattern is defined such that the at least one operation phase shifter takes each of a plurality of different phase shift amounts for at least a predetermined duration.

14. The power transmission system to the aerial moving body according to claim 4, wherein the REV method performing circuitry performs the REV method scenario after the radiation direction determiner determines the radiation direction.

15. The power transmission system to the aerial moving body according to claim 4, wherein
   in the REV method scenario, the phase shift amount of a part of the phase shifters is changed, while at least a part of the element antennas radiating the radio wave with low power at which a power of the radio wave is determined less than a half of rated power and with normal power at which a power of the radio wave is determined greater than or equal to the half of the rated power, and
   the REV method performing circuitry performs a portion of the REV method scenario to be performed with the normal power, under a condition in which each of the plurality of element modules has a phase reference matched based on the element electric field phase of each of the plurality of element modules obtained by performing a portion of the REV method scenario to be performed with the low power.

16. The power transmission system to the aerial moving body according to claim 4, further comprising a direction signal transmission reception system to transmit and receive a direction signal emitted by the aerial moving body to indicate an existence direction being a direction in which the aerial moving body exists when viewed from the power transmission antenna,
   wherein one of the mobile communicator and the direction signal transmission reception system is selected to send the electric field change data generated based on the REV method performing time radio wave data from the aerial moving body.

17. The power transmission system to the aerial moving body according to claim 4, wherein
   a phase offset value for the phase shifter included in each of the plurality of element modules is calculated based on the element electric field phase of each of the plurality of element modules.

18. A power transmission system to an aerial moving body, the power transmission system comprising:
   a wireless power transmission device including:
      a power transmission antenna to transmit power by radiating a radio wave and being capable of changing an orientation direction;
      a radiation direction determiner to determine a radiation direction, the radiation direction being a direction in which an aerial moving body exists, the aerial moving body being a target to transmit the power;
      an orientation direction changer to direct the orientation direction of the power transmission antenna toward the radiation direction; and
      a transmission signal generator to generate a transmission signal transmitted as the radio wave from the power transmission antenna, wherein
      the power transmission antenna is a phased array antenna including:
         a plurality of element antennas to radiate the radio waves; and
         a plurality of element modules provided in each predetermined number of the element antennas, each of the plurality of element modules including a phase shifter to change a phase of the transmission signal and an amplifier to amplify the transmission signal, and
      the orientation direction changer controls a phase shift amount of the phase shifter;
   a power transmission control device to control the wireless power transmission device;
   a ground time device installed on a ground and to output time data;
   an aerial moving body mounting a measurement antenna, a radio wave measurer, a mobile time device, a received radio wave data time adder, and a mobile communicator,
   the measurement antenna to receive the radio wave radiated by the wireless power transmission device,
   the radio wave measurer to measure received radio wave data including electric field strength that is an amplitude of the radio wave received by the measurement antenna,
   the mobile time device to output time data synchronized with the ground time device,
   the received radio wave data time adder to generate time-added received radio wave data by adding, to the received radio wave data, the time data outputted from the mobile time device at a point of time when the received radio wave data is measured,
   the mobile communicator to communicate with the power transmission control device; and
   a direction signal transmission reception system to transmit and receive a direction signal emitted by the aerial moving body to indicate an existence direction being a direction in which the aerial moving body exists when viewed from the power transmission antenna,
   wherein one of the mobile communicator and the direction signal transmission reception system is selected to send the electric field change data generated based on a REV method performing time radio wave data from the aerial moving body, the REV method performing time radio wave data being the time-added received radio wave data measured by the radio wave measurer while performing a REV (rotating element electric field vector) method.

19. The power transmission system to the aerial moving body according to claim 18, wherein
a measurement communication system that is a communication system different from a mobile communication system for controlling the aerial moving body is used as the mobile communicator.

20. The power transmission system to the aerial moving body according to claim 18, wherein
a mobile communication system for controlling the aerial moving body is used as the mobile communicator.

21. The power transmission system to the aerial moving body according to claim 18, wherein
a mobile communication system for controlling the aerial moving body or a measurement communication system that is a communication system different from the mobile communication system is used as the mobile communicator, and
one of the direction signal transmission reception system, the mobile communication system, and the measurement communication system is selected to send the electric field change data from the aerial moving body.

* * * * *